US009064734B2

(12) United States Patent
Sim

(10) Patent No.: US 9,064,734 B2
(45) Date of Patent: Jun. 23, 2015

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventor: Jae-Hwang Sim, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/668,883

(22) Filed: Nov. 5, 2012

(65) Prior Publication Data
US 2013/0264649 A1   Oct. 10, 2013

(30) Foreign Application Priority Data

Apr. 6, 2012  (KR) .................. 10-2012-0036154

(51) Int. Cl.
*H01L 29/788* (2006.01)
*H01L 27/115* (2006.01)
*H01L 29/66* (2006.01)

(52) U.S. Cl.
CPC .... *H01L 27/11521* (2013.01); *H01L 29/66825* (2013.01)

(58) Field of Classification Search
None
See application file for complete search history.

(56) References Cited

U.S. PATENT DOCUMENTS

| 2007/0184615 A1* | 8/2007 | Brazzelli et al. ............ 438/266 |
| 2008/0157179 A1 | 7/2008 | Kim |
| 2009/0001446 A1* | 1/2009 | Kim ............................ 257/316 |
| 2009/0085069 A1* | 4/2009 | Mei et al. .................... 257/208 |
| 2009/0146266 A1* | 6/2009 | Chen et al. .................. 257/651 |
| 2011/0309425 A1* | 12/2011 | Purayath et al. ............ 257/316 |
| 2012/0126303 A1* | 5/2012 | Arai et al. ................... 257/316 |

FOREIGN PATENT DOCUMENTS

| KR | 10-2004-0005080 A | 1/2004 |
| KR | 10-2008-0096231 A | 10/2008 |

OTHER PUBLICATIONS

U.S. Appl. No. 61/356,603 by Purayath, filed Jun. 20, 2010.*

* cited by examiner

*Primary Examiner* — Zandra Smith
*Assistant Examiner* — Molly Reida
(74) *Attorney, Agent, or Firm* — Lee & Morse, P.C.

(57) ABSTRACT

A semiconductor device includes a substrate including an active region and a field region, first gate structures disposed on the active region, first air gaps disposed between the first gate structures, second gate structures disposed on the field region, second air gaps disposed between the second gate structures, and an interlayer insulating layer disposed on the first gate structures, the first air gaps, the second gate structures, and the second air gaps. A lowermost level of the second air gaps is lower than a lowermost level of the first gate structures.

18 Claims, 57 Drawing Sheets

SEMICONDUCTOR DEVICE AND METHOD OF FABRICATING THE SAME

CROSS-REFERENCE TO RELATED APPLICATION

This application claims priority under 35 U.S.C. §119 to Korean Patent Application No. 10-2012-0036154 filed on Apr. 6, 2012, the disclosure of which is hereby incorporated by reference in its entirety.

BACKGROUND

1. Field

Embodiments relate to a semiconductor device having an air gap and an impurity region and a method of fabricating the same.

2. Description of the Related Art

A semiconductor device includes gate structures and impurity regions. Research into reducing parasitic capacitance between gate structures and a short channel effect between impurity regions in semiconductor devices is being conducted.

SUMMARY

Embodiments are directed to a semiconductor device including a substrate including an active region and a field region, first gate structures disposed on the active region, first air gaps disposed between the first gate structures, second gate structures disposed on the field region, second air gaps disposed between the second gate structures, and an interlayer insulating layer disposed on the first gate structures, the first air gaps, the second gate structures, and the second air gaps. A lowermost level of the second air gaps is lower than a lowermost level of the first gate structures.

The second air gaps may include an undercut formed under adjacent second gate structures.

A lowermost level of the first air gaps may be coplanar with the lowermost level of the first gate structures.

The lowermost level of the first gate structures may be coplanar with an uppermost level of the active region.

The field region may include a trench and a field insulator filling the trench. The field insulator may include recess regions disposed between the second gate structures. The second air gaps may extend into the inside of the recess regions.

The active region may include impurity regions between the first gate structures. A vertical depth of the impurity regions may be smaller than a vertical distance between a lowermost level of the recess regions and a lowermost level of the second gate structures.

An uppermost level of the field insulator may be lower than a lowermost level of the second gate structures.

A plane including an uppermost level of the active region may be between the uppermost level of the field insulator and the lowermost level of the second gate structures.

A difference between a vertical height of the first gate structures and a vertical height of the first air gaps may be smaller than a difference between a vertical height of the second gate structures and a vertical height of the second air gaps.

The vertical height of the first gate structures may be greater than the vertical height of the second gate structures.

Embodiments are also directed to a semiconductor device including a substrate including an active region and a field region, gate structures intersecting the active region and the field region, air gaps disposed between the gate structures, and an interlayer insulating layer disposed on the gate structures and the air gaps. A lowermost level of the air gaps may be lower than a lowermost level of the gate structures.

The lowermost level of the air gaps may be located in the field region.

The lowermost level of the gate structures may be located in the active region.

An uppermost level of a lower level profile of the air gaps may be lower than the lowermost level of the gate structures.

A step difference of a lower level profile of the air gaps may be greater than a step difference of an upper level profile of the air gaps.

Embodiments are also directed to a semiconductor device including a substrate including an active region and a field region, first gate structures disposed on the active region, first air gaps disposed between the first gate structures, second gate structures disposed on the field region, second air gaps disposed between the second gate structures, and an interlayer insulating layer disposed on the first gate structures, the first air gaps, the second gate structures, and the second air gaps, impurity regions in the active region of the substrate between the first gate structures, A maximum width of the impurity regions in a direction between adjacent first gate structures may be less than a distance between the adjacent first gate structures.

Each first gate structure may include a tunnel insulating pattern directly on the substrate, the tunnel insulating pattern protruding horizontally with respect to side surfaces of the first gate structure. The tunnel insulating pattern may not overlap the impurity regions between the adjacent first gate structures.

The second gate structures may be disposed on a field insulator in the field region. The field insulator may include recess regions between the second gate structures. Each second air gap may extend into a respective recess region.

Undercuts may be formed in the field insulator under adjacent second gate structures such that a maximum width of the second air gap between adjacent second gate structures is greater than a distance between the adjacent second gate structures.

The impurity regions may be formed by a process including forming a buffer layer covering preliminary first gate structures, preliminary second gate structures, a preliminary tunneling insulating layer, and a preliminary field insulator, doping the substrate with a dopant, and removing the buffer layer.

BRIEF DESCRIPTION OF THE DRAWINGS

Features will become apparent to those of skill in the art by describing in detail exemplary embodiments with reference to the attached drawings in which:

FIGS. 7A to 25A and 7B to 25B illustrate cross-sectional views sequentially showing stages of a method of fabricating a semiconductor device illustrated in FIGS. 2A and 2B;

FIGS. 27A to 30A and 27B to 30B illustrate cross-sectional views sequentially showing stages of a method of fabricating a semiconductor device according to another exemplary embodiment;

DETAILED DESCRIPTION

Figure 1:
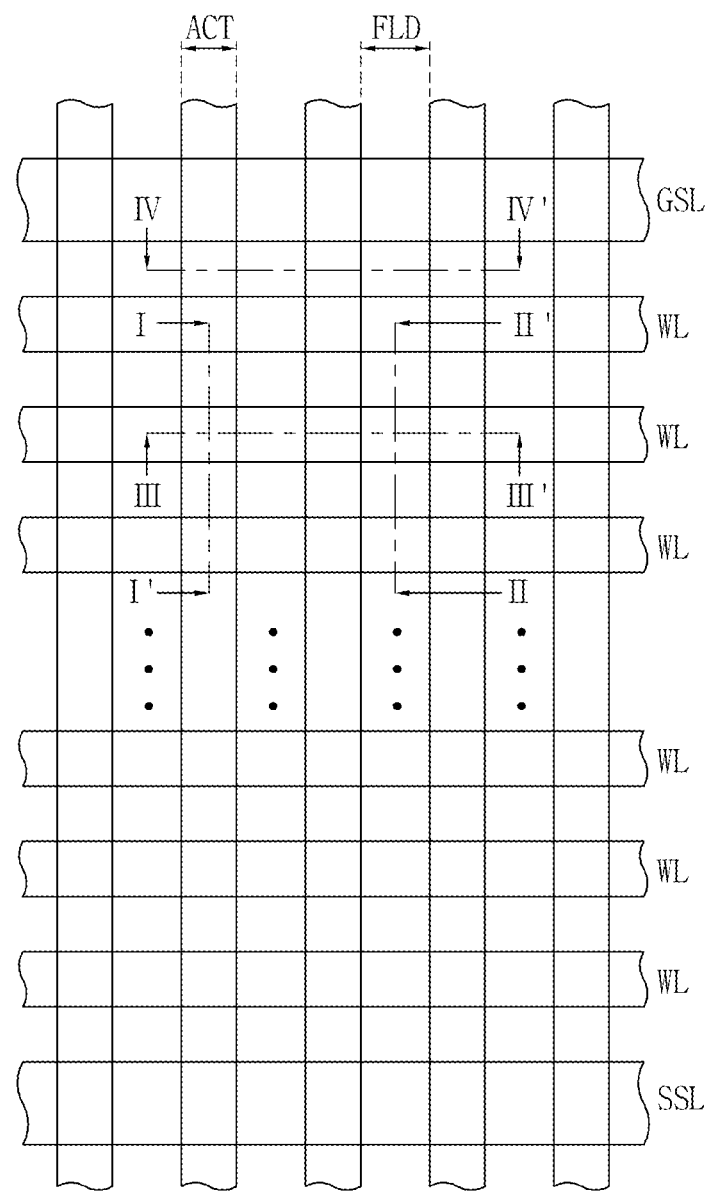
FIG. 1 illustrates a layout view showing a semiconductor device according to a an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that, if an element is referred to as being "connected" with another element, it can be directly connected, or coupled, to the other element or intervening elements may be present. In contrast, if an element is referred to as being "directly connected" with another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "lowermost," "above," "upper," "uppermost," and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shape illustrated herein but may include deviations in shapes that result, for example, from manufacturing. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings. However, the present invention is not limited to exemplary embodiments described.

FIG. 1 illustrates a layout view showing a semiconductor device according to an exemplary embodiment.

Referring to FIG. 1, a semiconductor device according to an exemplary embodiment may include active regions ACT and a field region FLD. The active regions ACT may be defined by the field region FLD. The semiconductor device may further include a ground select line GSL, a string select line SSL, and a plurality of word lines WLs. The ground select line GSL, the string select line SSL, and the plurality of word lines WLs may intersect the active regions ACT and the field region FLD. The ground select line GSL, the string select line SSL, and the plurality of word lines WLs may be parallel with respect to each other. The plurality of word lines WLs may be disposed between the ground select line GSL and the string select line SSL.

Figure 2A:
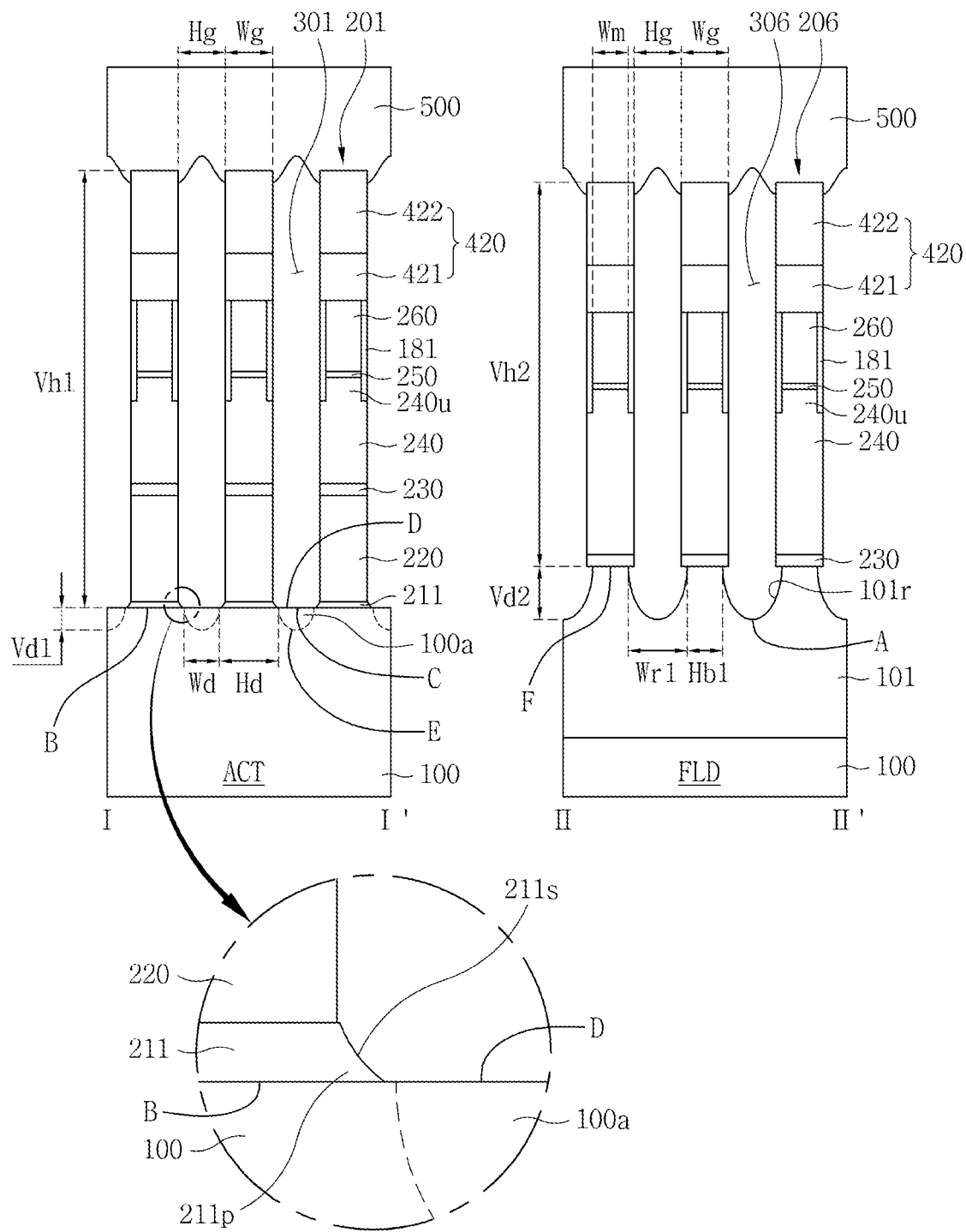
FIG. 2A illustrates a cross-sectional view showing the semiconductor device taken along lines I-I' and II-II' of FIG. 1.
Figure 2B:
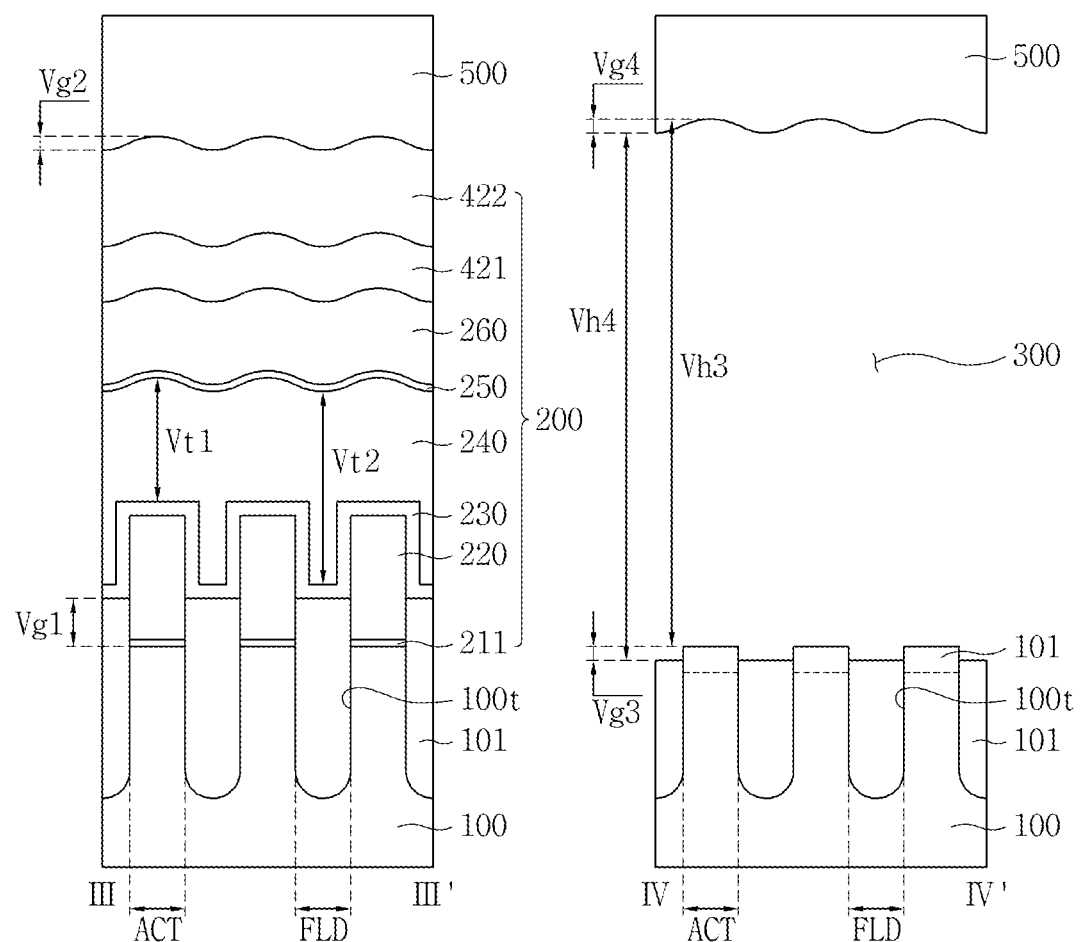
FIG. 2B illustrates a cross-sectional view showing the semiconductor device taken along lines III-III' and IV-IV' of FIG. 1.

FIGS. 2A and 2B illustrate cross-sectional views showing a semiconductor device according to an exemplary embodiment.

FIG. 2A illustrates a cross-sectional view showing the semiconductor device taken along lines I-I' and II-II' of FIG. 1, and FIG. 2B illustrates a cross-sectional view showing the semiconductor device taken along lines and IV-IV' of FIG. 1. For example, the semiconductor device according to the exemplary embodiment may include a flash memory device.

Referring to FIGS. 2A and 2B, the semiconductor device according to this exemplary embodiment may include a substrate 100, gate structures 200, air gaps 300, and an interlayer insulating layer 500. The gate structures 200 may be considered as the plurality of word lines WLs of FIG. 1. The gate structures 200 may include first gate structures 201 and second gate structures 206. The first gate structures 201 may be disposed on the active regions ACT. The second gate structures 206 may be disposed on the field region FLD. The first gate structures 201 and the second gate structures 206 may be considered as portions of the gate structures 200. For example, the first gate structures 201 may be considered as portions of the gate structures 200 that are disposed on the active regions ACT. The second gate structures 206 may be considered as portions of the gate structures 200 that are disposed on the field region FLD.

The air gaps 300 may be disposed between the gate structures 200. The interlayer insulating layer 500 may be disposed between and over the gate structures 200 such that the air gaps 300 are between the interlayer insulating layer 500 and either an active region ACT or the field region FCT.

The substrate 100 may include a semiconductor substrate, such as a silicon wafer or a silicon-on-insulator (SOI) wafer. The substrate 100 may include the active regions ACT and the field region FLD. On the active regions ACT, the gate structures 200 may be formed directly on the substrate 100. For example, on the active regions ACT, an upper surface of, e.g., each of the active regions ACT is coplanar with a lowermost level B of the gate structures 200. Herein, terms such as "lowermost" and "bottommost" are to be understood as referring to a relative position in a direction away from the gate structures 200 and into the substrate 100, e.g., in a direction normal to the substrate 100. Terms such as "uppermost" are to be understood as referring to a relative position in a direction away from the substrate 100 and toward the gate structures 200, e.g. in a direction normal to the substrate and opposite to the direction defining "lowermost" and "bottommost."

Bottommost elements 211 of the gate structures 200 may horizontally protrude from side surfaces of the gate structures 200. For example, side end portions of the bottommost elements 211 of the gate structures 200 may extend along the upper surface of the active regions ACT to protrude in a shape of a tapered footing.

The active regions ACT may include impurity regions 100a. The impurity regions 100a may be formed between the gate structures 200. The impurity regions 100a may include source and drain regions. For example, the impurity regions 100a may include N-type dopants. The impurity regions 100a may have a first vertical depth Vd1 from the upper surface of the active regions ACT toward a bulk of the active regions ACT.

The impurity regions 100a may have a maximum horizontal width Wd on the upper surface of the active regions ACT. The maximum horizontal width Wd of the impurity regions 100a may not be aligned with an end portion of the tapered footing of the bottommost elements 211 of the gate structures 200. For example, the maximum horizontal width Wd of the impurity regions 100a may be smaller than a maximum horizontal width between the end portions of the tapered footing of the bottommost elements 211 of the gate structures 200. The maximum horizontal width Wd of the impurity regions 100a may be smaller than an inter-gate spacing distance Hg between the gate structures 200 (Wd<Hg).

The impurity regions 100a may be separated by an inter-impurity-region spacing distance Hd with respect to each other. The inter-impurity-region spacing distance Hd may be considered as a separated spacing between the impurity regions 100a on the upper surface of the active regions ACT.

The semiconductor device according to the exemplary embodiment may have a maximum horizontal width Wd of impurity regions 100a that is relatively narrow and an inter-impurity-region spacing distance Hd that is relatively wide. For example, in the semiconductor device according to the exemplary embodiment, the length of a channel may increase by as much as the horizontal width of the source/drain region narrows. As such, in the semiconductor device according to the exemplary embodiment, a short-channel effect (SCE) may be reduced.

The field region FLD may include a trench 100t formed in the substrate 100 and a field insulator 101 filled in the trench 100t. An upper surface of the field insulator 101 may be higher than that of the active regions ACT. The field insulator 101 may include an oxide, a nitride, or a combination thereof. For example, the field insulator 101 may include silicon oxide and/or silicon nitride.

The field insulator 101 may include a plurality of recess regions 101r. The air gaps 300 may extend into the inside of the recess regions 101r. The air gaps 300 may include a space on a recessed surface of the recess regions 101r. A lowermost level A of the recess regions 101r may be higher than a lowermost level E of the impurity regions 100a. The lowermost level A of the recess regions 101r may be considered as a lowermost level of the recessed surface of the recess regions 101r. The recess regions 101r may have a second vertical depth Vd2 from the upper surface of the field insulator 101 toward a bulk of the field insulator 101. The second vertical depth Vd2 may be considered as a vertical distance between the lowermost level A of the recess regions 101r and the lowermost level F of the gate structures 200 on the field region FLD. The second vertical depth Vd2 may be greater than the first vertical depth Vd1.

Each of the recess regions 101r may have a maximum horizontal width Wr1 on an upper surface of the field region 101. The maximum horizontal width Wr1 of the recess regions 101r may be greater than the maximum horizontal width Wd of the impurity regions (Wr1>Wd).

The recess regions 101r may be separated by a first inter-recess spacing distance Hb1 with respect to each other. The first inter-recess spacing distance Hb1 may be considered as a recessed spacing between the recess regions 101r on the upper surface of the field insulator 101. The first inter-recess spacing distance Hb1 may be smaller than the inter-impurity-region spacing distance Hd (Hb1<Hd). The recess regions 101r may partially overlap the gate structures 200. For example, the recess regions 101r may include undercuts under the gate structures 200.

Each of the gate structures 200 may include a tunnel insulating pattern 211, a floating gate 220, an inter-gate insulating pattern 230, and a control gate 240, which are sequentially stacked. A gate horizontal width Wg may be considered as a horizontal width of any one element of the gate structures 200. For example, the gate horizontal width Wg may be considered as a horizontal width of the control gate 240. The inter-gate spacing distance Hg may be considered as a spacing distance between the same elements of the gate structures 200. For example, the inter-gate spacing distance Hg may be considered as a spacing distance between control gates 240 of the gate structures 200. The gate horizontal width Wg of the gate structures 200 may be the same on the active regions ACT and the field region FLD. The inter-gate spacing distance Hg between the gate structures 200 may be the same on the active regions ACT and the field region FLD. The gate horizontal width Wg of the gate structures 200 may be smaller than the inter-impurity-region spacing distance Hd (Wg<Hd). The inter-gate spacing distance Hg may be smaller than the maximum horizontal width Wr1 of the recess regions 101r (Hg<Wr1). The gate horizontal width Wg may be greater than the inter-recess spacing distance Hb1 (Wg>Hb1).

The tunnel insulating pattern 211 may be formed directly on the active regions ACT. The tunnel insulating pattern 211 may not be formed on the field region FLD. A side surface of the tunnel insulating pattern 211 may be vertically aligned with a side surface of the trench 101r. The tunnel insulating pattern 211 may include oxidized silicon. For example, the tunnel insulating pattern 211 may be formed by oxidizing a surface of the substrate 100.

The tunnel insulating pattern 211 may include a protruded region 211p. The protruded region 211p may extend horizontally along the upper surface of the active regions ACT. The protruded region 211p may protrude more than a side surface of the floating gate 220. The protruded region 211p may include a sloped surface 211s. The protruded region 211p may be separated, e.g., spaced apart from the impurity regions 100a.

The floating gate 220 may be formed on the tunnel insulating pattern 211. The floating gate 220 may be formed on the active regions ACT. The side surface of the floating gate 220 may be vertically aligned with the side surface of the trench 100t.

The floating gate 220 may include conductive material. For example, the floating gate 220 may include doped polycrystalline silicon.

The inter-gate insulating pattern 230 may be disposed on the floating gate 220. The inter-gate insulating pattern 230 may be formed on all of the active regions ACT and the field region FLD. The inter-gate insulating pattern 230 may intersect the active regions ACT and the field region FLD. The inter-gate insulating pattern 230 may partially cover the side surface of the floating gate 220. The inter-gate insulating pattern 230 between floating gates 220 may contact the field insulator 101. The inter-gate insulating pattern 230 may include a plurality of dielectric layers. For example, the inter-gate insulating pattern 230 may include an oxide layer/a nitride layer/an oxide layer, which are stacked. For example, the inter-gate insulating pattern 230 may include a silicon oxide layer/a silicon nitride layer/a metal oxide layer, which are stacked. The metal oxide layer may include an aluminum oxide layer, a hafnium oxide layer, or other various metal oxide layers. The inter-gate insulating pattern 230 may have a repeating uneven shape. The inter-gate insulating pattern 230 may have a higher level on the active regions ACT than on the field region FLD. The inter-gate insulating pattern 230 may be thicker than the tunnel insulating pattern 211.

The control gate 240 may be formed directly on the inter-gate insulating pattern 230. The control gate 240 may intersect the active regions ACT and the field region FLD. The control gate 240 may extend along the inter-gate insulating pattern 230. A lower level profile of the control gate 240 may have a repeating uneven shape. The lower level profile of the control gate 240 may be considered as a line extending along a lower level of the corresponding element. The control gate 240 may include conductive material. For example, the control gate 240 may include polycrystalline silicon. The control gate 240 may include a dopant. The dopant may be a P-type dopant. For example, the control gate 240 may include polycrystalline silicon containing carbon. The control gate 240 on the active regions ACT may have a first vertical thickness Vt1. The control gate 240 on the field region FLD may have a second vertical thickness Vt2. The second vertical thickness Vt2 may be greater than the first vertical thickness Vt1. A profile of an upper surface of the control gate 240 may be a wave shape. The upper surface of the control gate 240 may be relatively higher on the active regions ACT than on the field region FLD.

Each of the gate structures 200 may further include a metal silicide pattern 250 formed on the control gate 240, and a metal gate 260 formed on the metal silicide pattern 250. The metal silicide pattern 250 and the metal gate 260 may include the same metal. For example, the metal gate 260 may include tungsten W. The metal silicide pattern 250 may include tungsten silicide. The metal silicide pattern 250 and/or the metal gate 260 may have a metal horizontal width Wm. The metal horizontal width Wm may be smaller than the gate horizontal width Wg (Wm<Wg). Both side surfaces of the metal silicide pattern 250 and/or the metal gate 260 may be recessed into the inside of the metal silicide pattern 250 and/or the metal gate 260. The both recessed side surfaces of the metal silicide pattern 250 may be vertically aligned with the both recessed side surfaces of the metal gate 260.

Each of the gate structures 200 may further include a protective pattern 181, which covers both recessed side surfaces of the metal silicide pattern 250 and/or the metal gate 260. The protective pattern 181 may cover all of both recessed side surfaces of the metal gate 260. An outer side surface of the protective pattern 181 may be vertically aligned with a side surface of the control gate 240. The protective pattern 181 may include nitride or oxide. For example, the protective pattern 181 may include silicon nitride. The protective pattern 181 may cover all of both recessed side surfaces of the metal silicide pattern 250. Both side surfaces of an upper region 240u of the control gate 240 may be recessed into the inside of the control gate 240. The protective pattern 181 may cover both recessed side surfaces of the upper region 240u of the control gate 240. The horizontal width of the upper region 240u of the control gate 240 may be the same as the metal horizontal width Wm. The protective pattern 181 may extend along both recessed side surfaces of the metal silicide pattern 250 and/or the metal gate 260.

Each of the gate structures 200 may further include a hard mask pattern 420. The hard mask pattern 420 may include a lower hard mask pattern 421 and an upper hard mask pattern 422. The lower hard mask pattern 421 may be formed on the metal gate 260. The lower hard mask pattern 421 may include silicon nitride (SiN). The upper hard mask pattern 422 may be formed on the lower hard mask pattern 421. The upper hard mask pattern 422 may include silicon oxynitride (SiON). The upper hard mask pattern 422 may be thicker than the lower hard mask pattern 421. The upper hard mask pattern 422 may be used as an anti-reflective layer.

The first gate structures 201 may include a stacked structure of the tunnel insulating pattern 211, the floating gate 220, the inter-gate insulating pattern 230, the control gate 240, the metal silicide pattern 250, the metal gate 260, and the hard mask pattern 420. The tunnel insulating pattern 211 of the first gate structures 201 may directly contact a surface of the active regions ACT.

The second gate structures 206 may include a stacked structure of the inter-gate insulating pattern 230, the control gate 240, the metal silicide pattern 250, the metal gate 260, and the hard mask pattern 420. The inter-gate insulating pattern 230 of the second gate structures 206 may directly contact the field insulator 101.

A lowermost level F of the second gate structures 206 may be higher than a lowermost level B of the first gate structures 201. A lower level profile of the gate structures 200 may be lower on the active regions ACT than on the field region FLD. The lowermost level of the gate structures 200 may be disposed on the active regions ACT.

The lower level profile of the gate structures 200 may have a first vertical step difference Vg1 with respect to the lower level profile of the gate structures 206. The first vertical step difference Vg1 may be considered as a height difference between the lowermost level B of the first gate structures 201 and the lowermost level F of the second gate structures 206. The first vertical step difference Vg1 may also be considered as a height difference between the upper surface of the active regions ACT and the upper surface of the field insulator 101.

Each of the first gate structures 201 may have a first vertical height Vh1. The first vertical height Vh1 may be considered as a vertical distance, i.e., a distance along a normal to the substrate, between a lowermost level of the tunnel insulating pattern 211 and an uppermost level of the hard mask pattern 420 on the active regions ACT. The first vertical height Vh1 may also be considered as a vertical distance between the upper surface of the active regions ACT and the upper surface of the hard mask pattern 420 on the active regions ACT.

Each of the second gate structures 206 may have a second vertical height Vh2. The second vertical height Vh2 may be considered as a vertical distance between a lowermost level of the inter-gate insulating pattern 230 and the uppermost level of the hard mask pattern 420 on the field region FLD. The second vertical height Vh2 may also be considered as a vertical length between the upper surface of the field insulator 101 and the upper surface of the hard mask pattern 420 on the field region FLD.

The second vertical height Vh2 may be less than the first vertical height Vh1. The uppermost level of the first gate structures 201 may be higher than that of the second gate structures 206.

An upper level profile of the gate structures 200 may have a second vertical step difference Vg2. The second vertical step difference Vg2 may be considered as a height difference between lowermost and uppermost levels of the upper level profile of the gate structures 200. The second vertical step difference Vg2 may be considered as a height difference between the uppermost level of the first gate structures 201 and the uppermost level of the second gate structures 206.

The second vertical step difference Vg2 may be smaller than the first step difference Vg1. The second vertical step difference Vg2 of the upper level profile of the gate structures 200 may be smaller than the first vertical step difference Vg1 of the lower level profile of the gate structures 200 (Vg1>Vg2).

The air gaps 300 may intersect the active regions ACT and the field region FLD. The air gaps 300 may be parallel with respect to the gate structures 200. The air gaps 300 may be defined by the substrate 100, the gate structures 200, and the interlayer insulating layer 500.

The air gaps 300 may include first air gaps 301 and second air gaps 306. The first air gaps 301 may be disposed on the active regions ACT. The second air gaps 306 may be disposed on the field region FLD. The first air gaps 301 and the second air gaps 306 may be considered as a portion of the air gaps 300. For example, the first air gaps 301 may be considered as a portion of the air gaps 300 on the active regions ACT. The second air gaps 306 may be considered as the remaining portion of the air gaps 300 on the field region FLD.

A lowermost level C of the first air gaps 301 may be the same as the lowermost level B of the first gate structures 201. The lowermost level C of the first air gaps 301 may be the same as the upper surface D of the active regions ACT.

Each of the second air gaps 306 may extend into the inside of the recess regions 101r. The second air gaps 306 may be partially and vertically aligned with a lower portion of the gate structures 200 in the inside of the recess regions 101r. The second air gaps 306 may include undercuts formed under the second gate structures 206.

A lowermost level A of the second air gaps 306 may be lower than the upper surface D of the active regions ACT. The lowermost level A of the second air gaps 306 may be lower than the lowermost level C of the first air gaps 301. The lowermost level of the air gaps 300 may be located in the field region FLD. An uppermost level of a lower level profile of the air gaps 300 may be the same as the upper surface of the active region ACT.

The lower level profile of the air gaps 300 may have a third vertical step difference Vg3. The third vertical step difference Vg3 may be considered as a height difference between the lowermost level C of the first air gaps 301 and the lowermost level A of the second air gaps 306. The third vertical step difference Vg3 may be considered as a height difference between the lowermost level of the recess regions 101r and the upper surface of the active regions ACT. The third vertical step difference Vg3 may be smaller than the first vertical depth Vd1 (Vg3<Vd1). The third vertical step difference Vg3 may be smaller than the first vertical step difference Vg1 (Vg3<Vg1).

Each of the first air gaps 301 may have a third vertical height Vh3. The third vertical height Vh3 may be considered as a vertical distance between the upper surface of the active regions ACT and a lower surface of the interlayer insulating layer 500 on the active regions ACT. The third vertical height Vh3 may be greater than the first vertical height Vh1 (Vh3>Vh1). In the active regions ACT, an uppermost level of the lower surface of the interlayer insulating layer 500 may be higher than the uppermost level of the first gate structures 201.

The second air gaps 306 may have a fourth vertical height Vh4. The fourth vertical height Vh4 may be considered as a vertical distance between the lowermost level of the recess regions 101r and the lower surface of the interlayer insulating layer 500 on the field region FLD. The fourth vertical height Vh4 may be greater than the second vertical height Vh2 (Vh4>Vh2). The fourth vertical height Vh4 may be greater than the sum of the second vertical height Vh2 and the second vertical depth Vd2 (Vh4>Vh2+Vd2). In the field region FLD, the uppermost level of the lower surface of the interlayer insulating layer 500 may be higher than the uppermost level of the second gate structures 206. An uppermost level of the air gaps 300 may be in the active regions ACT.

An upper level profile of the air gaps 300 may have a fourth vertical step difference Vg4. The fourth vertical step difference Vg4 may be considered as a height difference between the uppermost level of the first air gaps 301 and the uppermost level of the second air gaps 306. The fourth vertical step difference Vg4 may be the same as or less than the second vertical step difference Vg2 (Vg4≤Vg2). The fourth vertical height Vh4 may be the same as or greater than the third vertical height Vh3 (Vh4≥Vh3). A difference between the first vertical height Vh1 of the first gate structures 201 and the third vertical height Vh3 of the first air gaps 301 may be smaller than a difference between the second vertical height Vh2 of the second gate structures 206 and the fourth vertical height Vh4 of the second air gaps 306 (Vh1−Vh3<Vh2−Vh4).

In the semiconductor device according to the exemplary embodiment, the second air gaps 306 may extend into the inside of the recess regions 101r disposed in the field insulator 101. In the semiconductor device according to the exemplary embodiment, the lowermost level B of the first gate structures 201 may be higher than the lowermost level A of the second air gaps 306. For example, in the semiconductor device according to the exemplary embodiment, the lowermost level of the air gaps 300 may be lower than the lowermost level of the lower level profile of the gate structures 200. Thus, in the semiconductor device according to the exemplary embodiment, parasitic capacitance between the gate structures 200 may be reduced.

The interlayer insulating layer 500 may be disposed in the active regions ACT and the field region FLD. The interlayer insulating layer 500 may include an oxide, a nitride, or a combination thereof. For example, the interlayer insulating layer 500 may include silicon oxide.

Figure 3A:
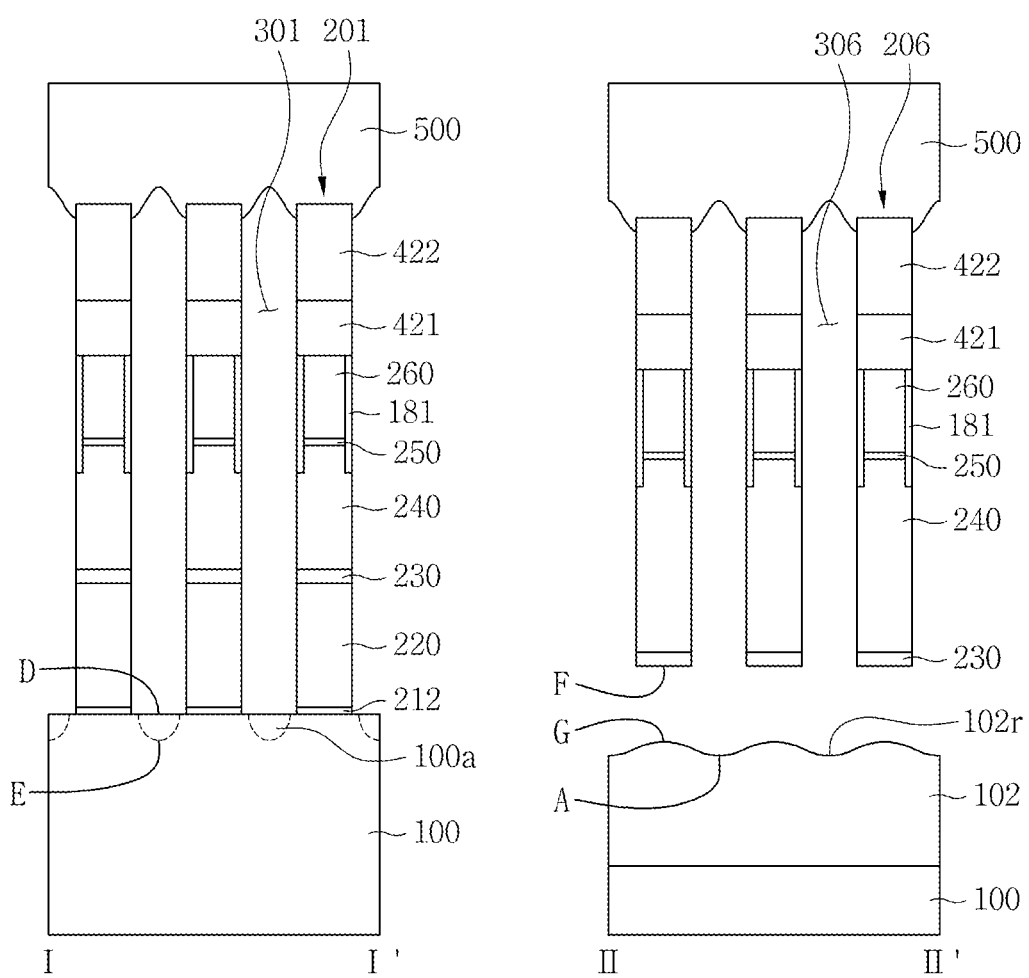
FIGS. 3A and 3B illustrate cross-sectional views showing a semiconductor device according to another exemplary embodiment.
Figure 3B:
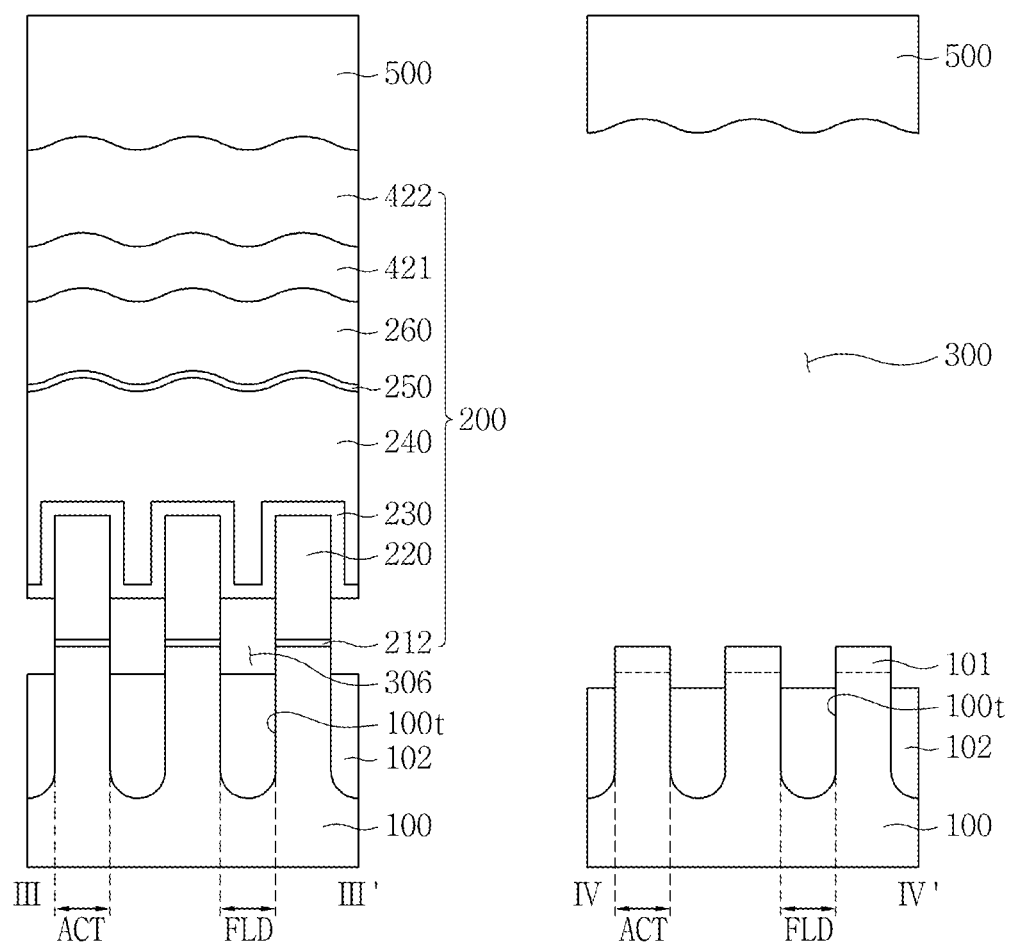

FIGS. 3A and 3B illustrate cross-sectional views showing a semiconductor device according to another exemplary embodiment.

Referring to FIGS. 3A and 3B, a semiconductor device according to an exemplary embodiment may include a substrate 100, gate structures 200, air gaps 300, and an interlayer insulating layer 500. A field region FLD of the substrate 100 may include a trench 100t and a field insulator 102. In the gate structures 200, a side surface of a tunnel insulating layer 212 may be vertically aligned with a side surface of a floating gate 220.

The field insulator 102 may fill the trench 100t. The field insulator 102 may be spaced apart from the gate structures 200. In the field region FLD, an uppermost level G of the field insulator 102 may be lower than a lowermost level F of second gate structures 206. The uppermost level G of the field insulator 102 may be lower than an upper surface of active regions ACT. An uppermost level of a lower level profile of the air gaps 300 may be lower than the upper surface D of the active regions ACT. The uppermost level of the lower level profile of the air gaps 300 may be lower than a lowermost level of a lower level profile of the gate structures 200. The uppermost level G of the field insulator 102 may be the same as or higher than a lowermost level E of impurity regions 100a. The field insulator 102 may include recess regions 102r. The recess regions 102r may be spatially connected with each other. A lowermost level A of the recess regions 102r may be lower than the lowermost level E of the impurity regions 100a.

First air gaps 301 and second air gaps 306 may be spatially connected with each other along a parallel direction to the gate structures 200. The second air gaps 306, which are adjacent along the upper surface of the field insulator 102, may be spatially connected with each other through lower regions of the second gate structures 206. The first air gaps 301, which are adjacent along a direction intersecting the active regions ACT and the field region FLD, may be spatially connected with each other through lower regions of the second air gaps 306 and the second gate structures 206. The air gaps 300 may be formed on a lower surface of the second gate structures 206.

Figure 4A:
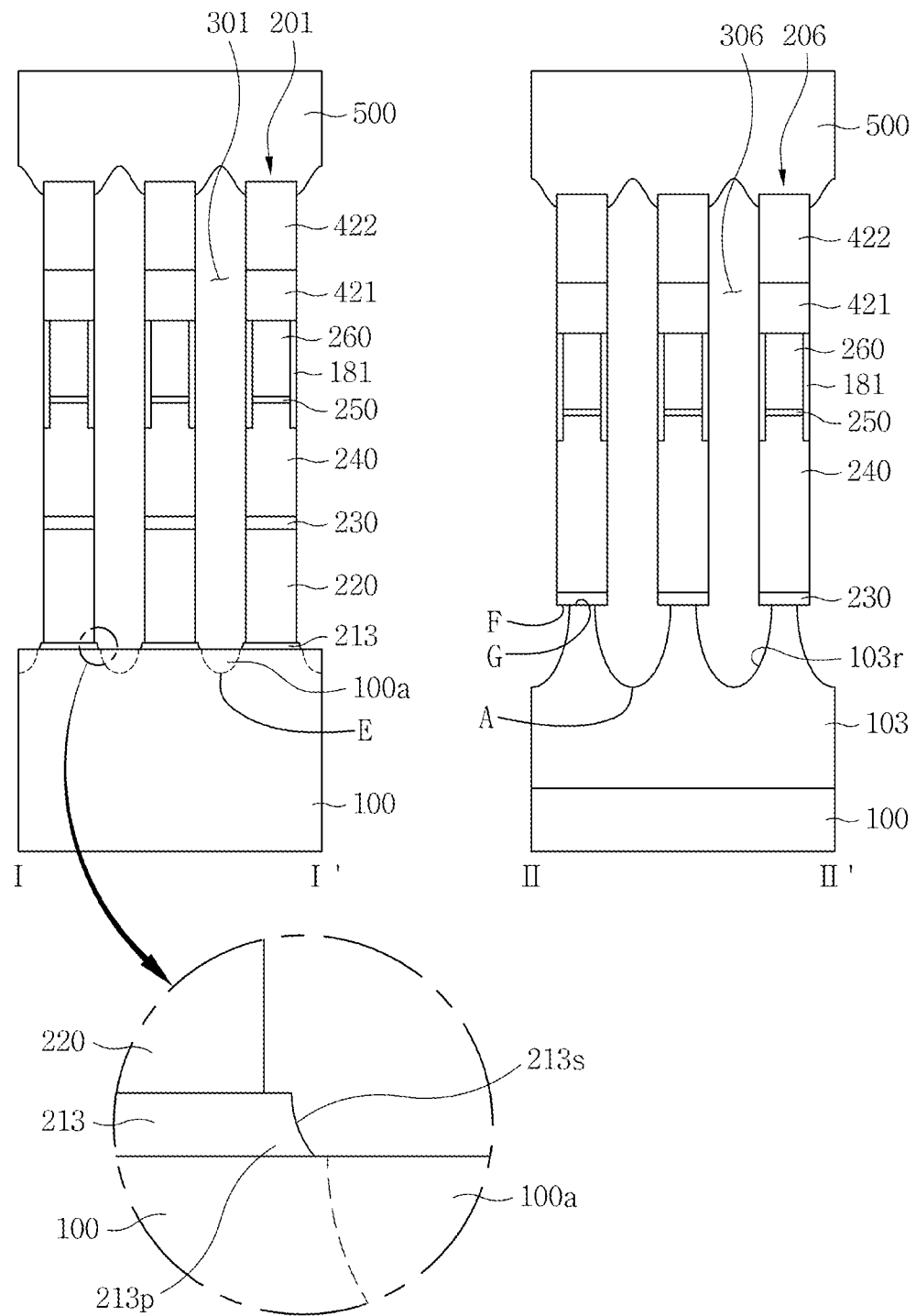
FIGS. 4A and 4B illustrate cross-sectional views showing a semiconductor device according to another exemplary embodiment.
Figure 4B:
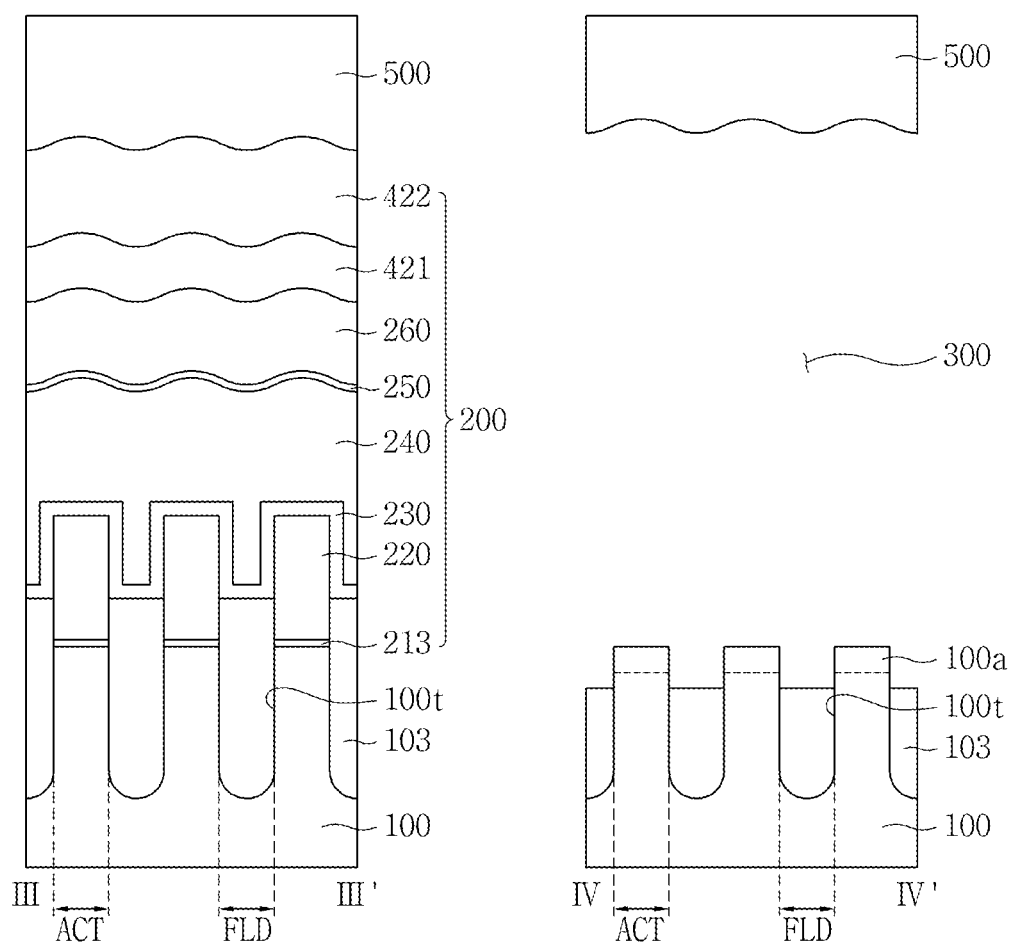

FIGS. 4A and 4B illustrate cross-sectional views showing a semiconductor device according to another exemplary embodiment.

Referring to FIGS. 4A and 4B, a semiconductor device according to this exemplary embodiment may include a substrate 100, gate structures 200, air gaps 300, and an interlayer insulating layer 500. A field region FLD of the substrate 100 may include a trench 100t and a field insulator 103 filling the trench 100t. An upper surface G of the field insulator 103 may be the same as a lowermost level F of second gate structures 206. The field insulator 103 may include recess regions 103r. A lowermost level A of the recess regions 103r may be lower than a lowermost level E of impurity regions 100a.

Figure 5A:
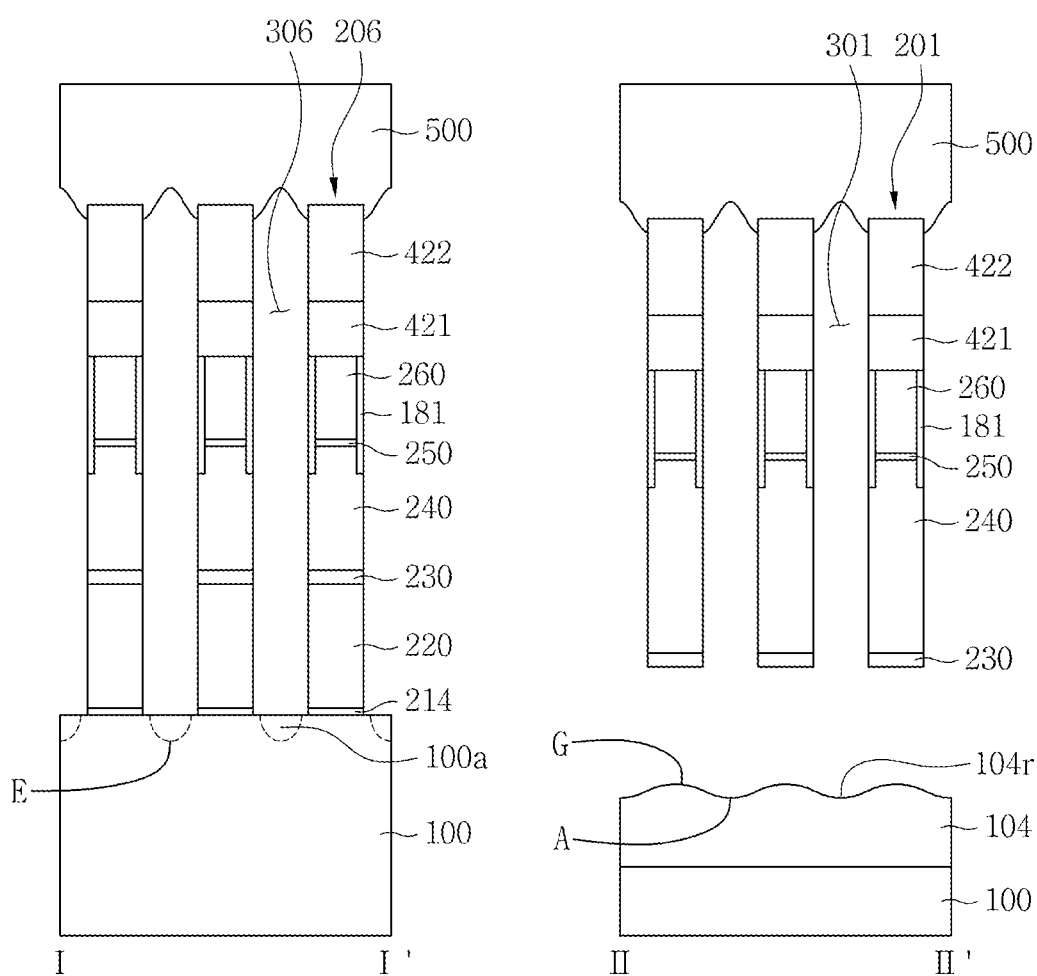
FIGS. 5A and 5B illustrate cross-sectional views showing a semiconductor device according to another exemplary embodiment.
Figure 5B:
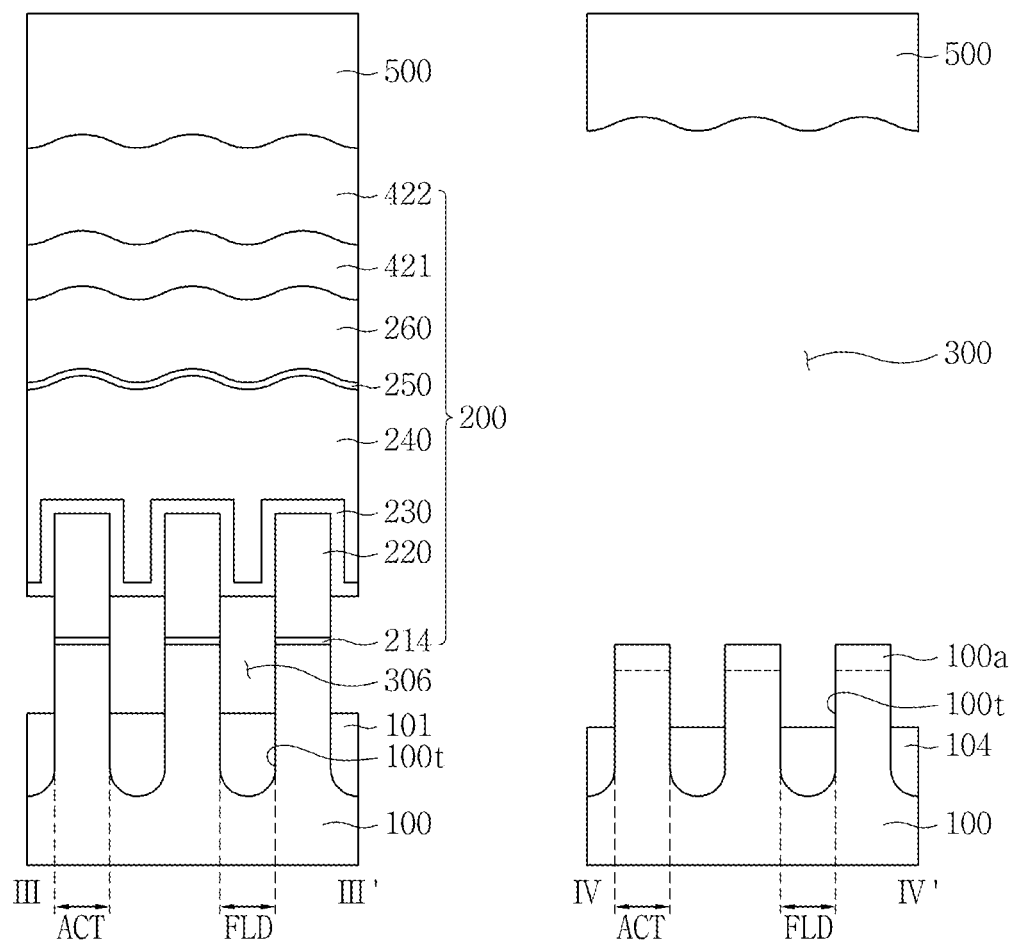

FIGS. 5A and 5B illustrate cross-sectional views showing a semiconductor device according to another exemplary embodiment.

Referring to FIGS. 5A and 5B, a semiconductor device according to this exemplary embodiment may include a substrate 100, gate structures 200, air gaps 300, and an interlayer insulating layer 500. A field region FLD of the substrate 100 may include a trench 100t and a field insulator 104 filling the trench 100t. An uppermost level of the field insulator G 104 may be lower than a lowermost level of impurity regions 100a. The uppermost level G of the field insulator 104 may be disposed between a lowermost level A of recess regions 104r and the lowermost level E of the impurity regions 100a. The air gaps 300 may be disposed between the impurity regions 100a, which are adjacent in a direction intersecting the active regions ACT and the field region FLD. A step difference of a lower level profile of the air gaps 300 may be greater than that of an upper level profile of the air gaps 300. The step difference of a lower level profile of the air gaps 300 may be greater than that of a lower level profile of the gate structures 200.

Figure 6A:
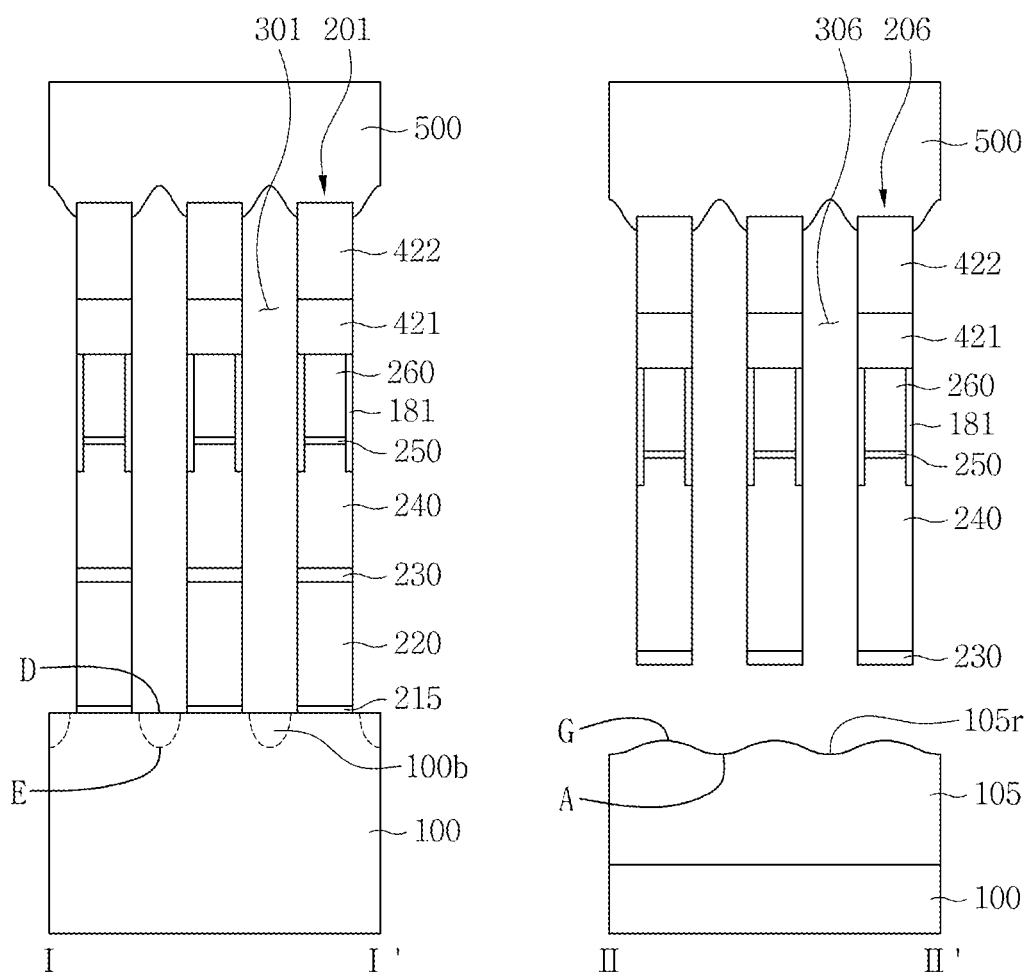
FIGS. 6A and 6B illustrate cross-sectional views showing a semiconductor device according to another exemplary embodiment.
Figure 6B:
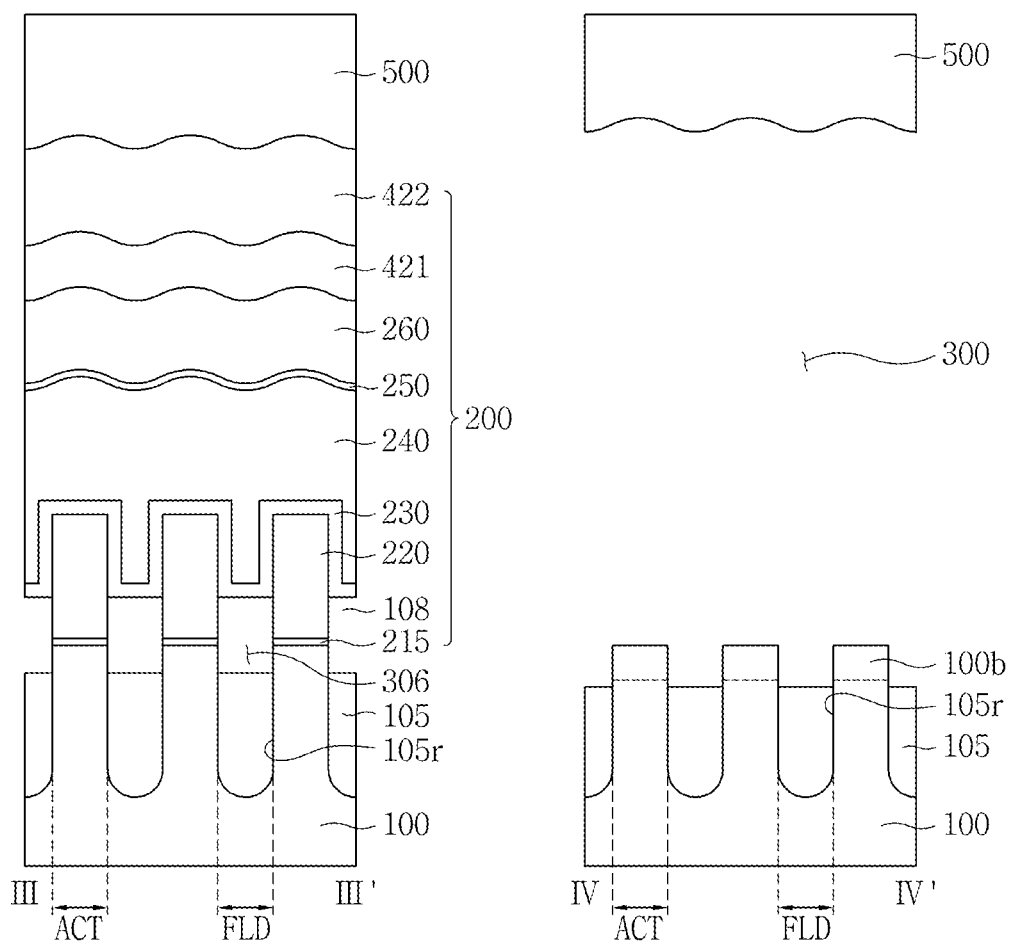

FIGS. 6A and 6B illustrate cross-sectional views showing a semiconductor device according to another exemplary embodiment.

Referring to FIGS. 6A and 6B, a semiconductor device according to an embodiment may include a substrate 100, gate structures 200, air gaps 300, and an interlayer insulating layer 500. In a field region FLD of the substrate 100, an uppermost level G of a field insulator 105 may be disposed between an upper surface D of active regions ACT of the substrate 100 and a lowermost level E of impurity regions 100b. A lowermost level of recess regions 105r of the field insulator 105 may be lower than the lowermost level E of impurity regions 100b. The lowermost level E of impurity regions 100b may be disposed between the lowermost level A of the recess regions 105r and an uppermost level G of the field insulator 105.

FIGS. 7A to 25A and 7B to 25B illustrate cross-sectional views depicting stages of a method of fabricating a semiconductor device according to the exemplary embodiment illustrated in FIGS. 2A and 2B. FIG. 26 is a flow chart illustrating a method of fabricating a semiconductor device according to this exemplary embodiment.

A method of fabricating a semiconductor device according to this exemplary embodiment will be described by referring to FIGS. 2A, 2B, 7A to 25A, 7B to 25B, and 26.

Figure 7A:
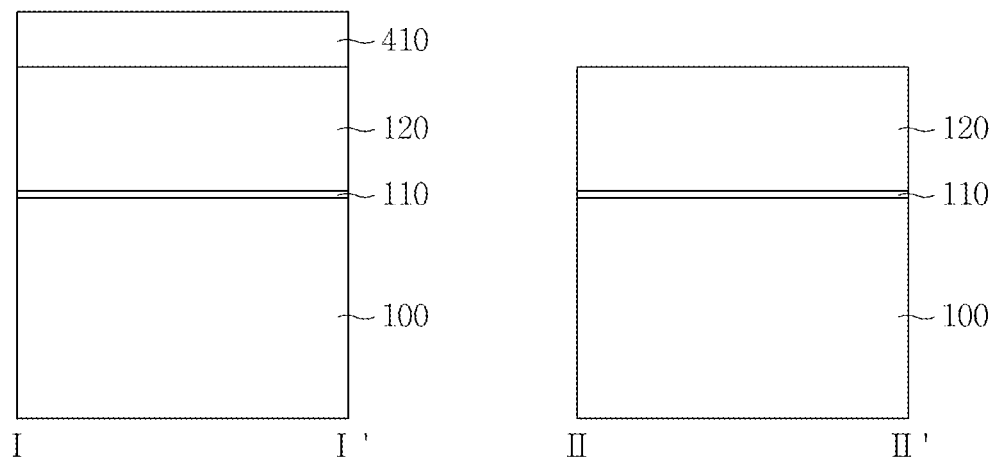
Figure 7B:
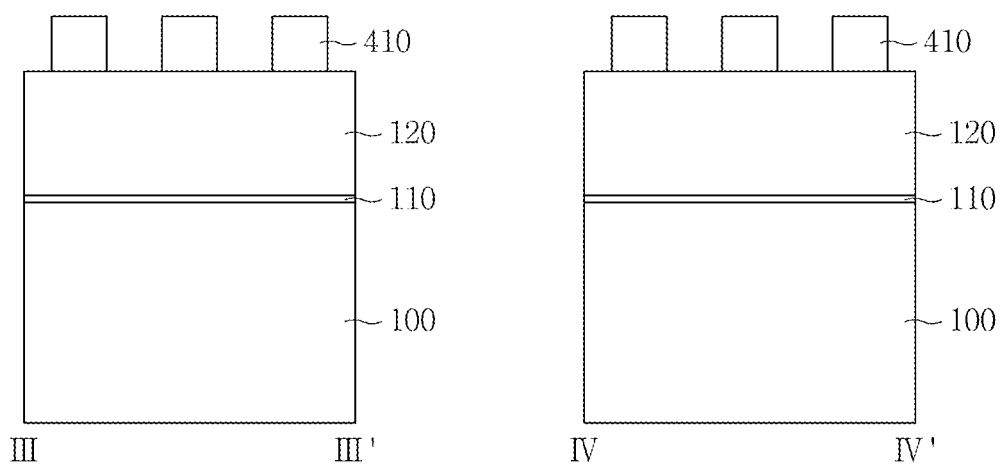

Firstly referring to FIGS. 7A, 7B and 26, a method of fabricating a semiconductor device according to this exemplary embodiment may include a process of sequentially forming a tunnel insulating layer 110, a floating gate layer 120, and mask patterns 410 on a substrate 100 (S101).

The process of sequential forming the tunnel insulating layer 110, the floating gate layer 120, and the mask patterns 410 on the substrate 100 may include a process of preparing the substrate 100, a process of forming the tunnel insulating layer 110 on the substrate 100, a process of forming the floating gate layer 120 on the tunnel insulating layer 110, and a process of forming the mask patterns 410 on the floating gate layer 120.

The substrate 100 may be a semiconductor substrate such as a silicon wafer or an SOI wafer. The process of forming the tunnel insulating layer 110 on the substrate 100 may include a process of oxidizing a surface of the substrate 100. The process of oxidizing the surface of the substrate 100 may include a dry oxidation process. The oxidation process may include a thermal oxidation process. The process of forming the tunnel insulating layer 110 may include a process of forming an oxidized material layer. For example, the process of forming the tunnel insulating layer 110 may include forming a silicon oxide layer.

The process of forming the floating gate layer 120 on the tunnel insulating layer 110 may include a chemical vapor deposition (CVD) process. The chemical vapor deposition process may include a low pressure CVD (LPCVD) process and a plasma enhanced CVD (PECVD) process. The process of forming the floating gate layer 120 may include a process of forming a conductive layer. For example, the process of forming the floating gate layer 120 may include a process of forming a polycrystalline silicon layer.

The mask patterns 410 may define active regions ACT and a field region FLD. The mask patterns 410 may include a single mask material layer or a plurality of mask material layers. For example, the mask patterns 410 may include silicon nitride, silicon oxide, a SOH (spin-on-hard mask) and/or a photoresist.

Figure 8A:
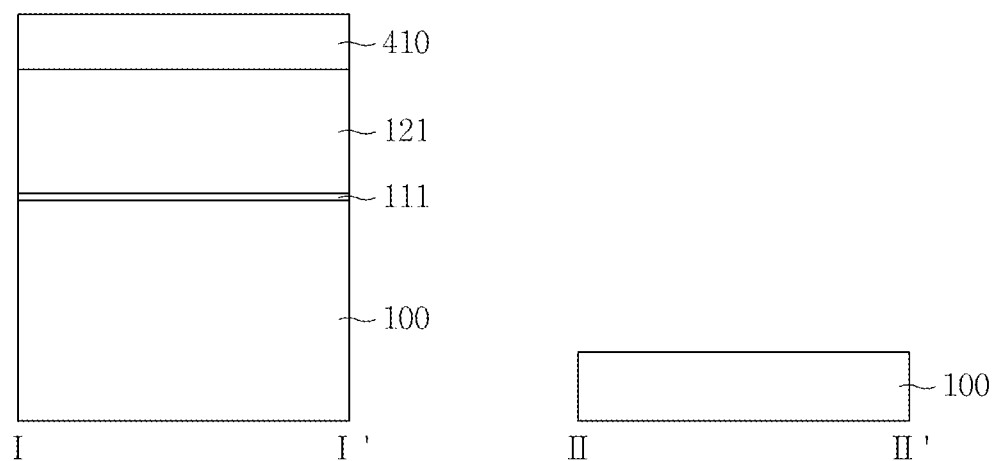
Figure 8B:
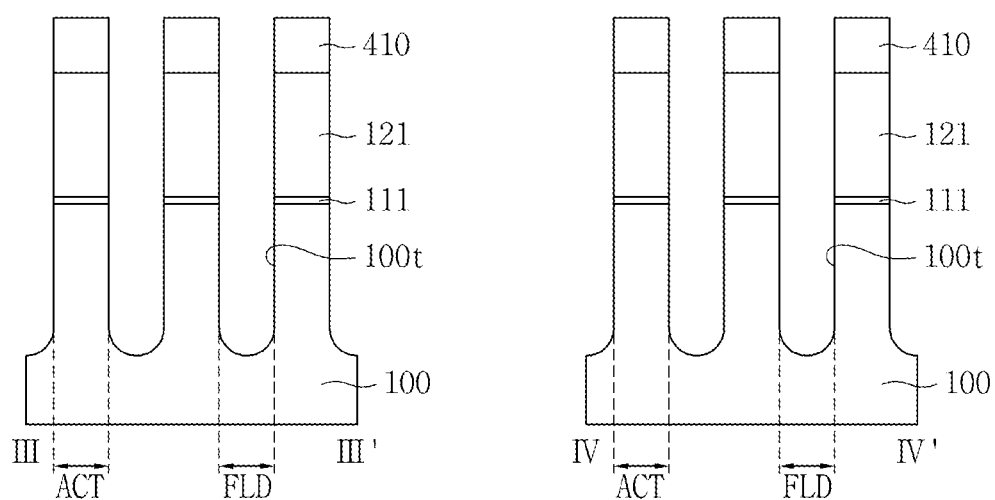

Referring to FIGS. 8A, 8B and 26, the method may include a process of forming preliminary floating gates 121 and preliminary tunnel insulating patterns 111 on the substrate 100, and a trench 100t in the substrate 100 (S102). A formation region of the trench 100t may be defined as the field region FLD. The preliminary tunnel insulating patterns 111 may be formed using the mask patterns 410 as an etch mask to etch the tunnel insulating layer 110. The preliminary floating gates 121 may be formed using the mask patterns 410 as the etch mask to etch the floating gate layer 120. Side walls of the trench 100t, side surfaces of the preliminary tunnel insulating patterns 111, and side surfaces of the preliminary floating gates 121 may be vertically aligned with each other.

Figure 9A:
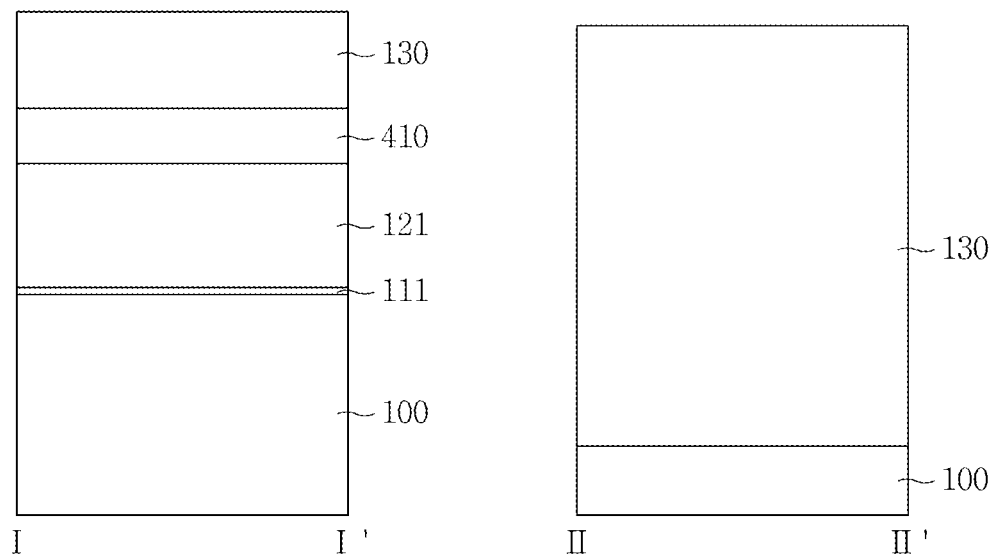
Figure 9B:
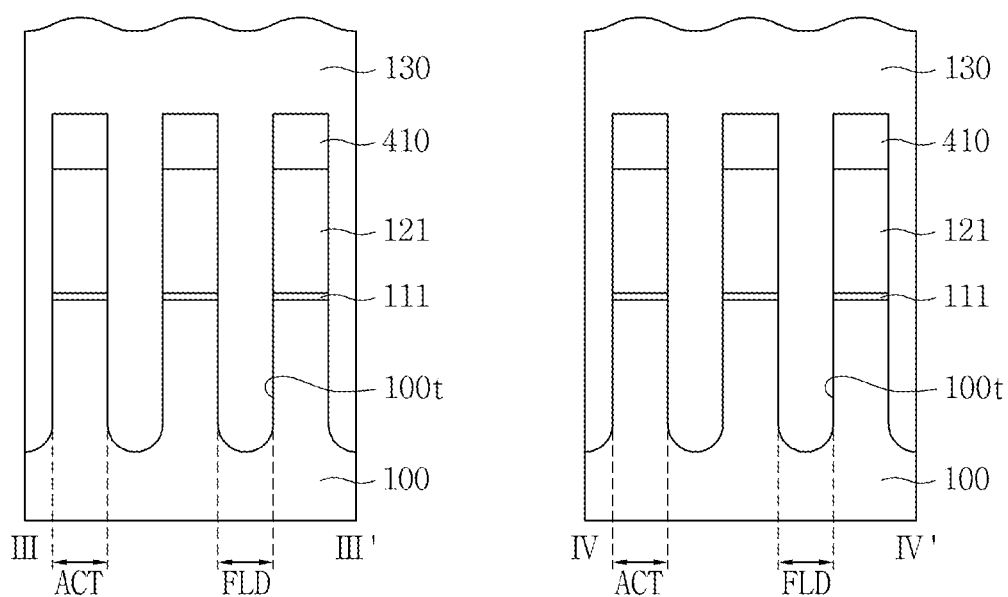

Referring to FIGS. 9A, 9B and 26, the method may include a process of forming a field insulating layer 130 on the substrate 100 (S103). The process of forming the field insulating layer 130 may include a coating process or a chemical vapor deposition process. The field insulating layer 130 may include oxide, nitride, or a combination thereof. The field insulating layer 130 may be formed to fill the trench 100t. The field insulating layer 130 may formed to cover the side surfaces of the preliminary tunnel insulating patterns 111 and the preliminary floating gates 121.

Figure 10A:
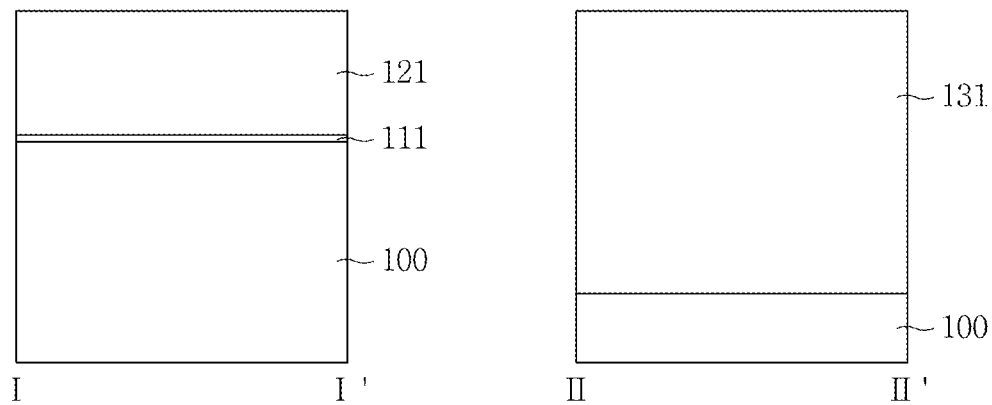
Figure 10B:
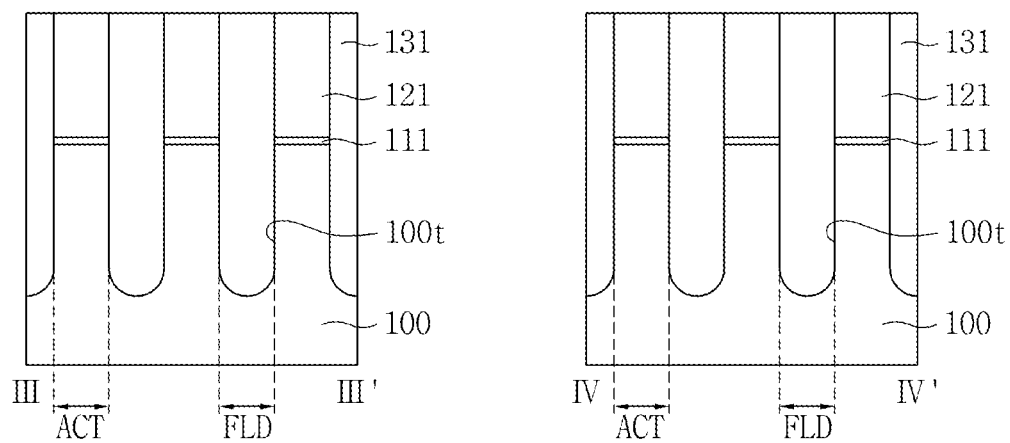

Referring to FIGS. 10A, 10B and 26, the method may include a process of forming first preliminary field insulators 131 filling the trench 100t (S104). The process of forming the first preliminary field insulators 131 may include a process of planarizing the field insulating layer 130. The process of planarizing the first preliminary field insulating layer 130 may include a chemical mechanical polishing (CMP) process or an etch back process. The process of forming the first preliminary field insulators 131 may include a process of exposing upper surfaces of the preliminary floating gates 121. The process of exposing the upper surfaces of the preliminary floating gates 121 may include a process of removing the mask patterns 410. The process of removing the mask patterns 410 may include a planarization process. For example, the process of removing the mask patterns 410 may include the CMP process. The process of removing of the mask patterns 410 may be performed together with the process of forming the first preliminary field insulators 131.

Figure 11A:
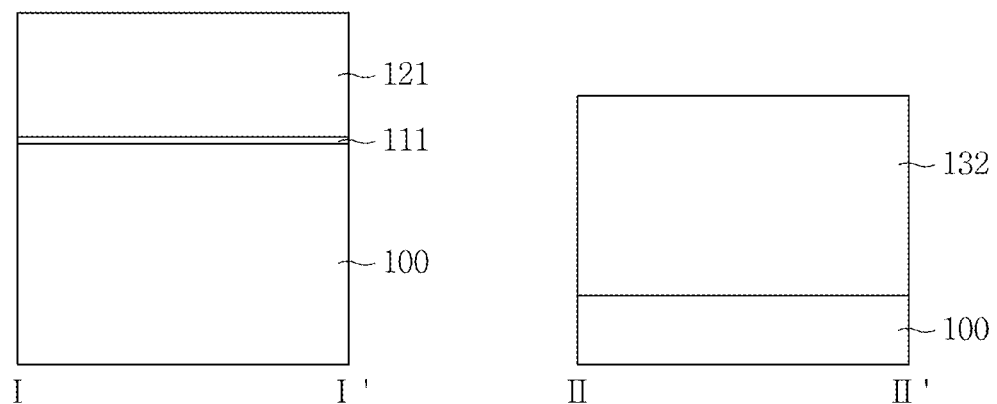
Figure 11B:
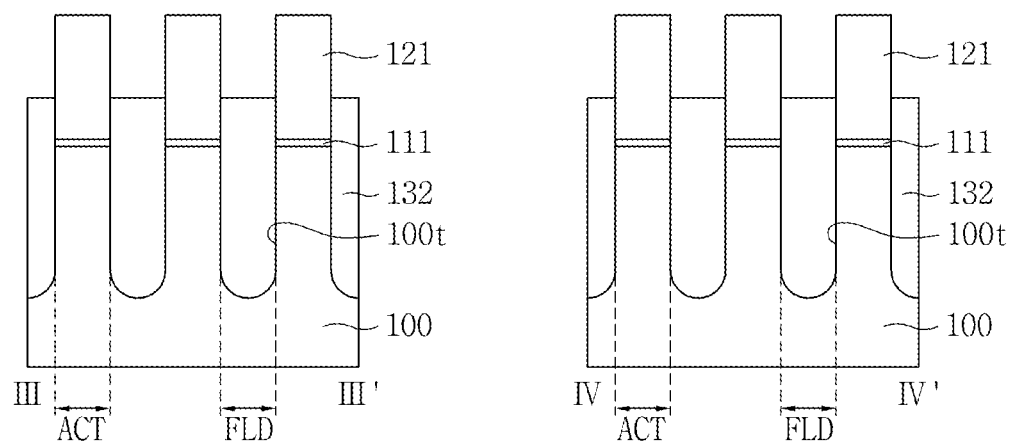

Referring to FIGS. 11A, 11B and 26, the method may include a process of forming second preliminary field insulators 132 in the trench 100t (S105). The process of forming the second preliminary field insulators 132 may include a process of recessing the first preliminary field insulators 131. The process of recessing the first preliminary field insulators 131 may include an etch back process. All of the upper surfaces, and a portion of the side surfaces of the preliminary floating gates 121 may be exposed. An upper level of the second preliminary field insulator 132 may be higher than a lower level of the preliminary floating gates 121.

Figure 12A:
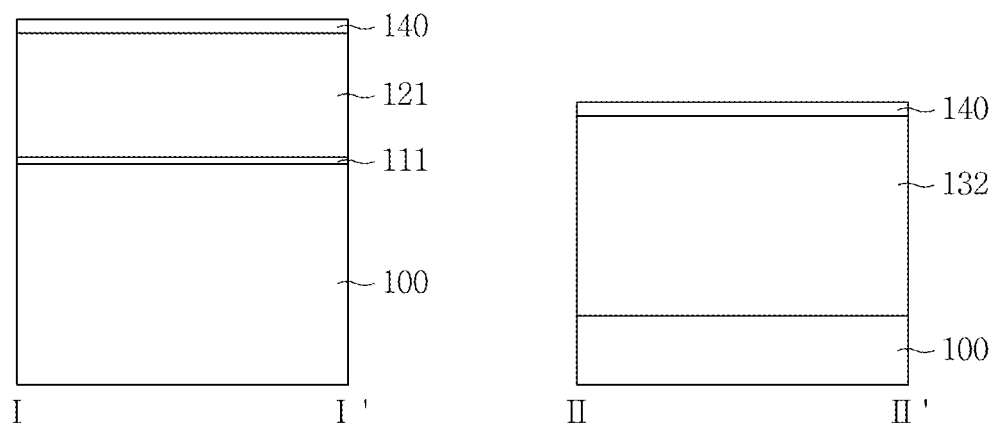
Figure 12B:
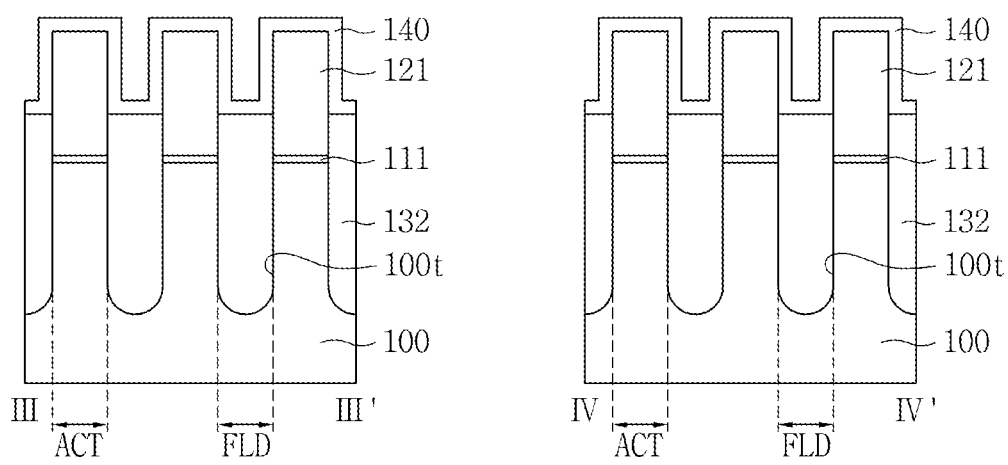

Referring to FIGS. 12A, 12B and 26, the method may include a process of forming an inter-gate insulating layer 140 on the substrate 100 (S106). The process of forming the inter-gate insulating layer 140 may include a CVD process or an atomic layer deposition (ALD) process. The chemical vapor deposition process may include an LPCVD process and a PECVD process. The inter-gate insulating layer 140 may include a plurality of dielectrics. For example, the process of forming the inter-gate insulating layer 140 may include a process of forming a silicon oxide layer, a process of forming a silicon nitride layer on the silicon oxide layer, and a process of forming a metal oxide layer on the silicon nitride layer. The metal oxide layer may be foamed of an aluminum oxide layer or a hafnium oxide layer. The inter-gate insulating layer 140 may be formed to cover the upper surfaces and the exposed side surfaces of the preliminary floating gates 121. The inter-gate insulating layer 140 may be formed to contact the second preliminary field insulator 132. The inter-gate insulating layer 140 may be formed to have a thicker thickness than the preliminary tunnel insulating patterns 111.

Figure 13A:
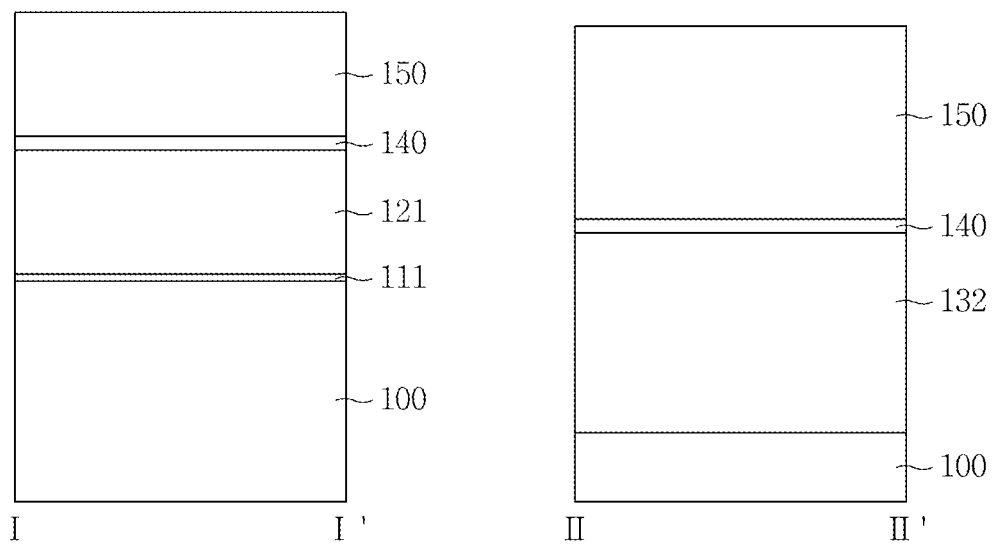
Figure 13B:
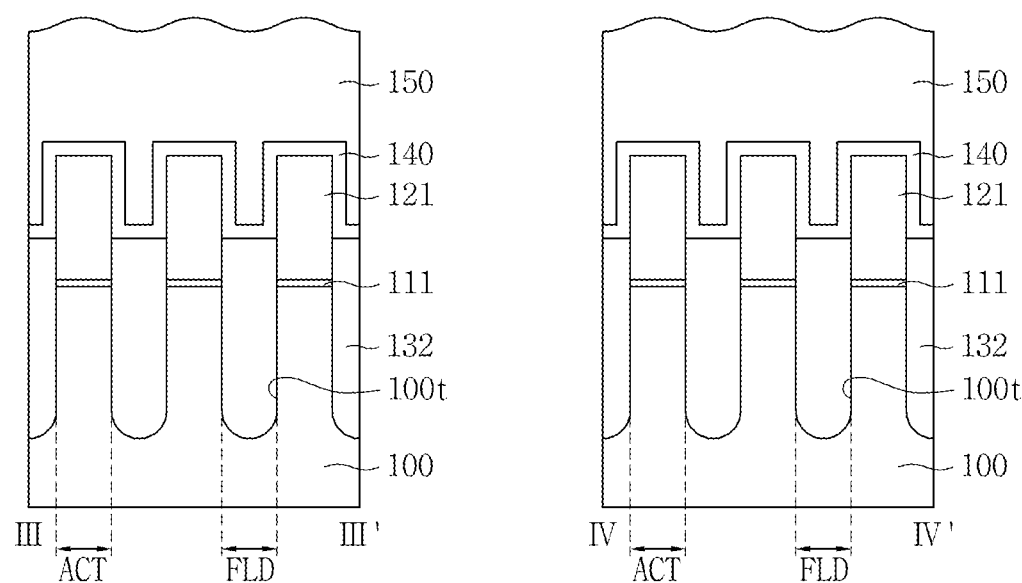

Referring to FIGS. 13A, 13B and 26, the method may include a process of forming a control gate layer 150 on the inter-gate insulating layer 140 (S107). The process of forming the control gate layer 150 may include a CVD process. The CVD process may include an LPCVD process or a PECVD process. The process of forming the control gate layer 150 may include a process of forming a conductive layer. The process of forming the control gate layer 150 may include a process of doping a dopant. For example, the process of forming the control gate layer 150 may include a process of forming polycrystalline silicon doped by a P-type dopant. The control gate layer 150 may be formed to have a thicker thickness on the field region FLD than on the active regions ACT.

Figure 14A:
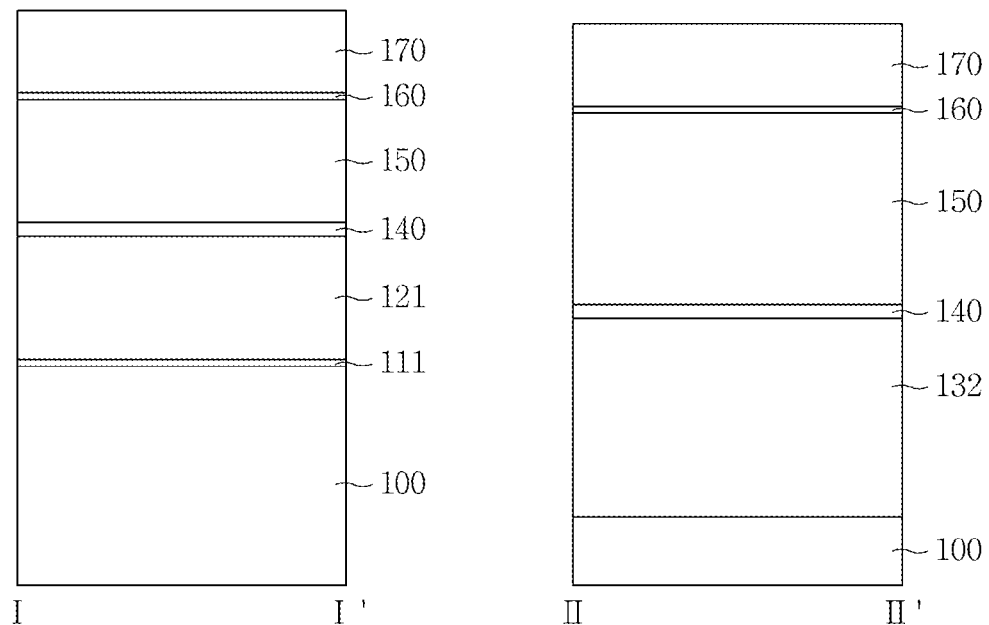
Figure 14B:
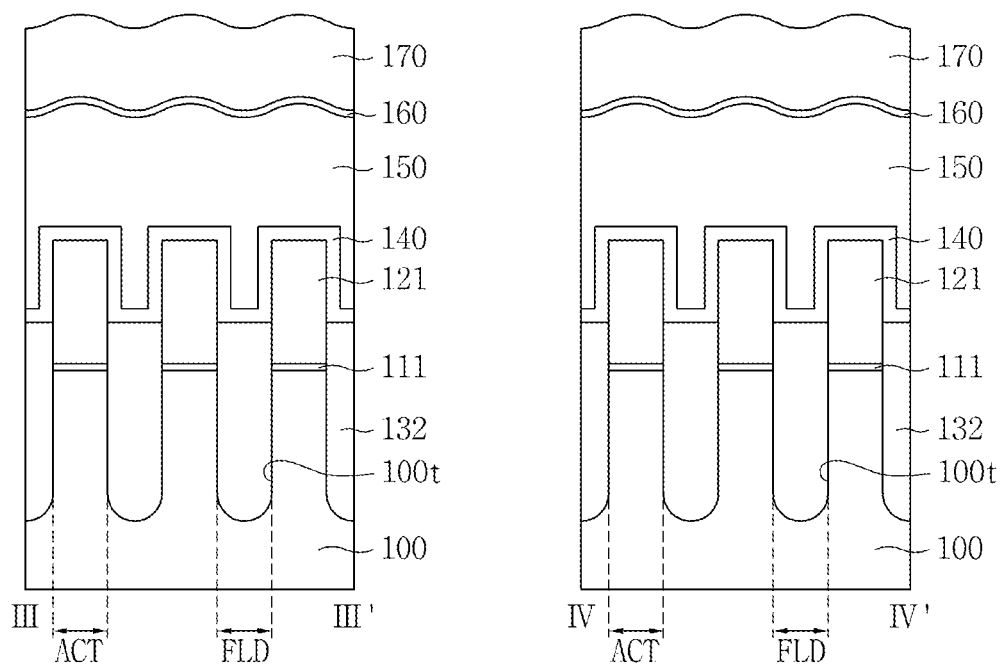

Referring to FIGS. 14A, 14B and 26, the method may include a process of forming a metal silicide layer 160 and a metal gate layer 170 on the control gate layer 150 (S108). The process of forming the metal silicide layer 160 and the metal gate layer 170 may include a process of forming the metal silicide layer 160 on the control gate layer 150, and a process of forming the metal gate layer 170 on the metal silicide layer 160. The process of forming the metal silicide layer 160 may include a CVD process or an ALD process. The process of forming the metal gate layer 170 may include a CVD process or a physical vapor deposition (PVD) process. The CVD process may include an LPCVD process, a PECVD process, and a metal-organic CVD (MOCVD) process.

Figure 15A:
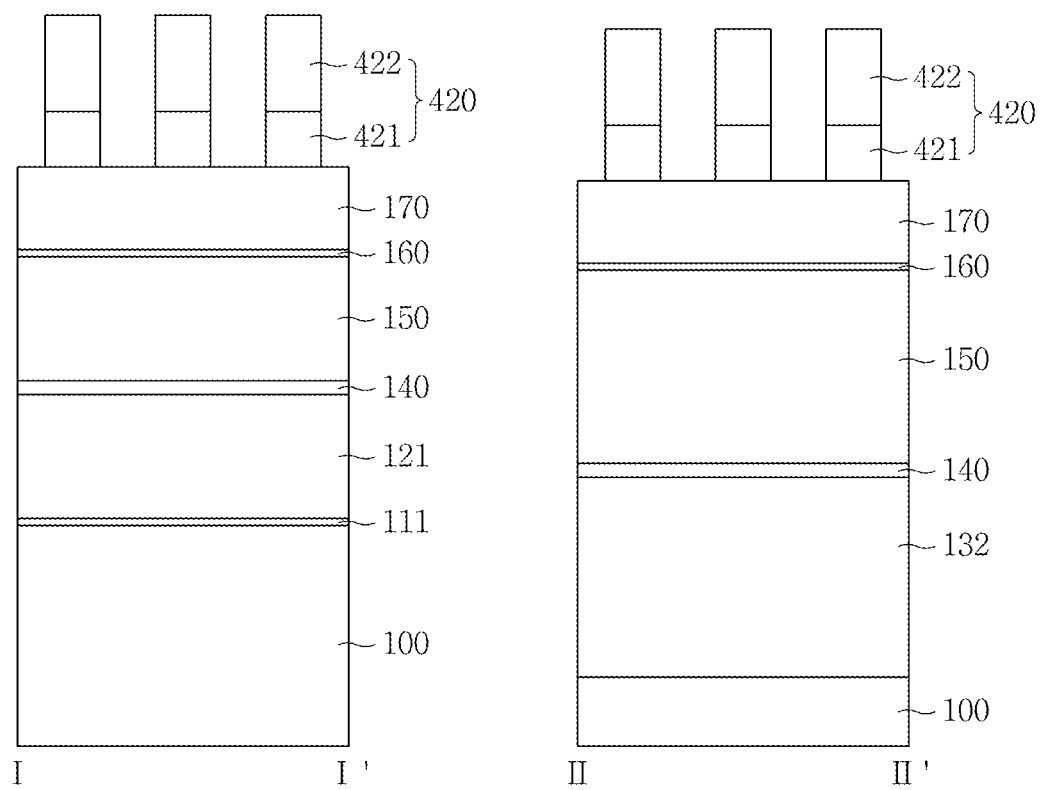
Figure 15B:
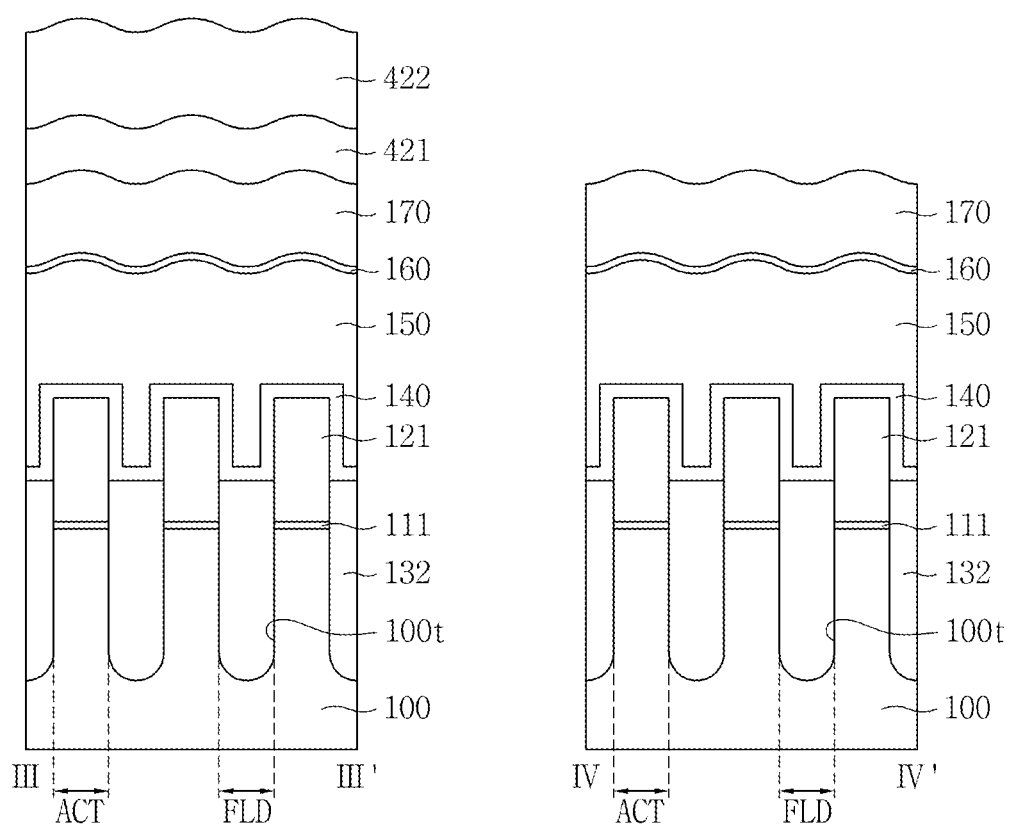

Referring to FIGS. 15A, 15B and 26, the method may include a process of forming hard mask patterns 420 on the metal gate layer 170 (S109). The hard mask patterns 420 may be formed to intersect the active regions ACT and the field region FLD. The process of forming the hard mask patterns 420 may include a process of forming a lower hard mask layer and an upper hard mask layer, and a process of patterning the upper hard mask layer and the lower hard mask layer to form upper hard mask patterns 422 and lower hard mask patterns 421. The lower hard mask patterns 421 may be formed of silicon nitride (SiN). The upper hard mask patterns 422 may be formed of silicon oxynitride (SiON). The hard mask patterns 420 may be formed to have the same horizontal width on the active regions ACT and the field region FLD.

Figure 16A:
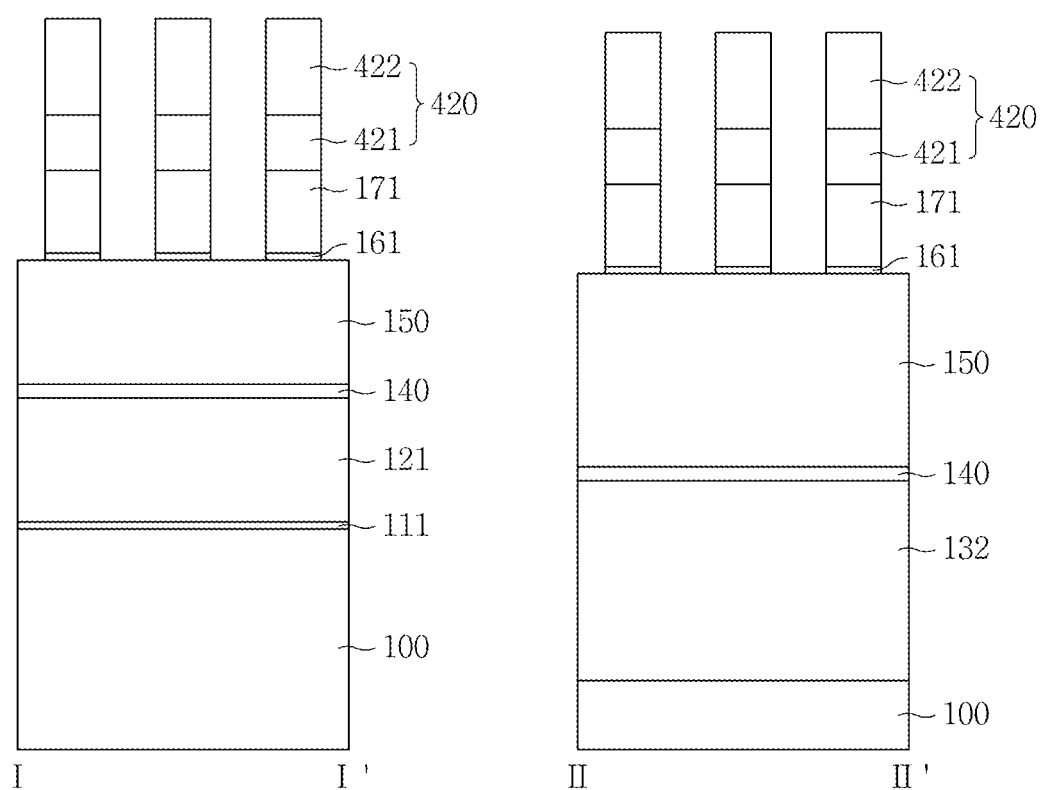
Figure 16B:
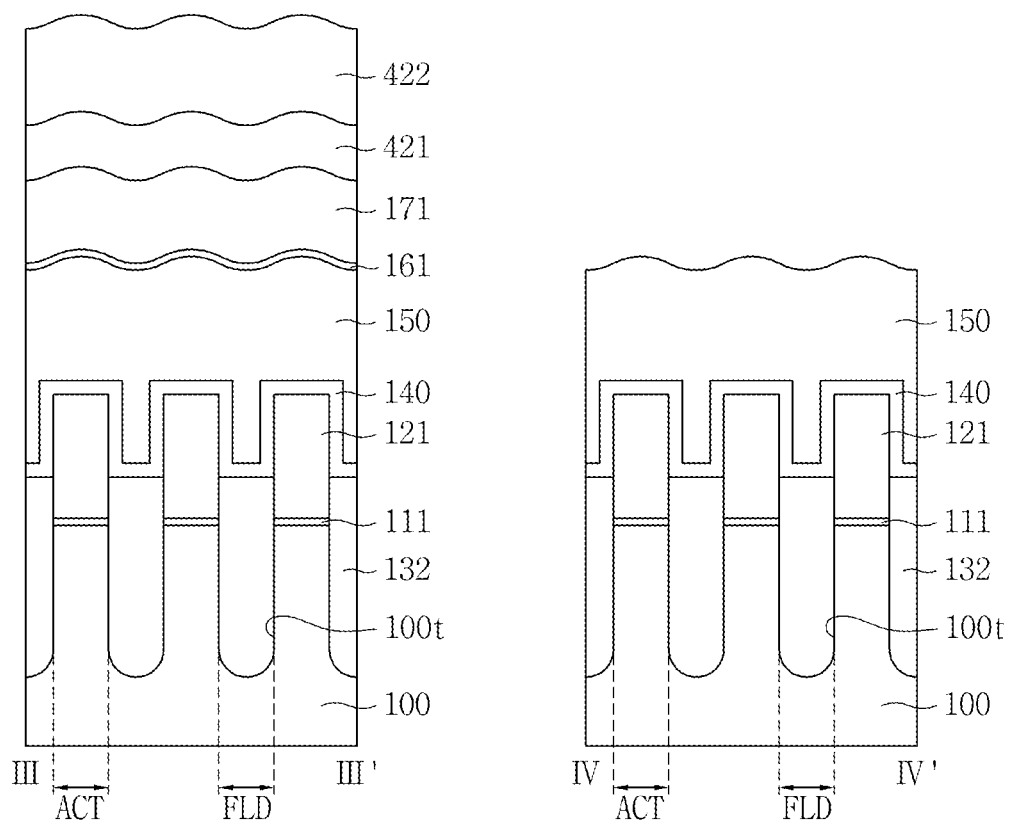

Referring to FIGS. 16A, 16B and 26, the method may include a process of forming preliminary metal gates 171 and preliminary metal silicide layers 161 (S110). The process of forming the preliminary metal gates 171 and the preliminary metal silicide layers 161 may include a process of etching the metal gate layer 170 using the hard mask patterns 420 as an etch mask and a process of etching the metal silicide layer 160. The process of etching the metal gate layer 170 and the process of etching the metal silicide layer 160 may be sequentially performed. The process of etching the metal gate layer 170 and the process of etching the metal silicide layer 160 may include an anisotropic dry etch process.

Figure 17A:
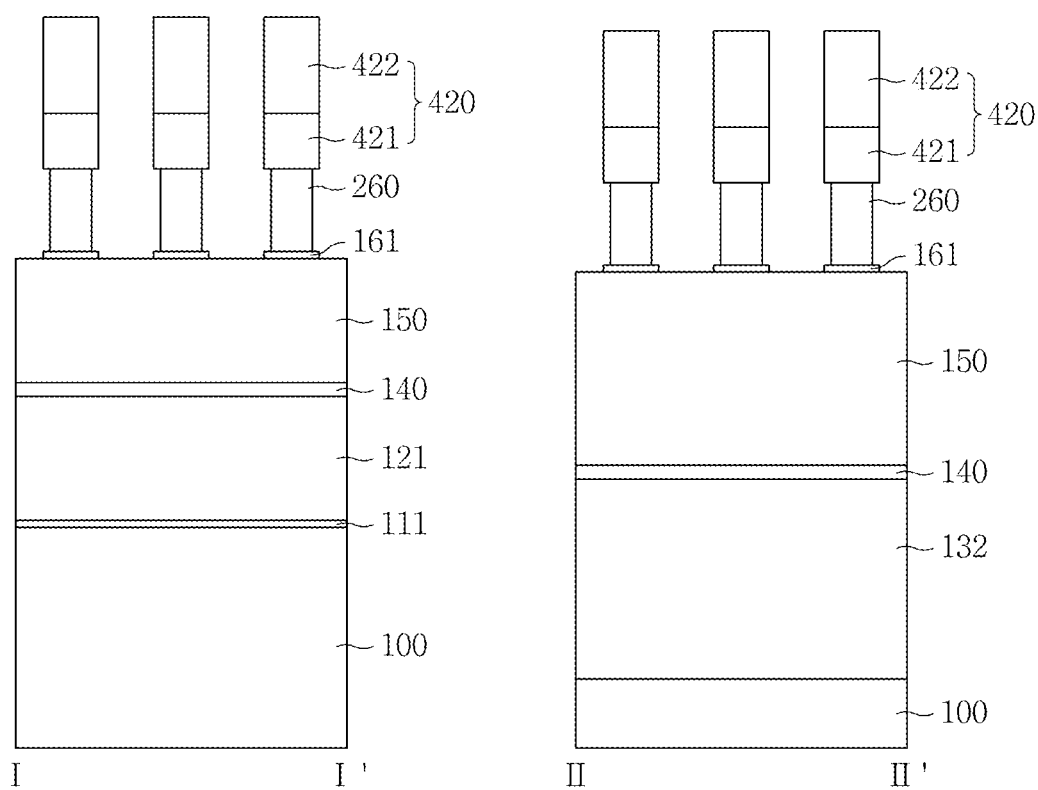
Figure 17B:
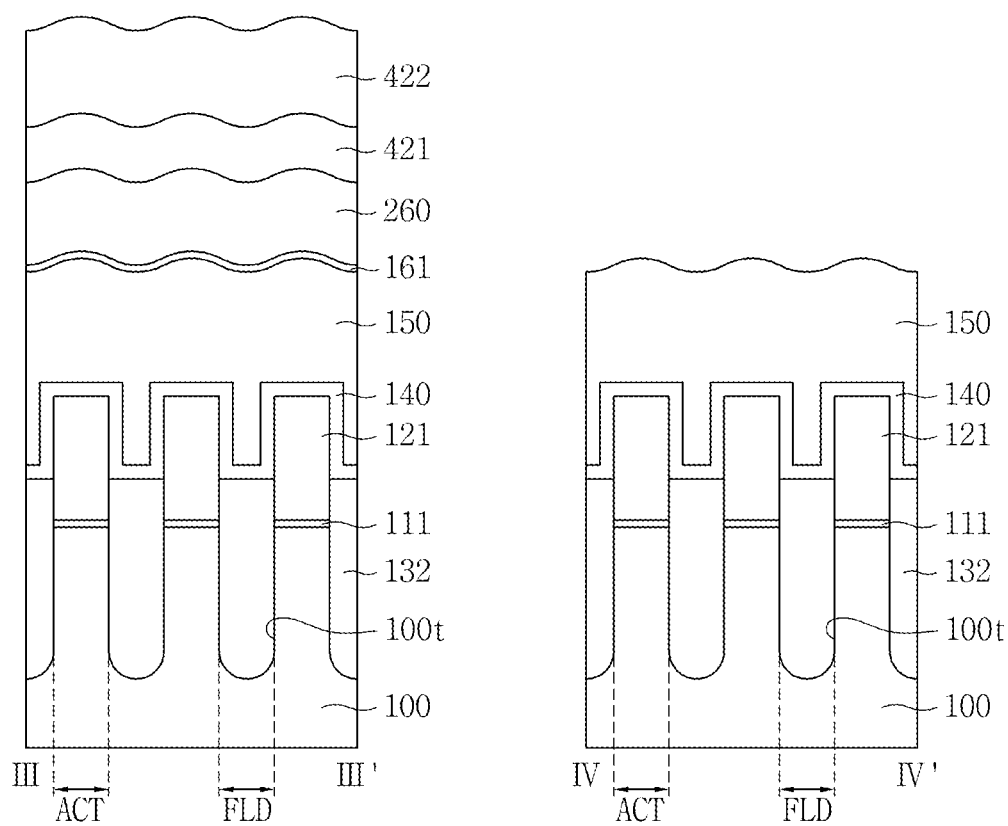

Referring to FIGS. 17A, 17B and 26, the method may include a process of forming metal gates 260 (S111). The process of forming the metal gates 260 may include a process of recessing side surfaces of the preliminary metal gates 171. The process of forming the metal gates 260 may include a process of partially removing the side surfaces of the preliminary metal gates 171. The process of partial removing the side surfaces of the preliminary metal gates 171 may be performed an isotropic wet etch process.

Figure 18A:
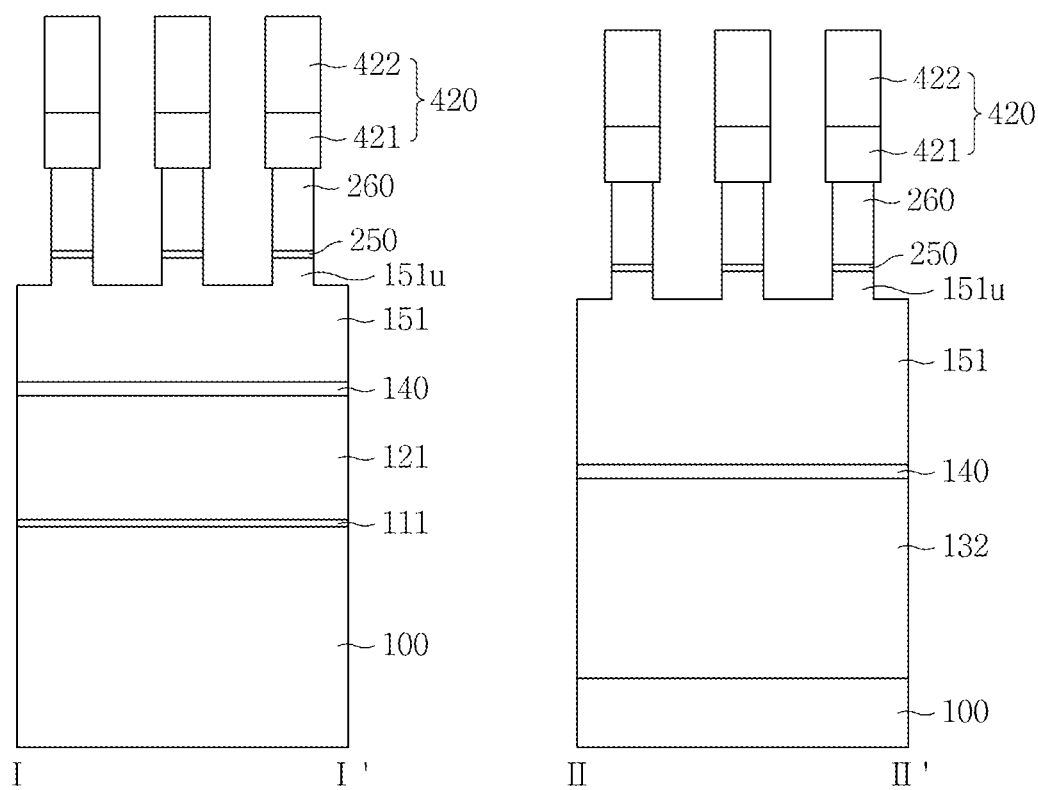
Figure 18B:
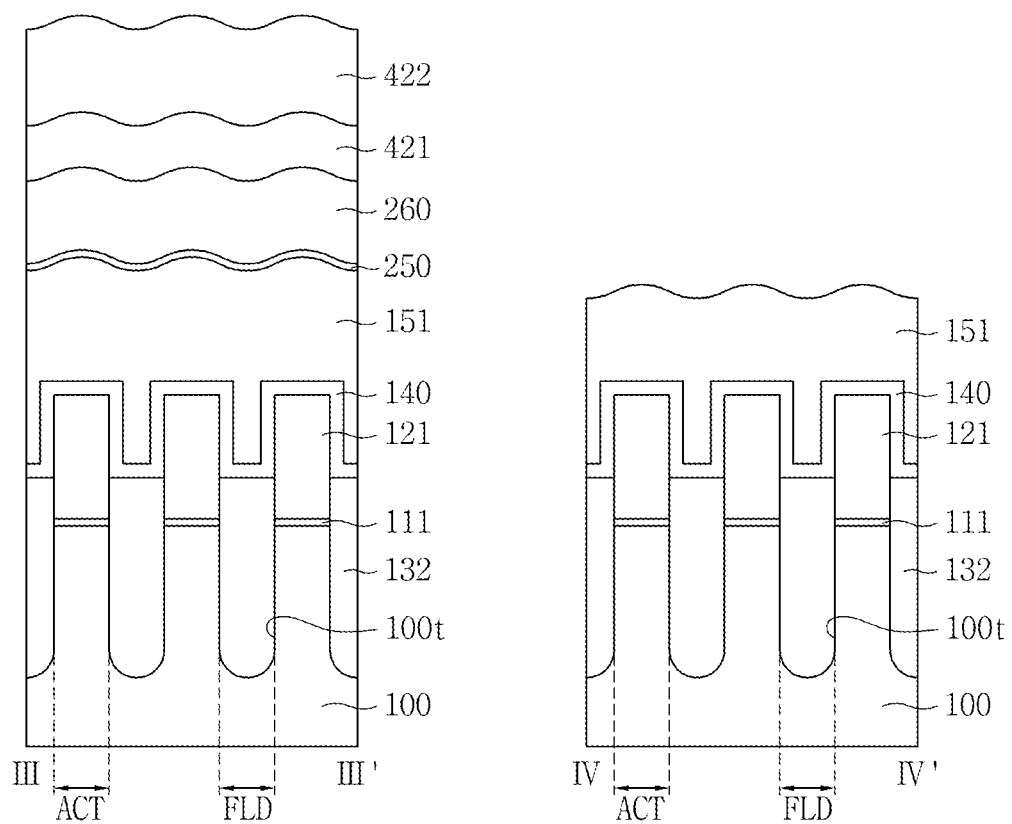

Referring to FIGS. 18A, 18B and 26, the method may include a process of forming metal silicide patterns 250 (S112). The process of forming the metal silicide patterns 250 may include a process of partially removing side surfaces of the preliminary metal silicide patterns 161. The process of forming the metal silicide patterns 250 may include a process of etching the preliminary metal silicide patterns 161 using the hard mask patterns 420 and the metal gates 260 as an etch mask. The process of forming the metal silicide patterns 250 may include an anisotropic dry etch process. Side surfaces of the metal silicide patterns 250 may be vertically aligned with side surfaces of the metal gates 260. The process of forming the metal silicide patterns 250 may include a process of forming a preliminary control gate 151. The process of forming the preliminary control gate 151 may include a process of recessing an upper portion of the control gate layer 150. The process of forming the preliminary control gate 151 may be sequentially performed together with the process of forming the metal silicide patterns 250. The preliminary control gate 151 may include a first region 151u, which is formed to be recessed by the process of forming the metal silicide patterns 250. Side surfaces of the first region 151u of the preliminary control gate 151 may be vertically aligned with the side surfaces of the metal silicide patterns 250.

Figure 19A:
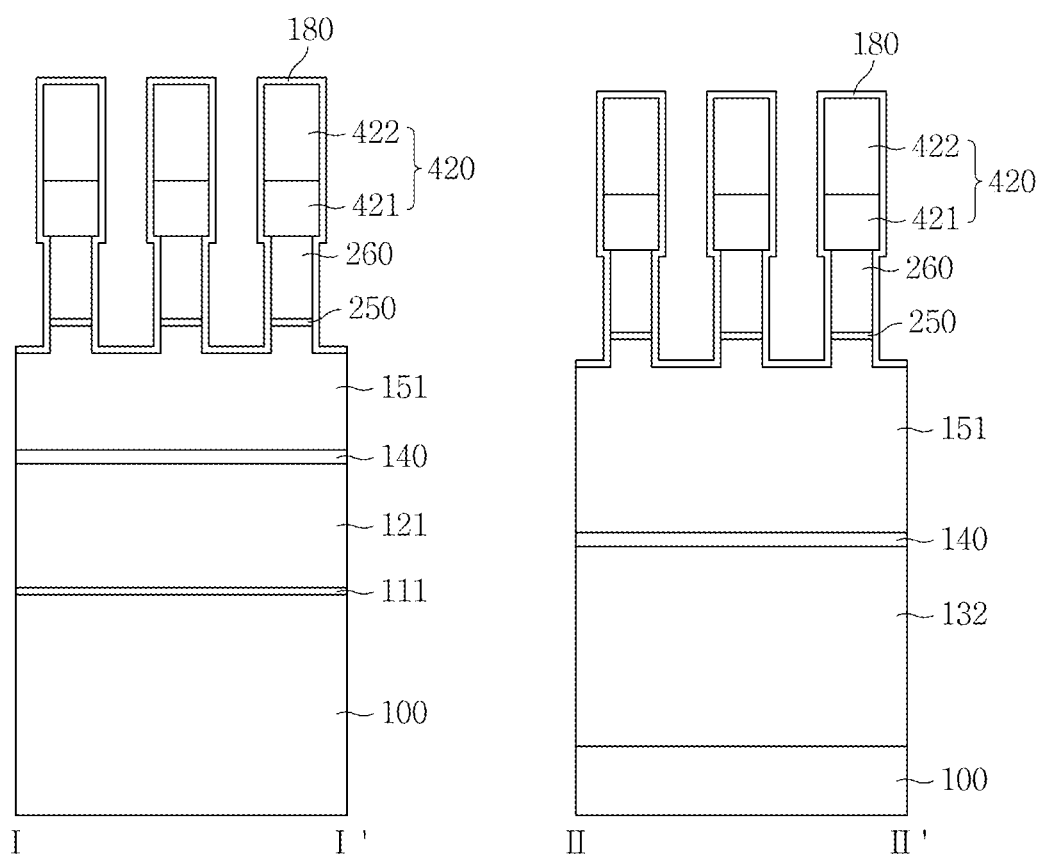
Figure 19B:
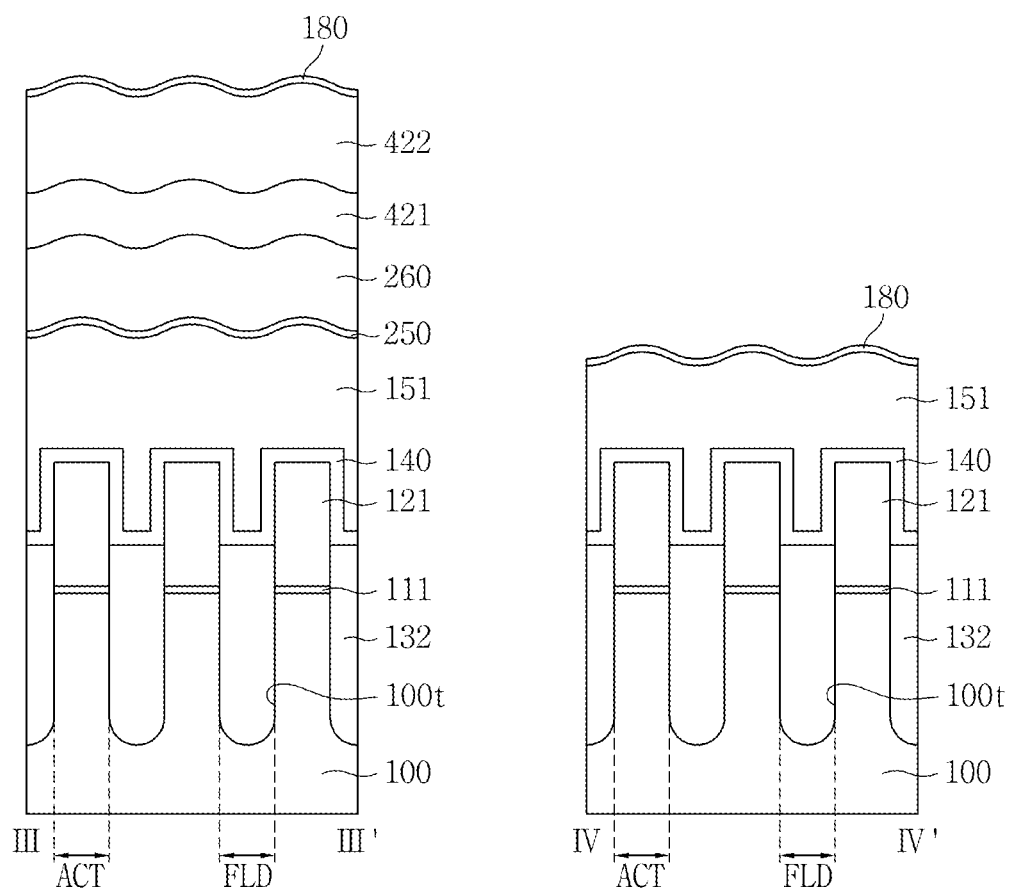

Referring to FIGS. 19A, 19B and 26, the method may include a process of forming a protective layer 180 on the substrate 100 (S113). The process of forming the protective layer 180 may include a CVD process or an ALD process. The protective layer 180 may conformally cover exposed surfaces of the preliminary control gate 151, the metal silicide patterns 250, the metal gates 260, and the hard mask patterns 420.

Figure 20A:
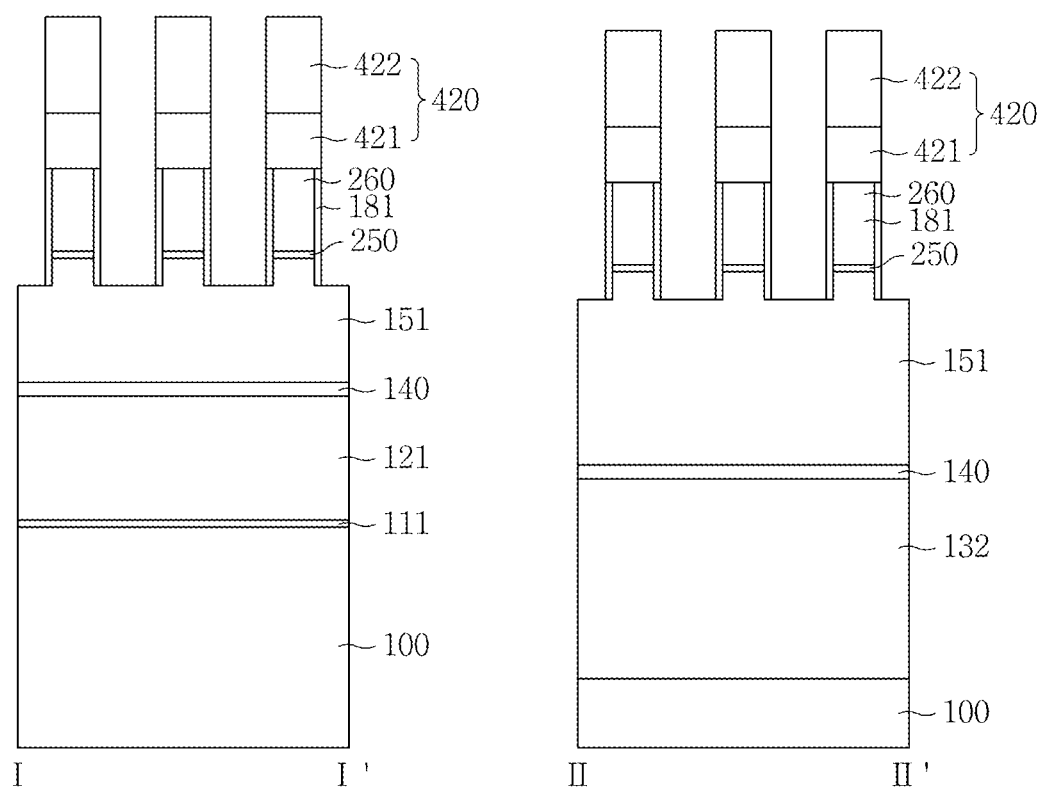
Figure 20B:
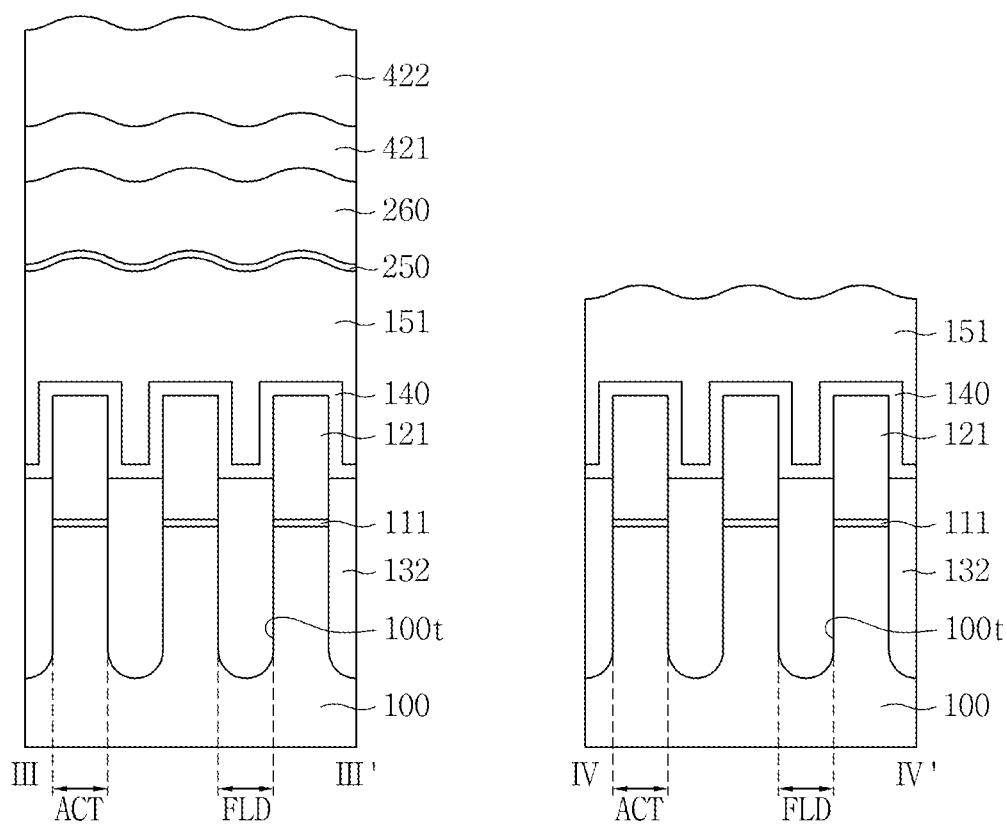

Referring to FIGS. 20A, 20B and 26, the method may include a process of forming protective patterns 181 on the side surfaces of the metal silicide patterns 250 and the metal gates 260 (S114). The process of forming the protective patterns 181 may include an anisotropic dry etch process. The protective patterns 181 may cover the recessed side surfaces of the preliminary control gate 151. Side surfaces of the protective patterns 181 may be vertically aligned with side surfaces of the hard mask patterns 420. The protective patterns 181 may prevent the generation of a byproduct from the metal gates 260 in a subsequent process.

Figure 21A:
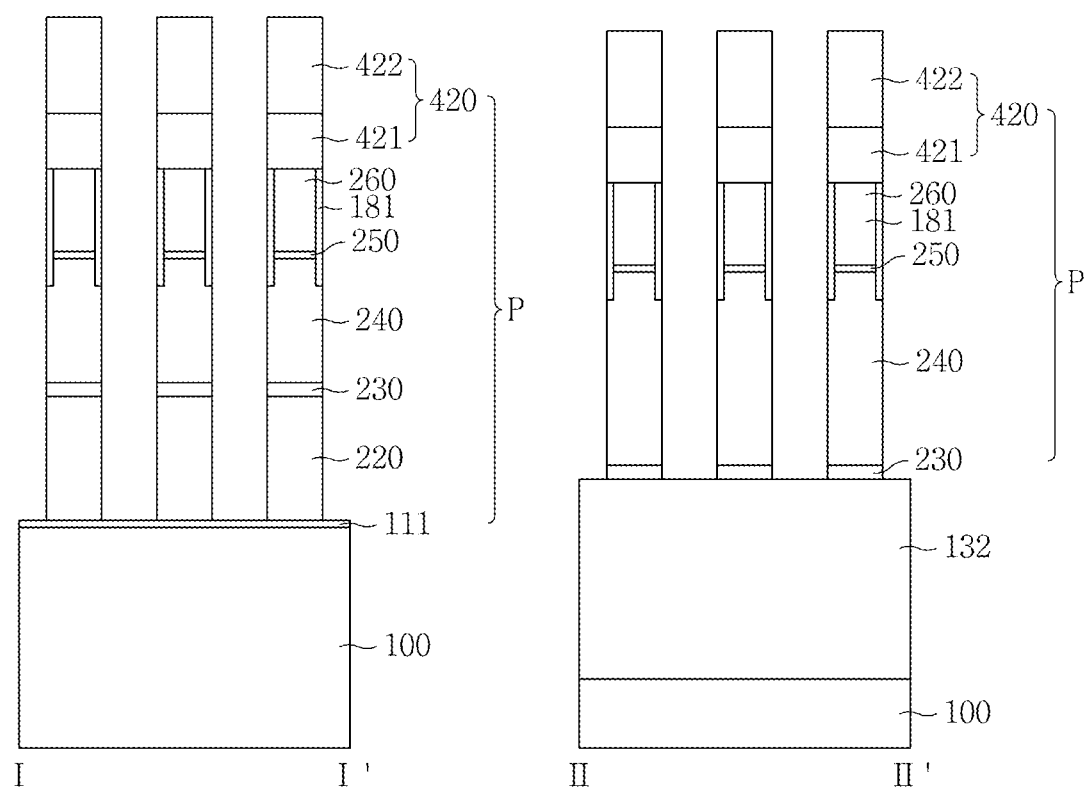
Figure 21B:
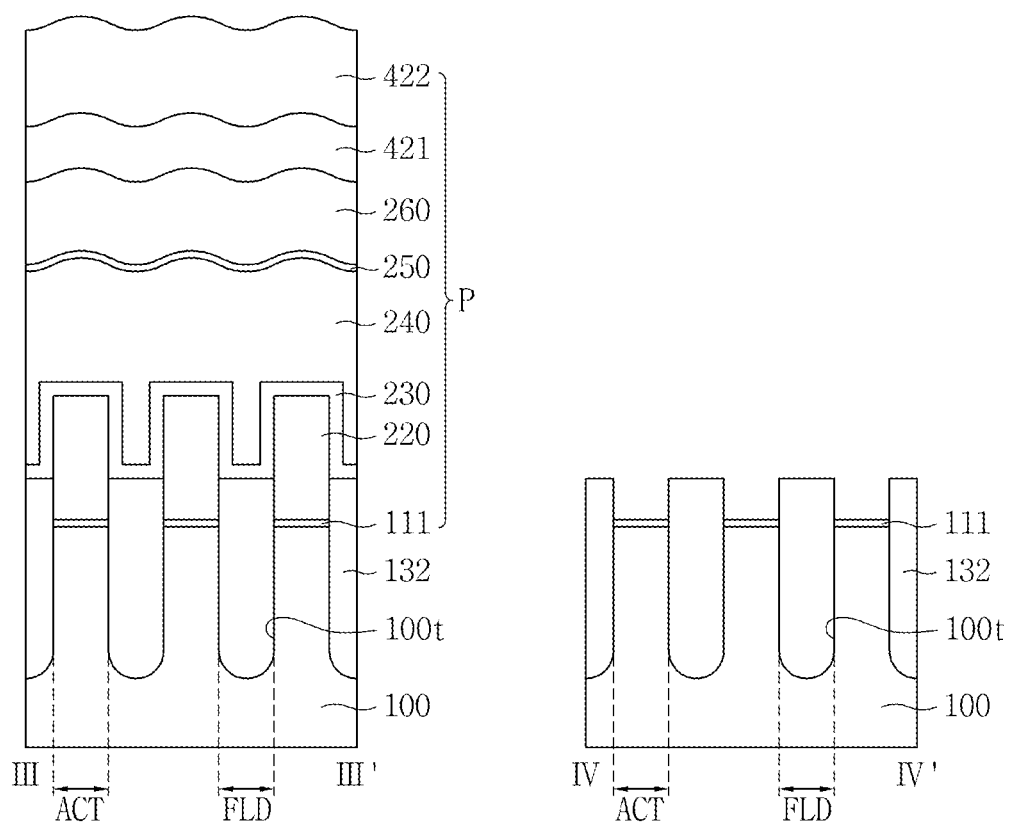

Referring to FIGS. 21A, 21B and 26, the method may include a process of forming preliminary gate structures P (S115). The process of forming the preliminary gate structures P may include a process of forming control gates 240, a process of forming inter-gate insulating patterns 230, and a process of forming floating gates 220. The process of forming the preliminary gate structures P may include an anisotropic dry etch process. The preliminary gate structures P may include the preliminary tunnel insulating patterns 111, the floating gates 220, the inter-gate insulating patterns 230, the control gates 240, the metal silicide patterns 250, the metal gates 260, the protective patterns 181, and the hard mask patterns 420. The process of forming the control gates 240 may include a process of etching the preliminary control gate 151 using the hard mask patterns 420 as an etch mask. The process of forming the inter-gate insulating patterns 230 may include a process of etching the inter-gate insulating layer 140 using the hard mask patterns 420 as an etch mask. The process of forming the floating gates 220 may include a process of etching the preliminary floating gates 121 using the hard mask patterns 420 as an etch mask.

Figure 22A:
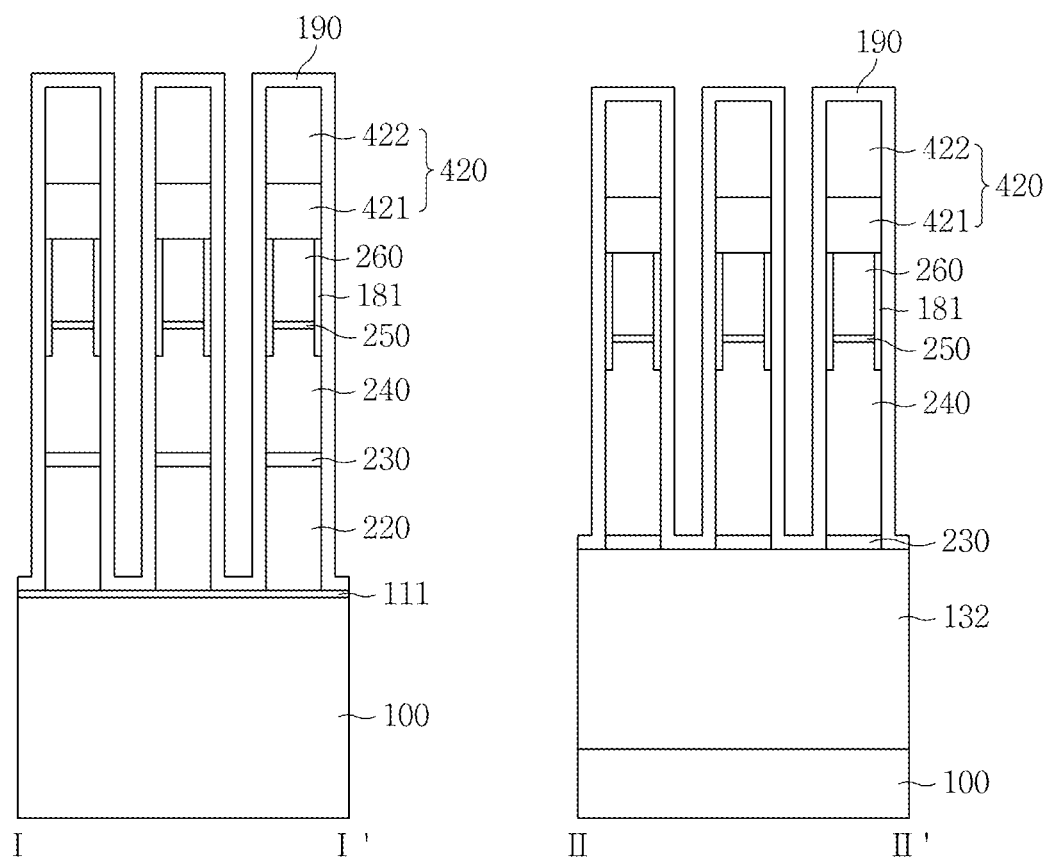
Figure 22B:
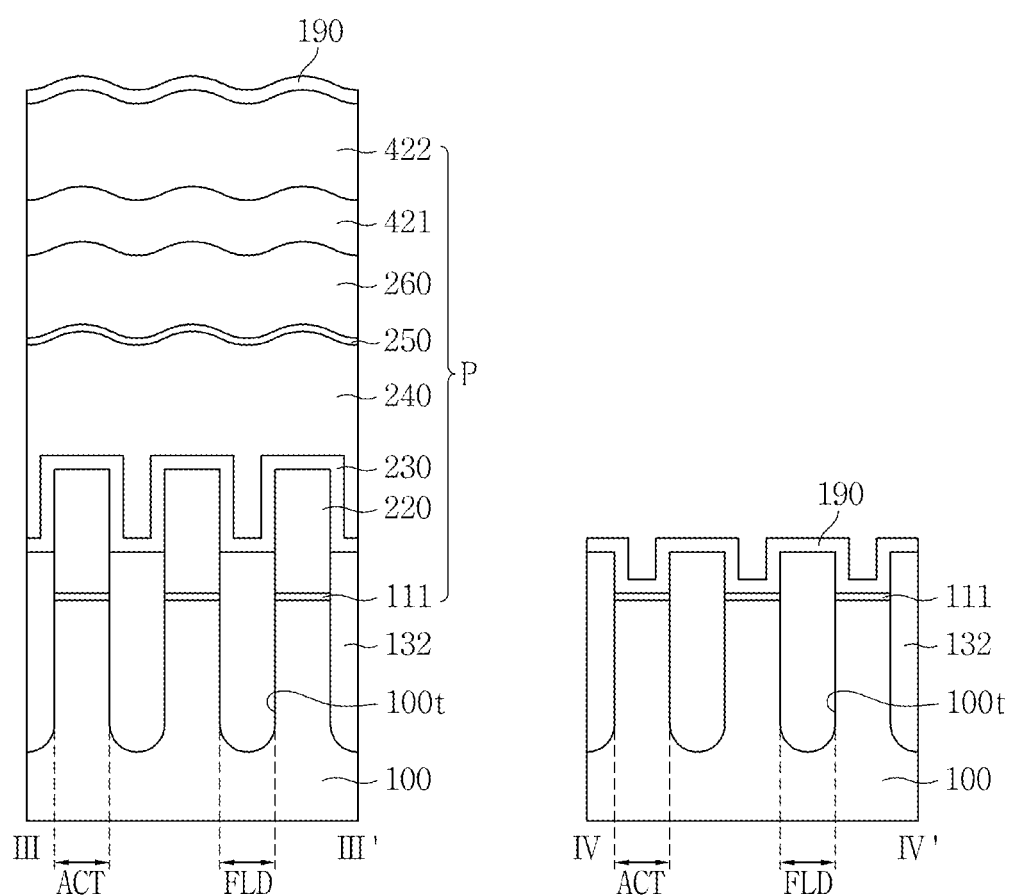

Referring to FIGS. 22A, 22B and 26, the method may include a process of forming a buffer layer 190 on the substrate 100 (S116). The process of forming the buffer layer 190 may include an ALD process. The buffer layer 190 may conformally cover surfaces of the preliminary gate structures P.

Figure 23A:
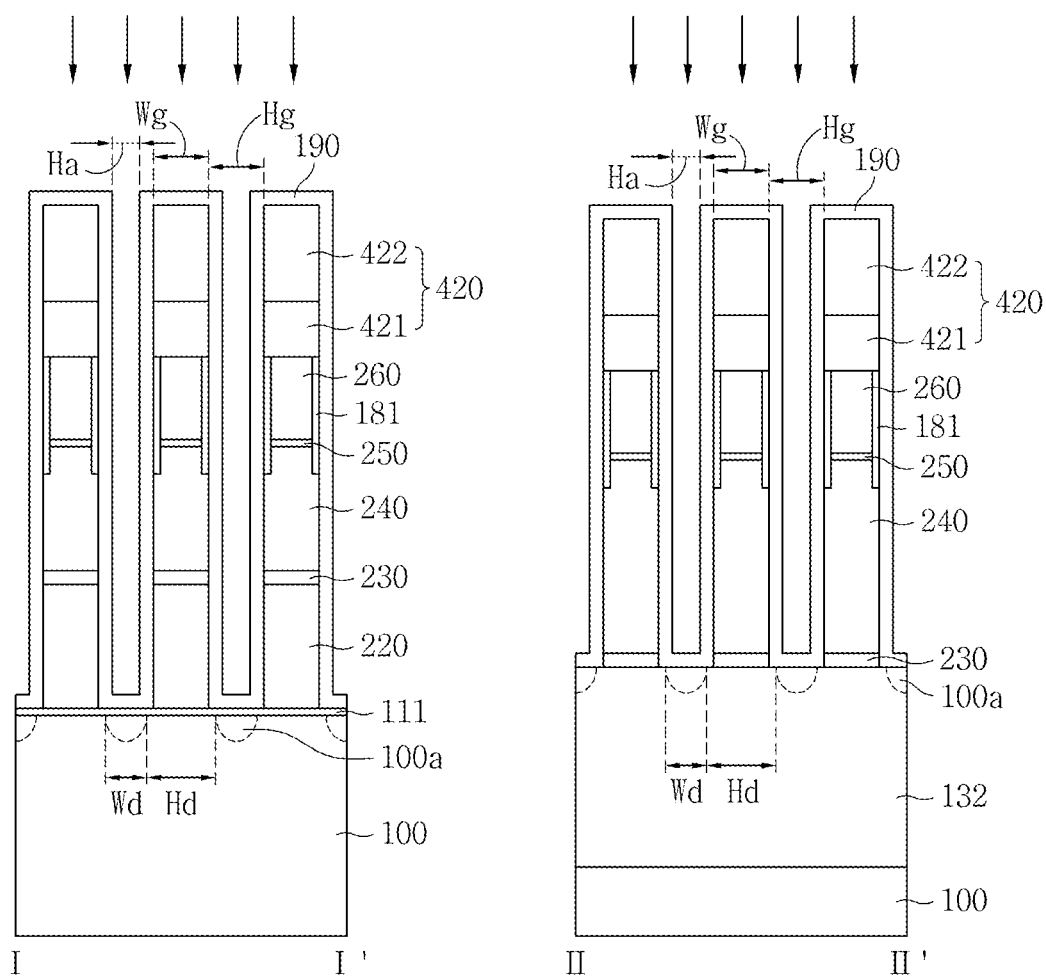
Figure 23B:
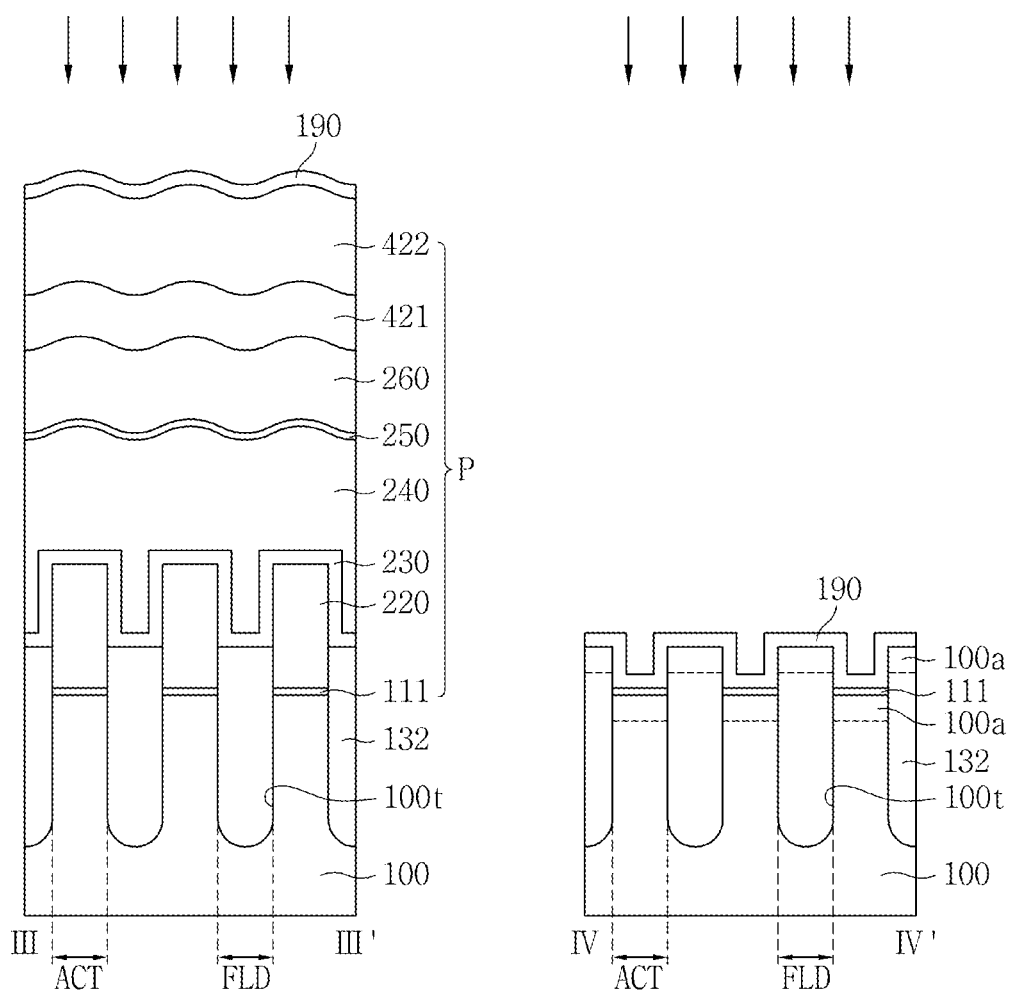

Referring to FIGS. 23A, 23B and 26, the method may include a process of forming impurity regions 100a in the substrate 100 (S117). The process of forming the impurity regions 100a may include a process of doping a dopant in the substrate 100. For example, the process of forming the impurity regions 100a may include a process of injecting an N-type dopant in the substrate 100. The process of injecting the N-type dopant may include an ion implantation process. The dopant may be diffused into the substrate 100. Accordingly, a maximum horizontal width Wd of the impurity regions 100a may be greater in size than a spacing Ha of the buffer layer 190 between the preliminary gate structures P. The maximum horizontal width Wd of the impurity regions 100a may be smaller than an inter-gate spacing distance Hg between the preliminary gate structures P. The impurity regions 100a may have an inter-impurity-region spacing distance Hd therebetween. The inter-impurity-region spacing distance Hd may be smaller than a gate horizontality width Wg of the preliminary gate structures P (Hd>Wg).

Figure 24A:
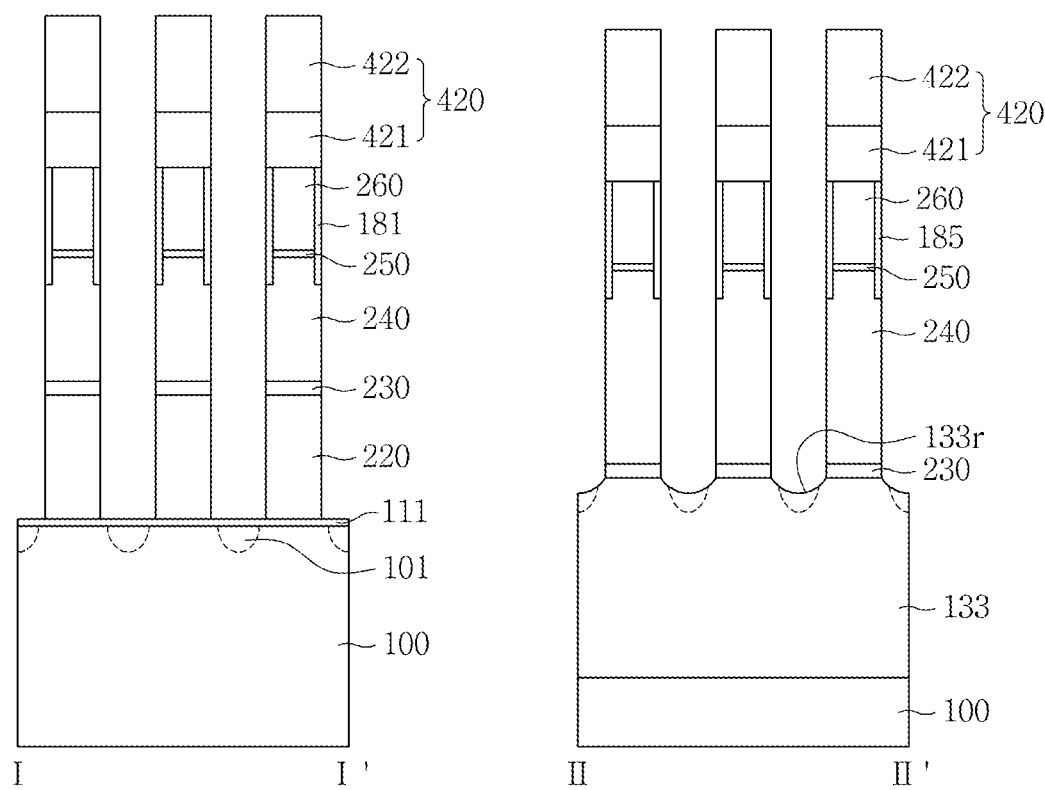
Figure 24B:
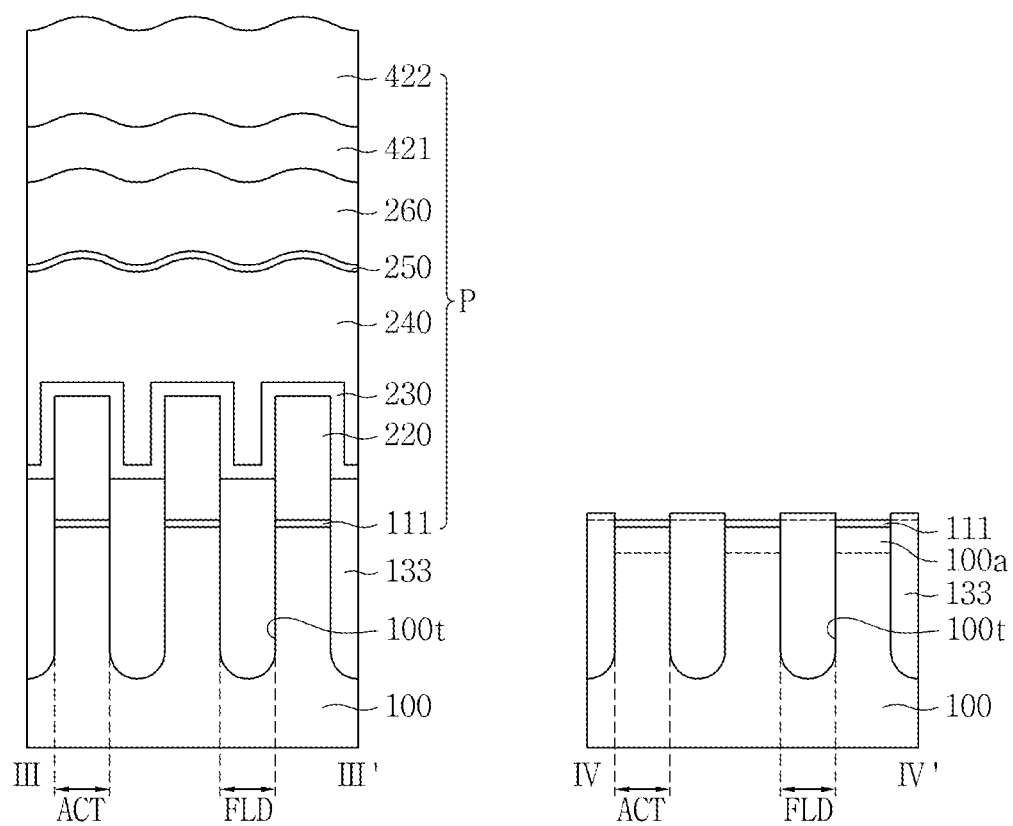

Referring to FIGS. 24A, 24B and 26, the method may include a process of removing the buffer layer 190 (S118). The process of removing the buffer layer 190 may include an isotropic wet etch process. The process of removing the buffer layer 190 may include a process of forming third preliminary field insulators 133. The process of forming the third preliminary field insulators 133 may include a process of forming first preliminary recess regions 133r. The process of forming the first preliminary recess regions 133r may include a process of recessing upper surfaces of the second preliminary field insulators 133, which are exposed by the preliminary gate structures P. The second preliminary field insulators 133 exposed by the preliminary gate structures P may be regions that have been physically/chemically damaged by the ion implantation process. The damaged regions of the second preliminary field insulators 132 may be etched more easily than the preliminary tunnel insulating patterns 111. The process of forming the first preliminary recess regions 133r may be sequentially performed together with the process of removing the buffer layer 190.

Figure 25A:
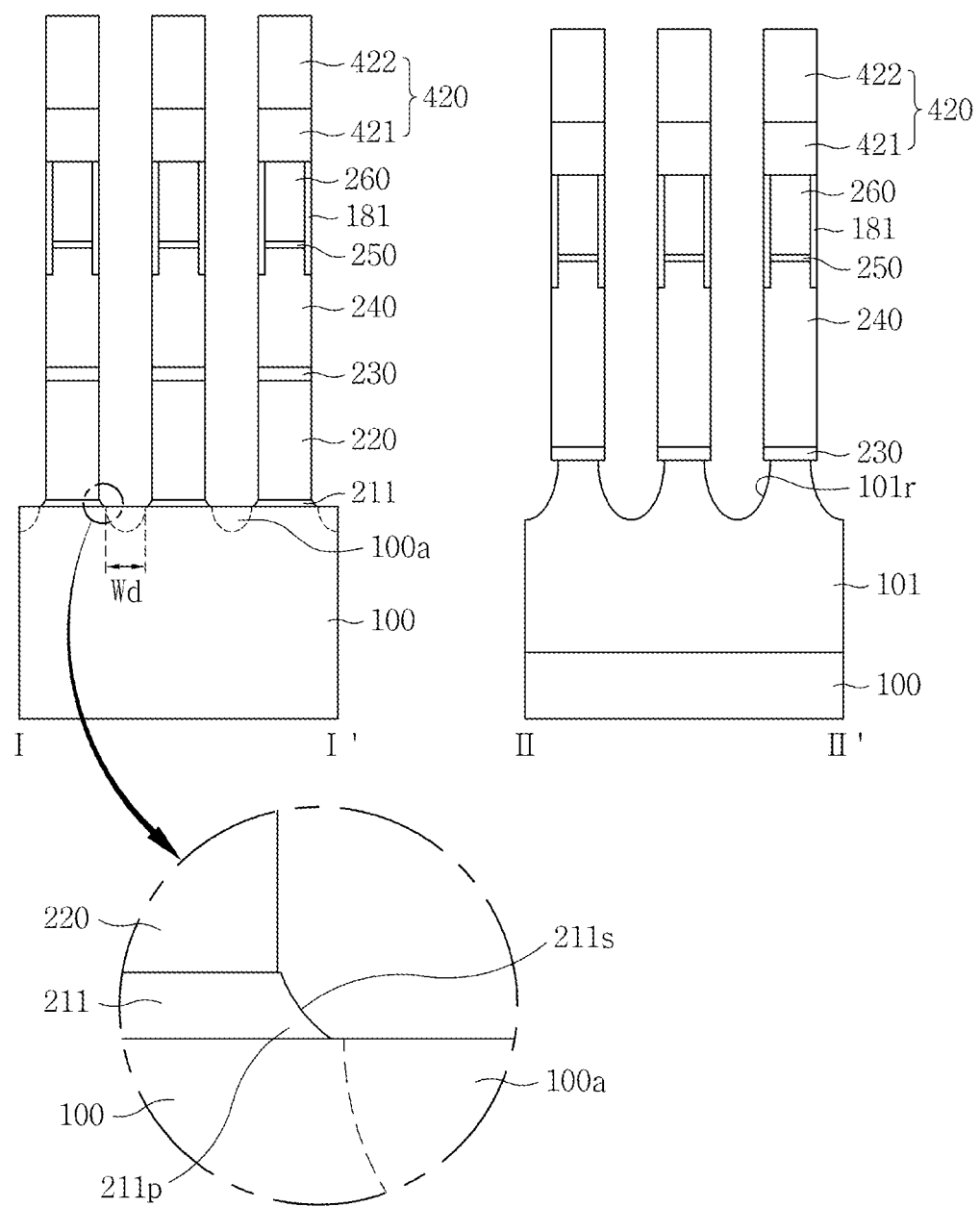
Figure 25B:
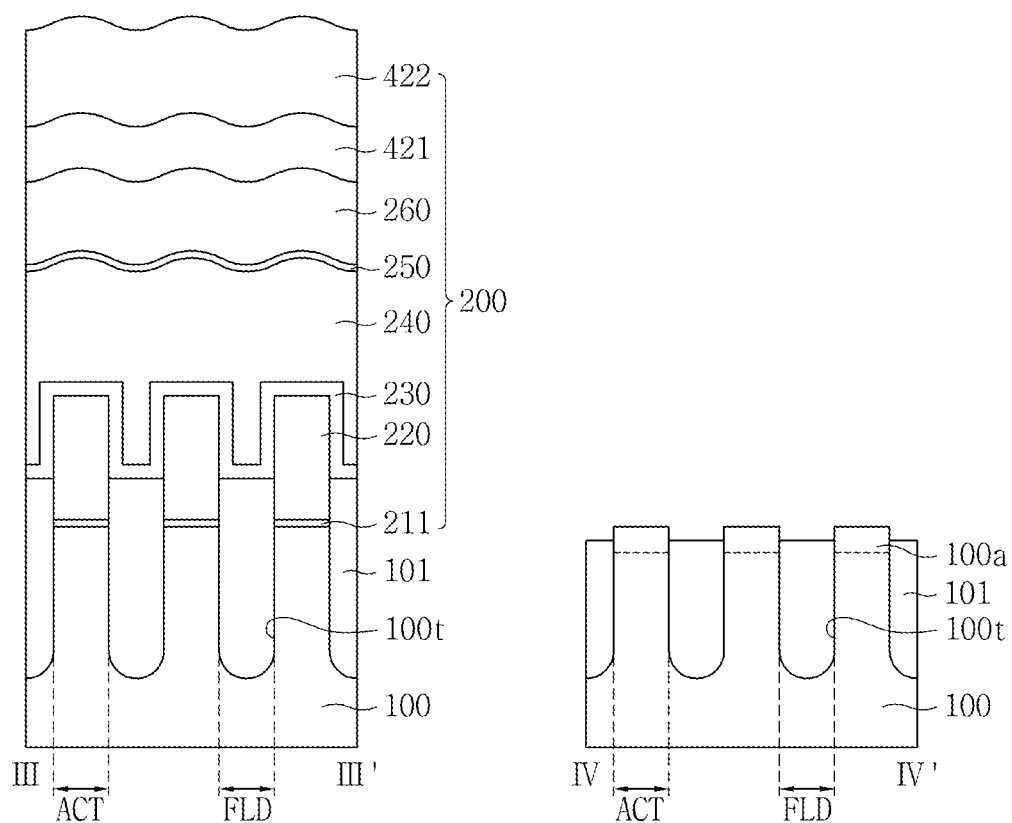
Figure 26:
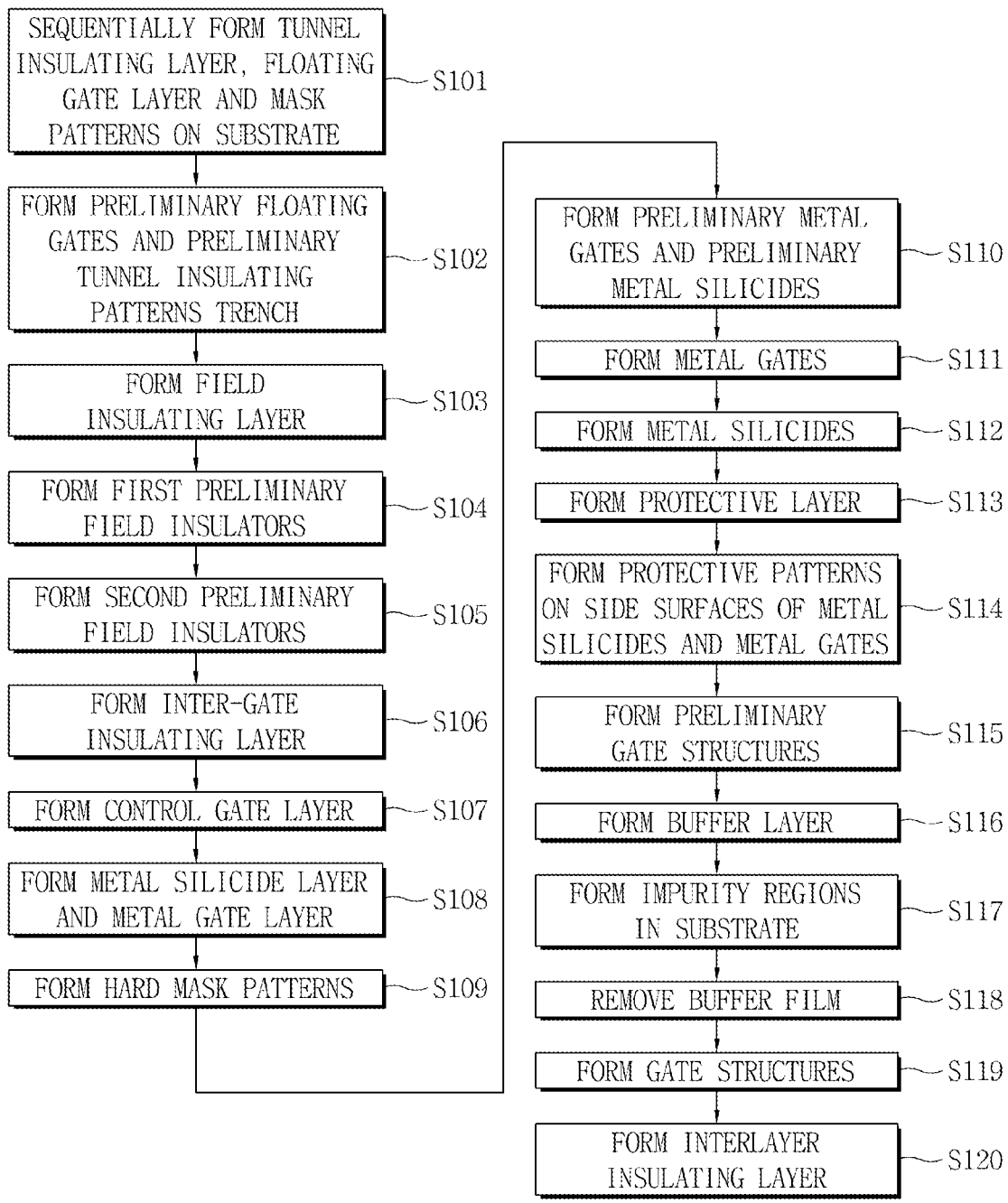
FIG. 26 illustrates a flow chart showing stages of a method of fabricating a semiconductor device according to the exemplary embodiment illustrated in FIGS. 2A and 2B.

Referring to FIGS. 25A, 25B and 26, the method may include a process of forming gate structures 200 (S119). The process of forming the gate structures 200 may include a process of forming tunnel insulating patterns 211. The process of forming the tunnel insulating patterns 211 may include a process of etching the preliminary tunnel insulating patterns 111 using the hard mask patterns 420 as an etch mask. The process of forming the tunnel insulating patterns 211 may include an isotropic wet etch process. The tunnel insulating patterns 211 may be formed to include protruded regions 211p. The protruded regions 211p may be protruded from side surfaces of the floating gates 220. The protruded regions 211p may include sloped surfaces 211s. End portions of the sloped surfaces 211s may be formed to be separated from end portions of the impurity regions 100a. The process of forming the gate structures 200 may include a process of forming field insulators 101. The process of forming the field insulators 101 may include a process of forming recess regions 101r. The process of forming the recess regions 101r may include a process of partially etching the third preliminary field insulators 133 exposed by the preliminary gate structures P. The third preliminary field insulators 133 exposed by the preliminary gate structures P may be the first preliminary recess regions 133r. The process of forming the recess regions 101r may include a process of etching the first preliminary recess regions 133r. The first preliminary recess regions 133r may be removed faster than the preliminary tunnel insulating patterns 111. A lowermost level of the recess regions 101r may be lower than a lowermost level of the impurity regions 100a. The lowermost level of the recess regions 101r may be lower than an upper surface of the active regions ACT. A maximum horizontal width Wr1 (see FIG. 2A) of the recess regions 101r may be greater than the maximum horizontal width Wd of the impurity regions 100a (Wr1>Wd). The maximum horizontal width of the recess regions 101r may be greater than the inter-gate spacing distance between the gate structures 200. The recess regions 101r may be formed to be partially overlapped with the gate structures 200 on the field region FLD. The process of forming the gate structures 200 may be sequentially performed together with the process of removing the buffer layer 190. The process of removing the buffer layer 190 and the process of forming the gate structures 200 may be a single process. That is, in the above method, FIGS. 24A and 24B may be cross-sectional views showing a middle stage performed by the single process.

Subsequently, referring to FIGS. 2A, 2B and 26, the method may include a process of forming the interlayer insulating layer 500 on the substrate 100 (S120). The process of forming the interlayer insulating layer 500 may include a CVD process. The CVD process may include an LPCVD process and a PECVD process. The process of forming the interlayer insulating layer 500 may include a process of forming air gaps 300 between the gate structures 200. The interlayer insulating layer 500 may be formed to be thick on corner regions of upper surfaces of the gate structures 200. The interlayer insulating layer 500 may connect the corner regions of the upper surfaces of the gate structures 200 to form the air gaps 300 between the gate structures 200. The air gaps 300 may be defined by the substrate 100, the gate structures 200, and the interlayer insulating layer 500.

FIGS. 27A to 30A and 27B to 30B illustrate cross-sectional views depicting stages of a method of fabricating a semiconductor device according to another exemplary embodiment. FIG. 31 is a flow chart illustrating a method of fabricating a semiconductor device according to this exemplary embodiment.

A method of fabricating a semiconductor device according to this exemplary embodiment will be described by referring to FIGS. 5A, 5B, 27A to 30A, 27B to 30B and 31.

Figure 27A:
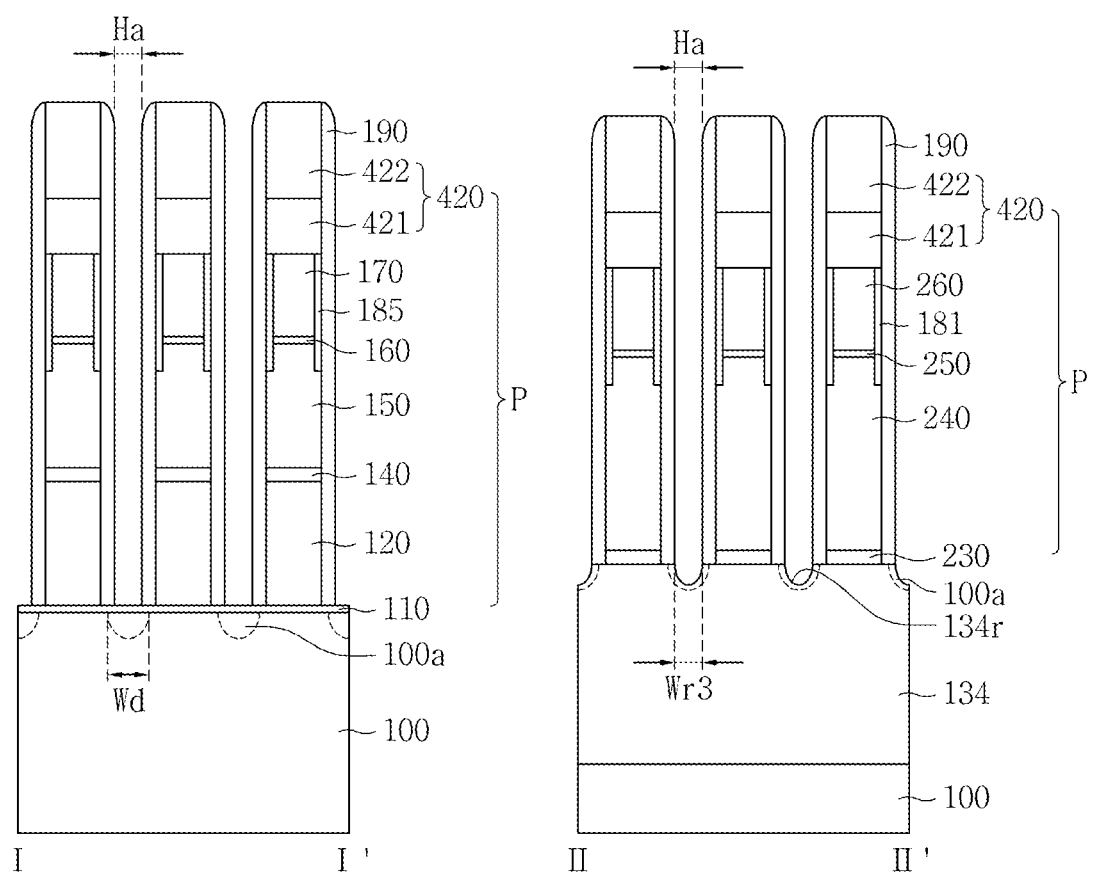
Figure 27B:
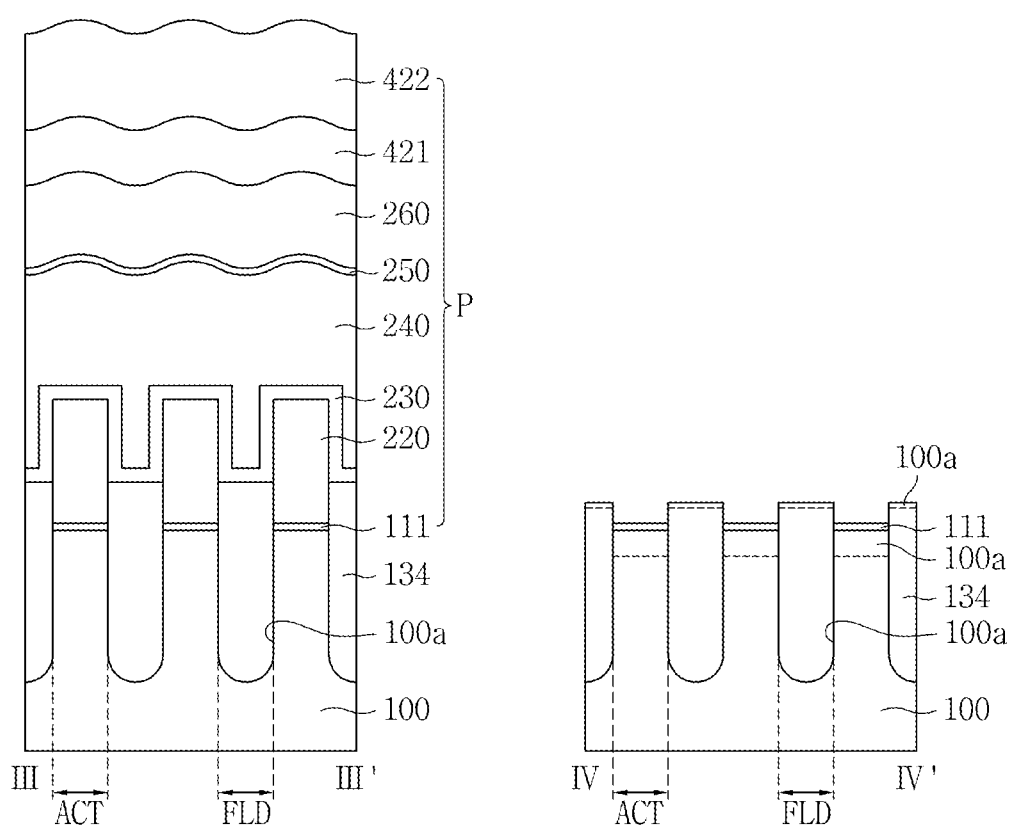

Referring to FIGS. 27A, 27B and 31, a method of fabricating a semiconductor device according to this exemplary embodiment may include a process of forming preliminary gate structures P on a substrate 100 which includes active regions ACT and a field region FLD (S201), a process of forming a buffer layer 190 that covers the preliminary gate structures P (S202) (refer, for example, to the buffer layer 190 illustrated in FIGS. 22A and 22B), and a process of forming impurity regions 100a in the substrate 100 (S203).

Next, the method may include a process of forming spacers 191 (S204). The process of forming the spacers 191 may include an anisotropic dry etch process to partially remove the buffer layer 190. The spacers 191 may expose upper surfaces of the preliminary gate structures P and cover side surfaces of the preliminary gate structures P. The process of forming the spacers 191 may include a process of forming a first preliminary field insulator 134. The process of forming the first preliminary field insulator 134 may include a process of forming first preliminary recess regions 134r. The process of forming the first preliminary recess regions 134r may include a process of recessing the field region FLD which is exposed by the spacers 191. The field region FLD exposed by the spacers 191 may be physically/chemically damaged regions by the ion implantation process. An upper portion of the field region FLD may be recessed by the process of forming the spacers 191. The process of forming the first preliminary recess regions 134r may be sequentially performed together with the process of forming the spacers 191. A lowermost level of the first preliminary recess regions 134r may be formed lower than a lowermost level of the impurity regions 100a. A maximum horizontal width Wr3 of the first preliminary recess regions 134r may be the same size as a spacing Ha of the buffer layer 190 between the preliminary gate structures P (Wr3=Ha). The maximum horizontal width Wr3 of the first preliminary recess regions 134r may be smaller than a maximum horizontal width Wd of the impurity regions 100a (Wr3<Wd).

Figure 28A:
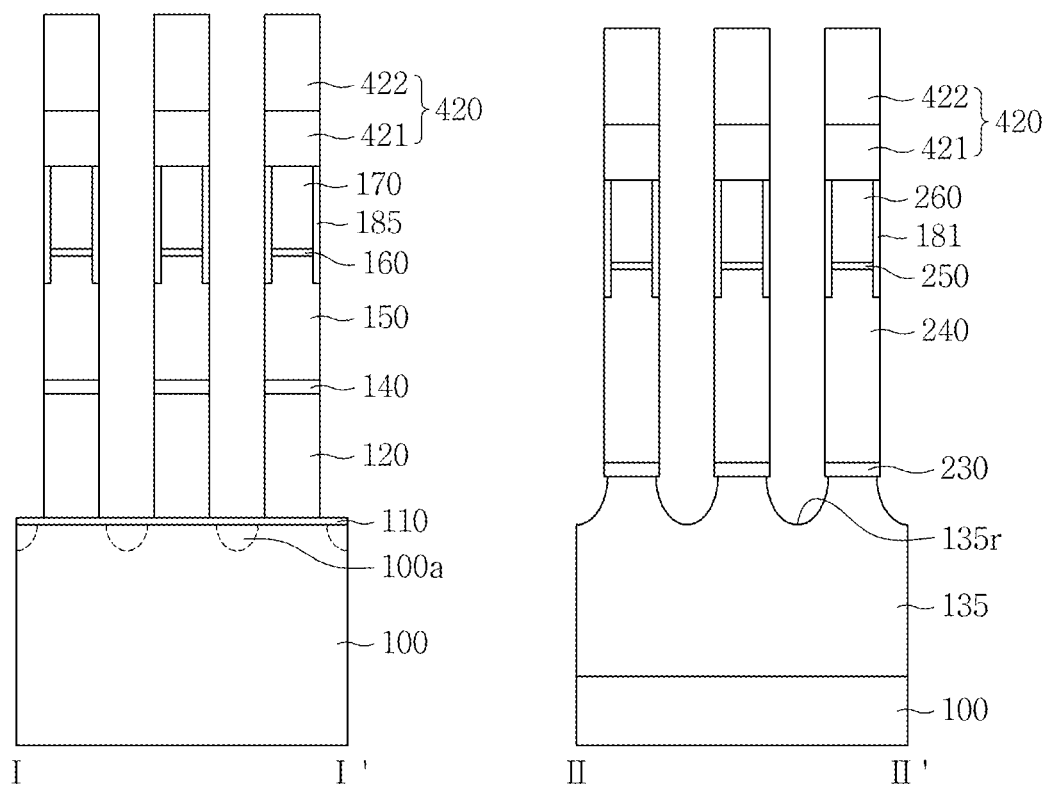
Figure 28B:
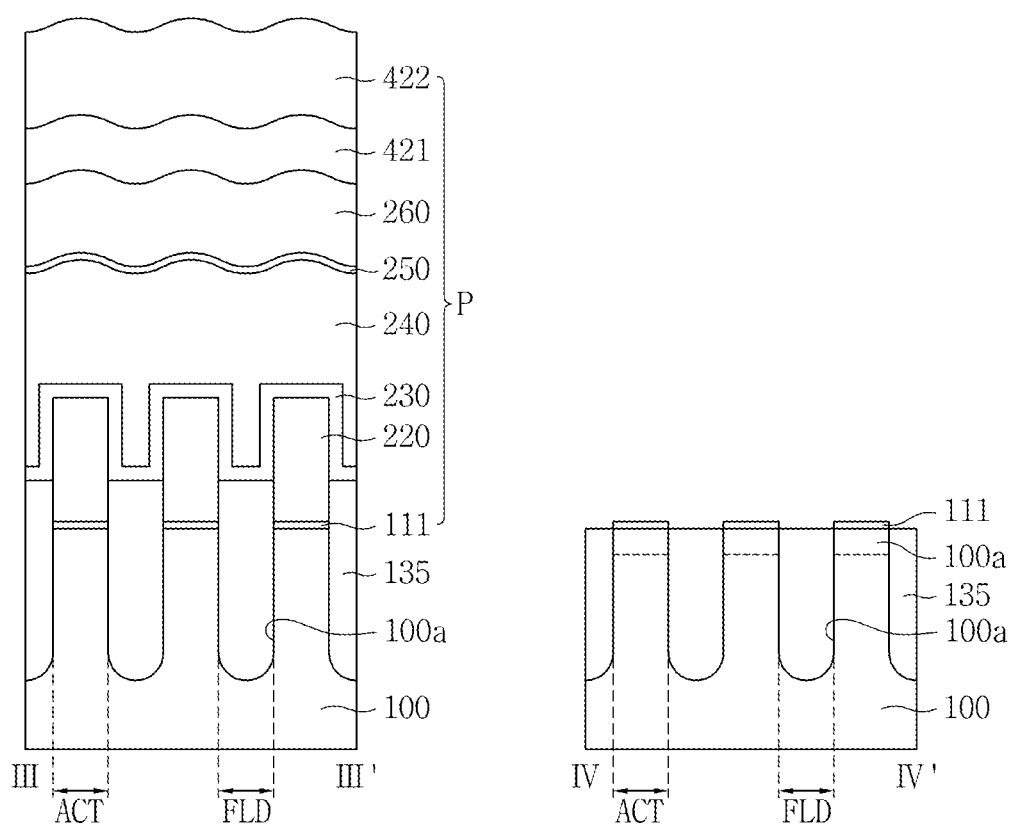

Referring to FIGS. 28A, 28B and 31, the method may include a process of removing the spacers 191 (S205). The process of removing the spacers 191 may include an isotropic wet etch process. The process of removing the spacers 191 may include a process of forming a second preliminary field insulator 135. The process of forming the second preliminary field insulator 135 may include a process of forming second preliminary recess regions 135r. The process of forming the second preliminary recess regions 135r may include a process of recessing the field region FLD which is exposed by the preliminary gate structures P. The field region FLD exposed by the preliminary gate structures P may be the first preliminary recess regions 134r of the first preliminary field insulator 134. The field region FLD exposed by the preliminary gate structures P may be recessed by the removal of the spacers 191. The process of forming the first preliminary recess regions 134r may be sequentially performed together with the process of removing the spacers 191. A lowermost level of the second preliminary recess regions 135r may be on the same level as an upper surface of the active regions ACT.

Figure 29A:
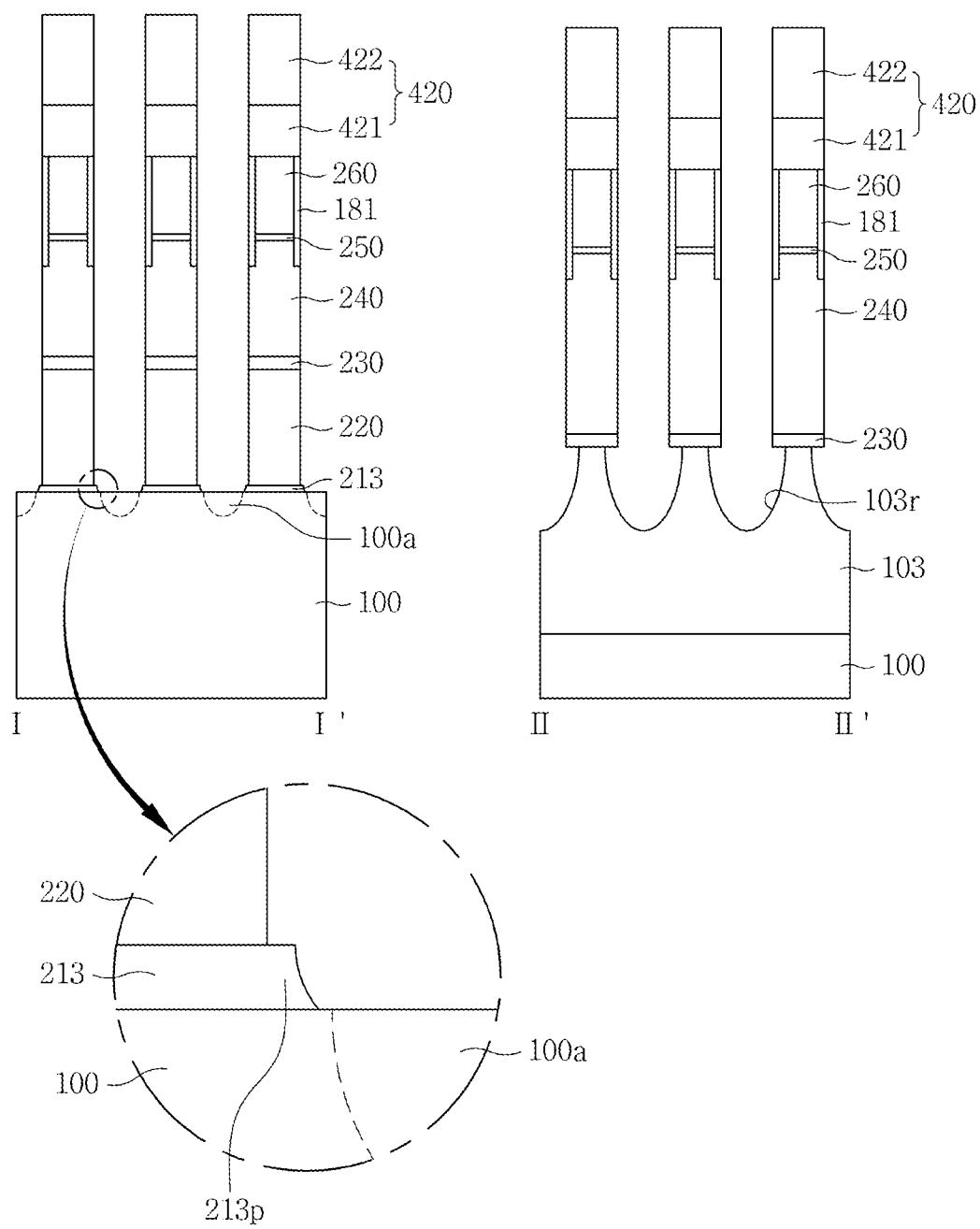
Figure 29B:
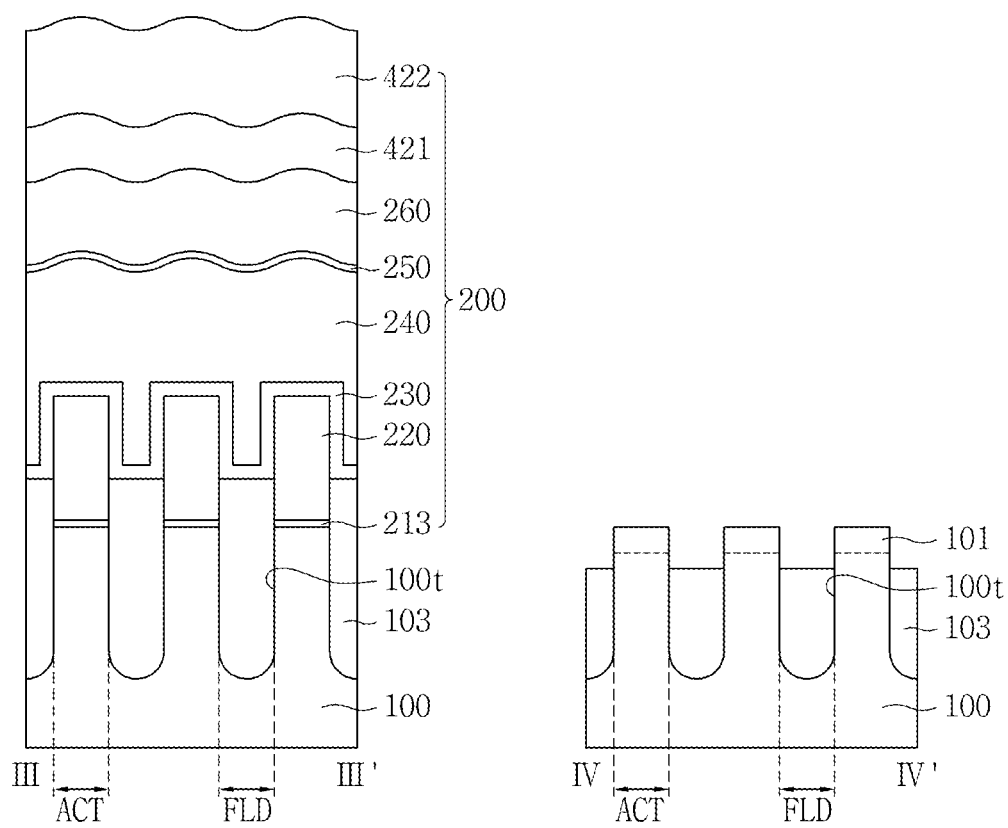

Referring to FIGS. 29A, 29B and 31, the method may include a process of forming gate structures 200 (S206). The process of forming the gate structures 200 may include a process of forming tunnel insulating patterns 213. The process of forming the tunnel insulating patterns 213 may include a process of etching the preliminary tunnel insulating patterns 111 using hard mask patterns 420 as an etch mask. The tunnel insulating patterns 213 may include protruded regions 213p. The process of forming the gate structures 200 may include forming a field insulator 103. The process of forming the field insulator 103 may include forming recess regions 103r. The process of forming the recess regions 103r may include etching the second preliminary field insulator 135 which is exposed by the preliminary gate structures P. The second preliminary field insulator 135 exposed by the preliminary gate structures P may be the second preliminary recess regions 135r. The process of forming the recess regions 103r may include etching the second preliminary recess regions 135r. The process of forming the gate structures 200 may be sequentially performed together with the removal of the spacers 191. The removal of the spacers 191 and the process of forming the gate structures 200 may be performed using a single process. That is, in the above method, the FIGS. 28A and 28B may be cross-sectional views showing a middle stage performed by the single process. After the removal of the spacers 191, the method may be performed to form an interlayer insulating layer 500.

Figure 30A:
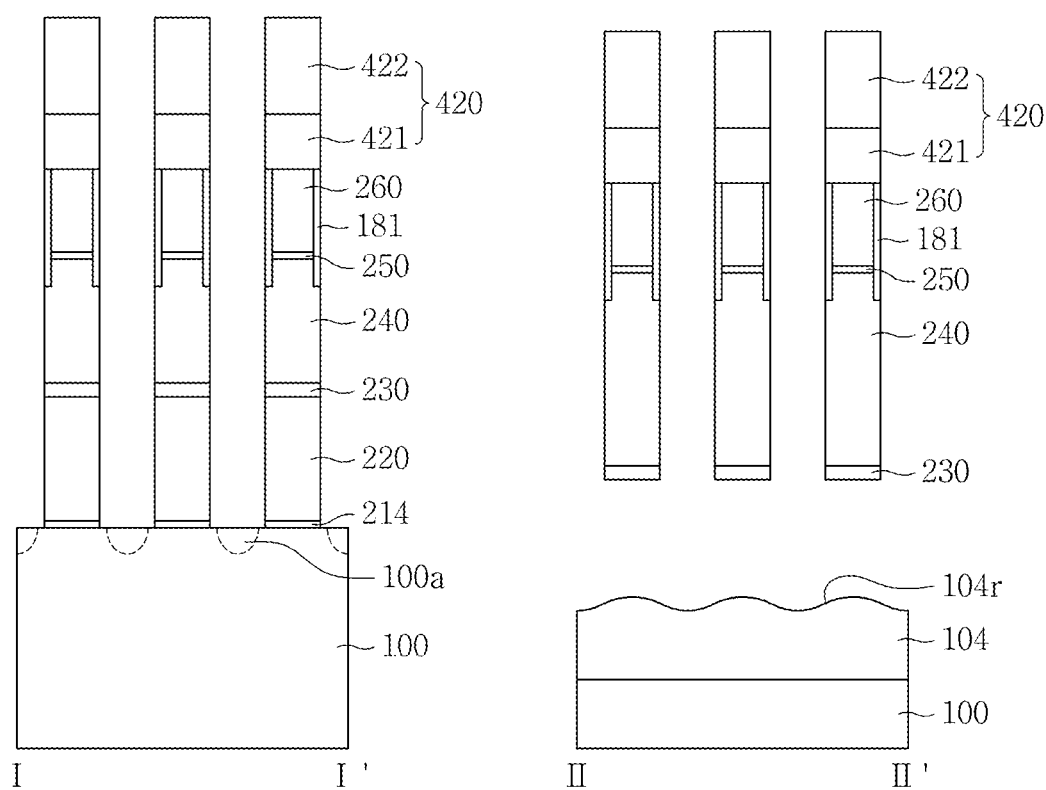
Figure 30B:
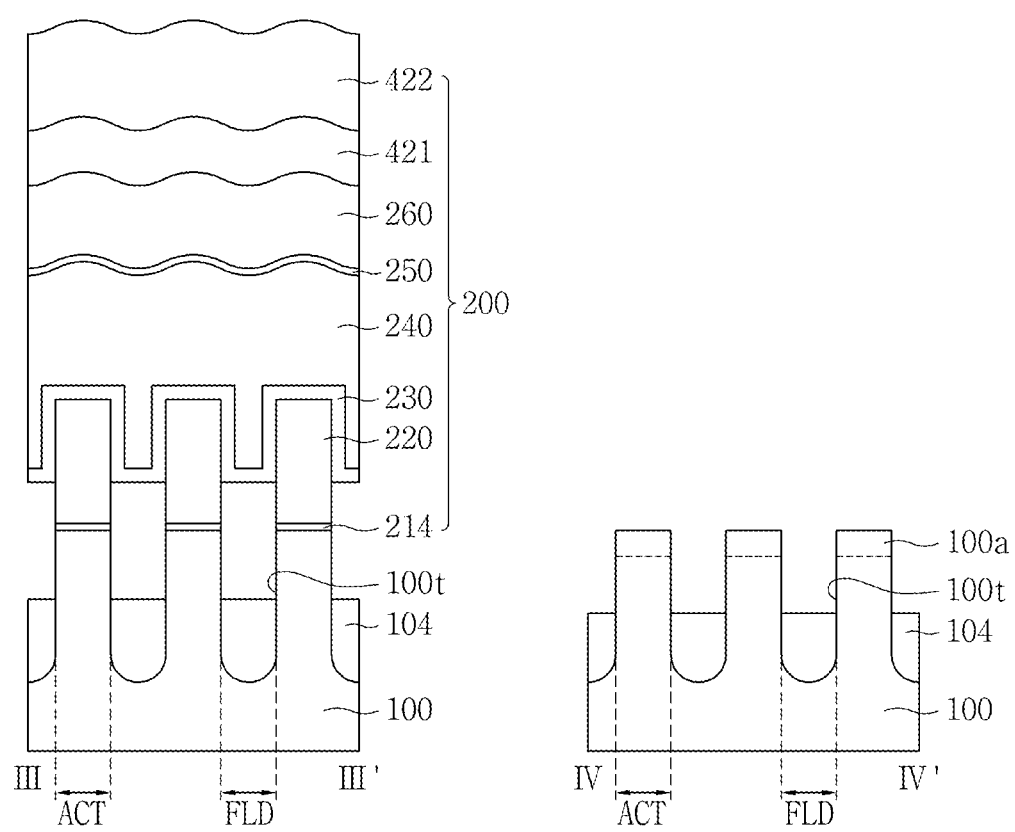
Figure 31:
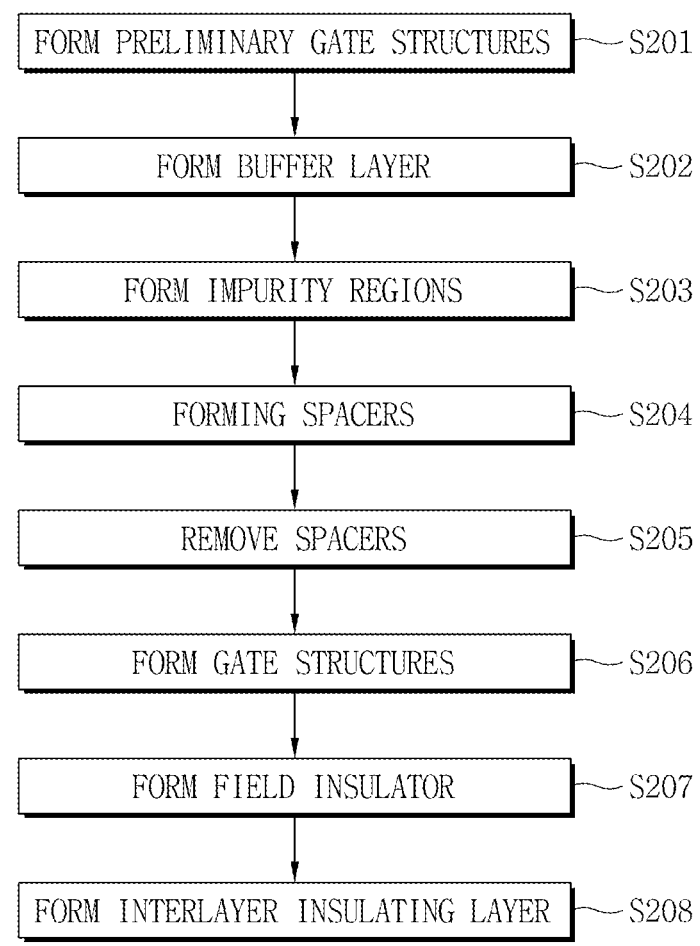
FIG. 31 illustrates a flow chart illustrating stages of a method of fabricating a semiconductor device according to the exemplary embodiment illustrated in FIGS. 27A to 30A and 27B to 30B.

Referring to FIGS. 30A, 30B and 31, the method may include forming a field insulator 104 (S207). The field insulator 104 may be formed to be spaced apart from the gate structures 200 on the field region FLD. The process of forming the field insulator 104 may include etching the field insulator 103. The process of etching the field insulator 103 may include an isotropic wet etch process. An uppermost level of the field insulator 104 may be lower than the upper surface of the active regions ACT. The uppermost level of the field insulator 104 may be lower than the lowermost level of the impurity regions 100a. The process of forming the field insulator 104 may include forming recess regions 104r. The process of forming the field insulator 104 may include forming tunnel insulating patterns 214. The process of forming the tunnel insulating patterns 214 may include a process of removing the protruded region 213p of the tunnel insulating patterns 213. The process of forming the field insulator 104 may be sequentially performed together with the process of forming the gate structures 200. The process of removing the spacers 191, the process of forming the gate structures 200, and the process of forming the field insulator 104 may be a single process. That is, in the above method, FIGS. 28A and 28B, and 29A and 29B may be cross-sectional views showing a middle stage performed by the single process.

Referring to FIGS. 5A, 5B and 31, the method may include a process of forming an interlayer insulating layer 500 (S208). The process of forming the interlayer insulating layer 500 may include a process of forming air gaps 300 between the gate structures 200. The air gaps 300 may be defined by the substrate 100, the gate structures 200, and the interlayer insulating layer 500.

FIGS. 32A, 32B, 33A and 33B illustrate cross-sectional views depicting a method of fabricating a semiconductor device according to another exemplary embodiment.

A method of fabricating a semiconductor device according to this exemplary embodiment will be described by referring to FIGS. 6A, 6B, 32A, 32B, 33A and 33B.

Figure 32A:
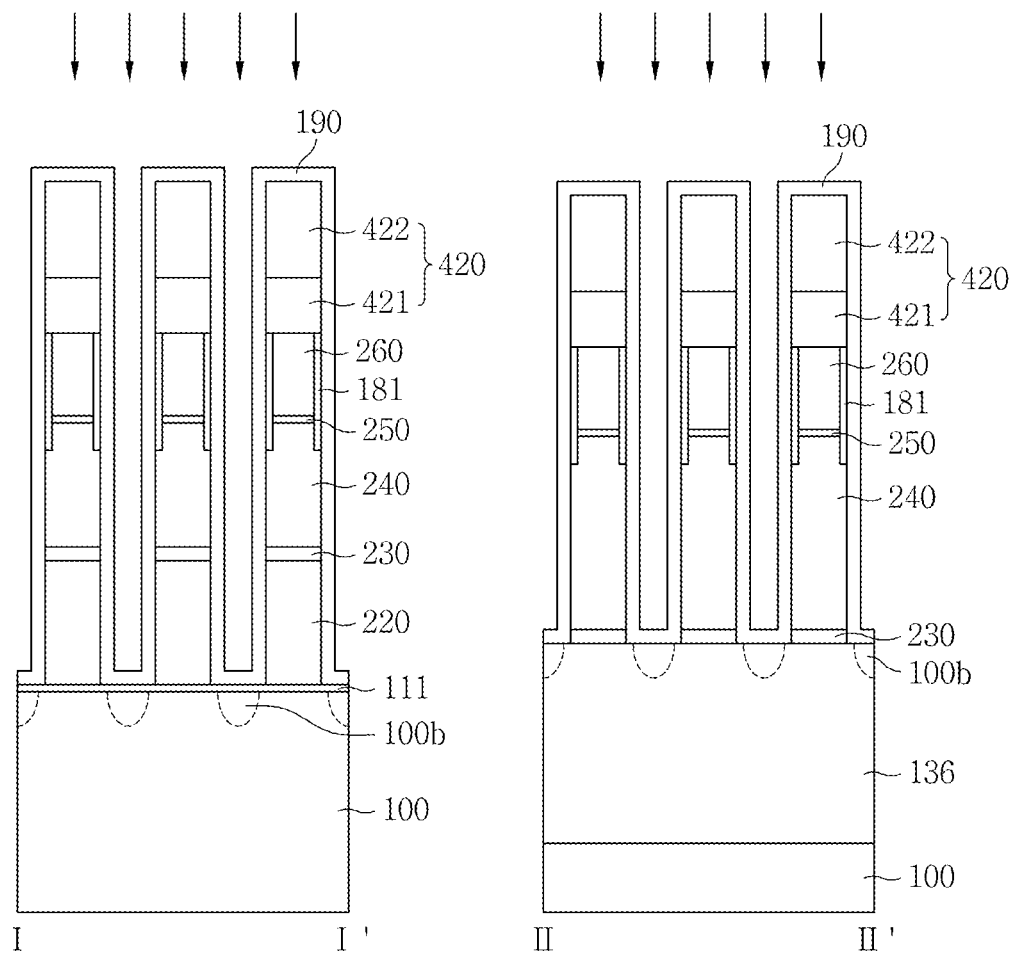
FIGS. 32A, 32B, 33A and 33B illustrate cross-sectional views sequentially showing stages a method of fabricating a semiconductor device according to another exemplary embodiment.
Figure 32B:
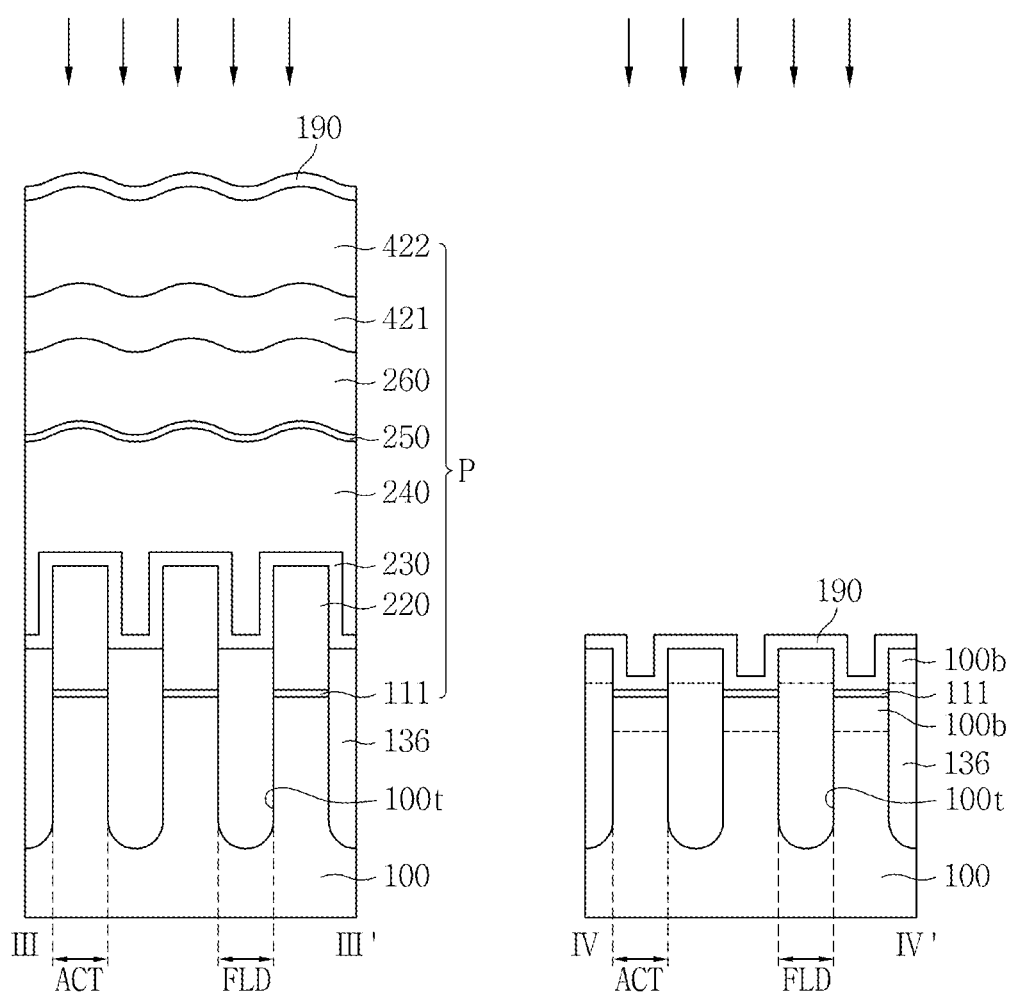

Firstly referring to FIGS. 32A and 32B, a method of fabricating a semiconductor device according to a third exemplary embodiment may include a process of defining active regions ACT and a field region FLD in a substrate 100, a process of forming preliminary gate structures P on the substrate 100, and a process of forming a buffer layer 190 which covers the preliminary gate structures P.

Next, the method may include a process of forming impurity regions 100b in the substrate 100. The process of forming the impurity regions 100b may include an ion implantation process to strongly dope a dopant in the substrate 100. The process of forming the impurity regions 100b may include a process of forming a preliminary field insulator 136. The preliminary field insulator 136 may include the impurity regions 100b between the preliminary gate structures P.

Figure 33A:
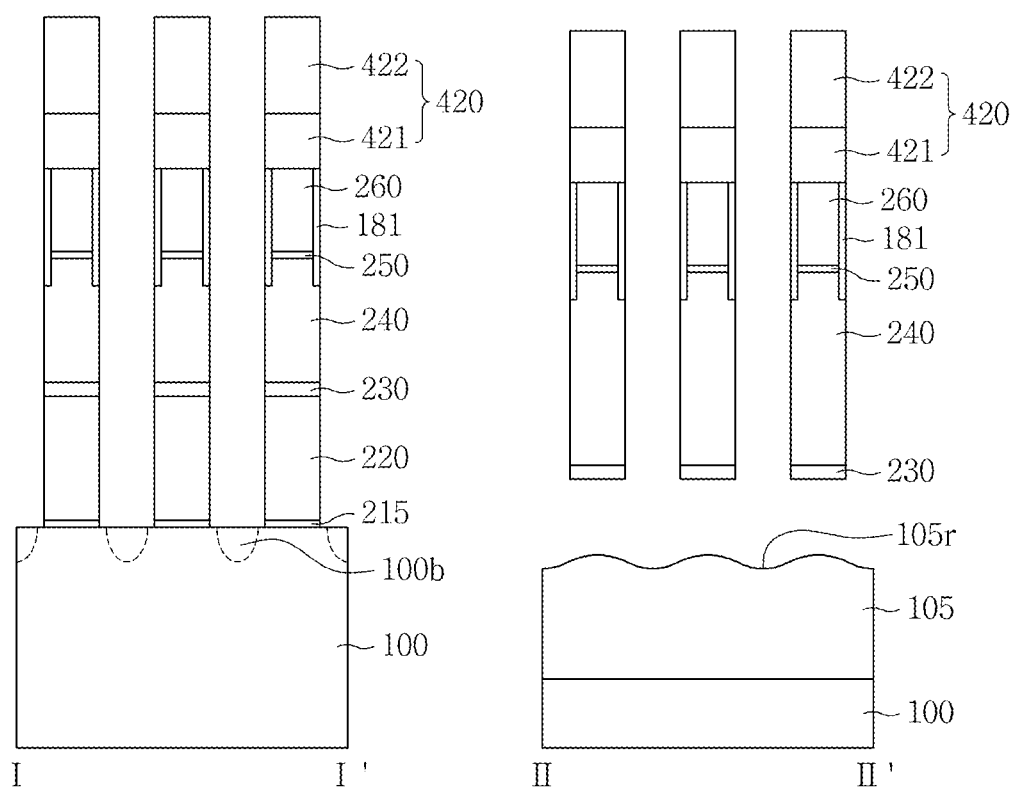
Figure 33B:
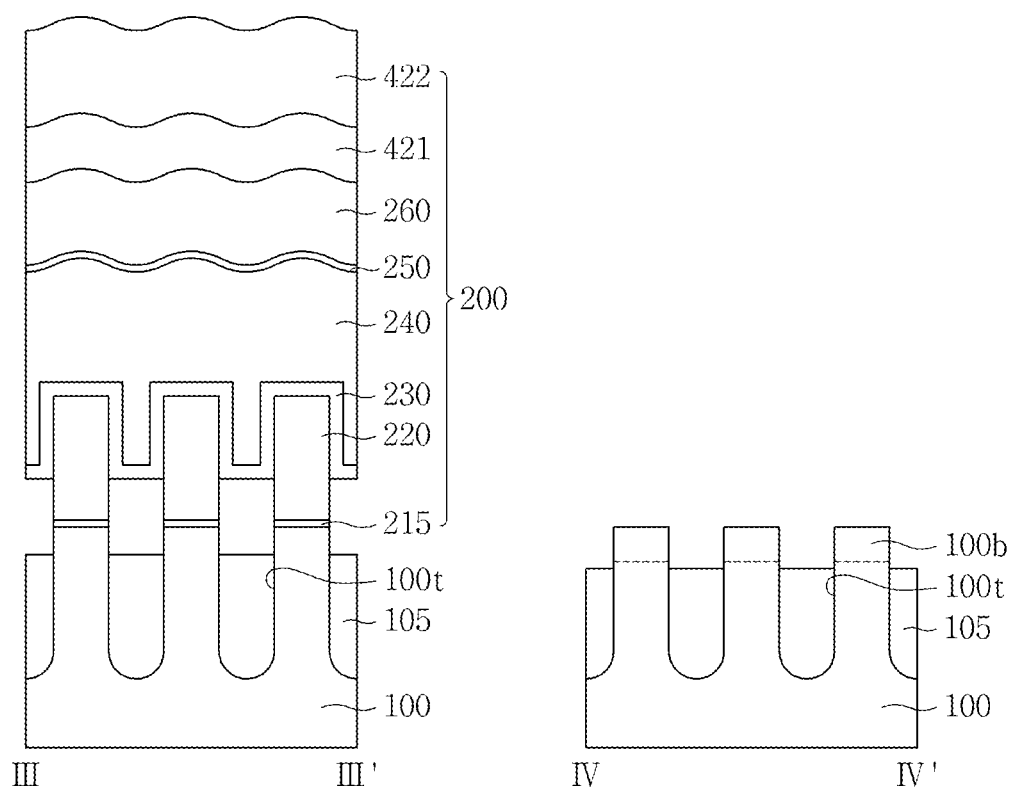

Firstly referring to FIGS. 33A and 33B, the method may include a process of forming a field insulator 105. The process of forming the field insulator 105 may include a process of removing the buffer layer 190. The process of forming the field insulator 105 may include a process of etching the preliminary field insulator 136. The process of etching the preliminary field insulator 136 may include an isotropic wet etch process. The field insulator 105 may be formed to be spaced apart from gate structures 200 on the field region FLD. A lowermost level of the field insulator 105 may be disposed between a lowermost level of the impurity regions 100b, and an upper surface of the active regions ACT. The process of forming the field insulator 105 may include a process of forming recess regions 105r. A lowermost level of the recess regions 105r may be lower than the lowermost level of the impurity regions 100b. The lowermost level of the impurity regions 100b may be disposed between the lowermost level of the recess regions 105r, and an uppermost level of the field insulator 105. The process of forming the field insulator 105 may include forming tunnel insulating patterns 215. The process of forming the tunnel insulating patterns 215 may include an isotropic wet etch process. Preliminary tunnel insulating patterns 111 of FIGS. 32A and 32B may be slightly damaged by the strongly doped dopant during the process of forming the impurity regions 100b. The preliminary tunnel insulating patterns 111 may be removed more easily between the preliminary gate structures P than under the preliminary gate structures P. The process of forming the tunnel insulating patterns 215 may be sequentially performed together with the process of forming the field insulator 105.

Referring to FIGS. 6A and 6B, the method may include a process of forming an interlayer insulating layer 500 on the gate structures 200. The process of forming the interlayer insulating layer 500 may include a process of forming air gaps between the gate structures 200.

Figure 34:
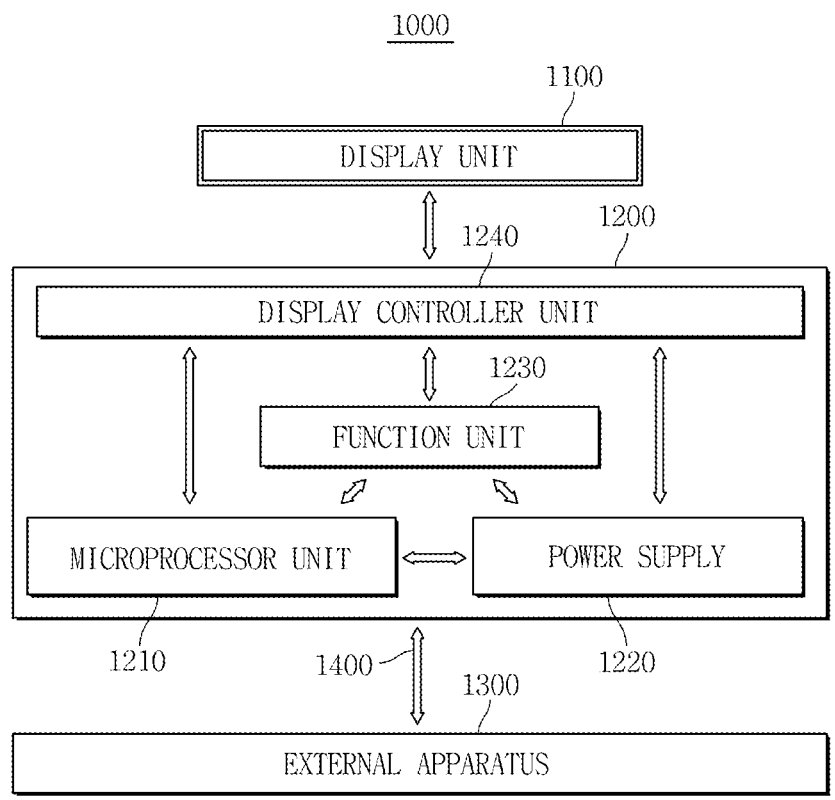
FIG. 34 illustrates a block diagram showing an electronic device including a semiconductor device according to exemplary embodiments.

FIG. 34 is a block diagram showing an electronic device including a semiconductor device according to exemplary embodiments.

Referring to FIG. 34, an electronic device 1000 may include a display unit 1100, a body 1200, and an external apparatus 1300. The body 1200 may be a system board or a mother board including a printed circuit board (PCB). The body 1200 may include a microprocessor unit 1210, a power unit 1220, a function unit 1230, and a display controller unit 1240. The microprocessor unit 1210, the power unit 1220, the function unit 1230, and the display controller unit 1240 may be mounted or equipped on the body 1200. The microprocessor unit 1210 may receive voltage from the power unit 1220 to control the function unit 1230 and the display controller unit 1240. The power unit 1220 may receive a constant voltage from an external power supply, etc., and divide the constant voltage level into various voltage levels. The power unit 1220 may provide voltages corresponding to the various voltage levels, to the micro processor unit 1210, the function unit 1230 and the display controller unit 1240, etc. The function unit 1230 may perform various functions of the electronic device 1000. For example, the function unit 1230 may include various elements capable of performing functions such as wireless communication such as an image output to the display unit 1100, and a voice output to a speaker by dialing or communication with the external unit 1300. When the electronic device 1000 includes a camera, the function unit 1230 can function as an image processor. The microprocessor unit 1210 and the function unit 1230 may include a semiconductor device according to exemplary embodiments, for processing various signals. Accordingly, reliability of the electronic device 1000 may be improved. The display unit 1100 may be disposed on one side surface of the body 1200. The display unit 1100 may be connected with the body 1200. The display unit 1100 may implement a processed image by the display controller unit 1240 of the body 1200. The electronic device 1000 may be connected with a memory card, etc. for capacity expansion. In this case, the function unit 1230 may include a memory card controller. The function unit 1230 may send a signal to the external unit 1300 and receive a signal from the external unit 1300 through a wire or wireless communication unit 1400. Also, the electronic device 1000 may include a universal serial bus (USB), etc. for function expansion. In this case, the function unit 1230 may function as an interface controller.

Figure 35:
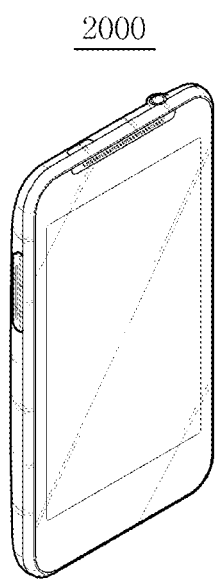
FIG. 35 illustrates a perspective view showing a mobile device including a semiconductor device according to exemplary embodiments.

FIG. 35 illustrates a perspective view showing a mobile device including a semiconductor device according to exemplary embodiments.

Referring to FIG. 35, a mobile device 2000 may be a mobile wireless phone. For example, the mobile device 2000 may be a tablet PC. The mobile device 2000 may include a semiconductor device according to exemplary embodiments. As such, reliability of the mobile device 2000 may be improved.

Figure 36:
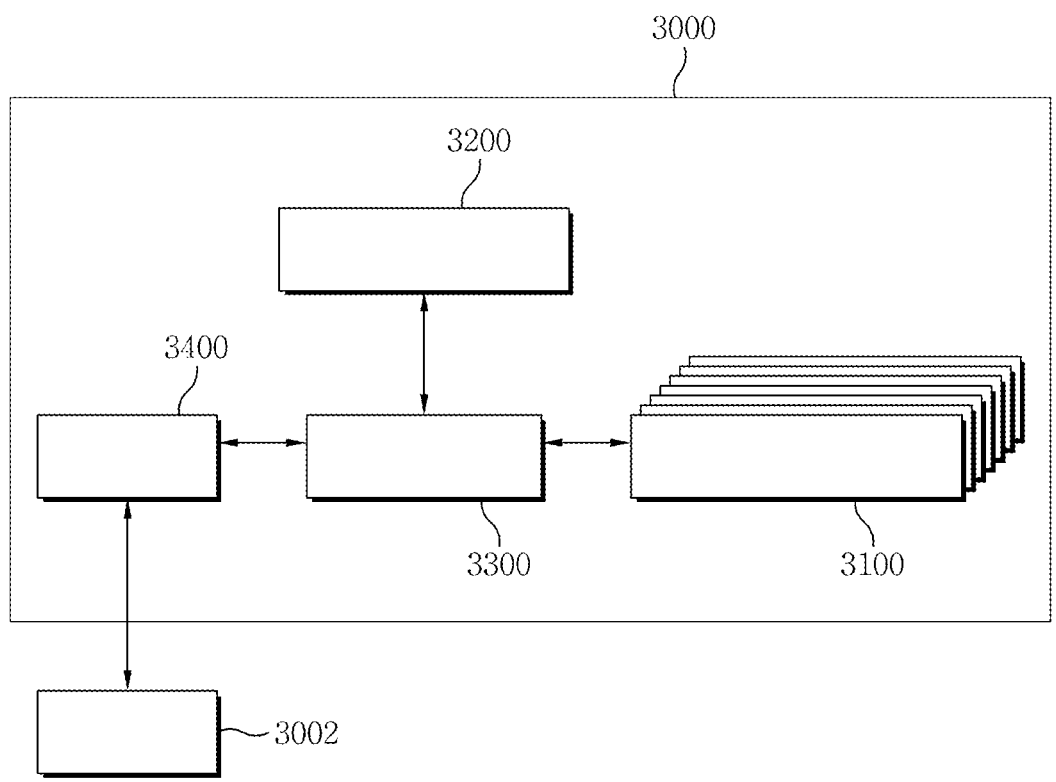
FIG. 36 illustrates a block diagram showing a data storing device including a semiconductor device according to exemplary embodiments.

FIG. 36 is a block diagram showing a data storing device including a semiconductor device according to exemplary embodiments.

Referring to FIG. 36, a data storing device 3000 may include a non-volatile memory 3100, a buffer memory 3200, a controller 3300, and an interface 3400. The non-volatile memory 3100 may include a semiconductor device according to exemplary embodiments. The data storing device 3000 may be a device storing data by using the semiconductor device. The data storing device 3000 may be a solid state disk (SSD). The SSD may be fast in speed, and also less in mechanical delay or failure, heating, noise as compared with a hard disk drive (HDD), and thereby formed small and light. The SSD may be used in a notebook PC, a desktop PC, an MP3 player, or a portable storage device. The controller 3300 may be formed adjacent to and electrically connected with the interface 3400. The controller 3300 may be a microprocessor including a memory controller and a buffer controller. The non-volatile memory 3100 may be formed adjacent to and electrically connected with the controller 3300. Data storage capacity of the data storing device 3000 may correspond to the non-volatile memory 3100. The buffer memory 3200 may be formed adjacent to and electrically connected with the controller 3300. The interface 3400 may be connected with a host 3002 and may serve as a transceiver of electric signals such as data. For example, the interface 3400 may be a device which uses a standard such as serial advanced technology attachment (SATA), integrated device electronics (IDE), small computer system interface (SCSI), and/or combination thereof. The non-volatile memory 3100 may be connected with the interface 3400 via the controller 3300. The non-volatile memory 3100 may serve as storage of data which is received through the interface 3400. Although a power source is not provided to the data storing device 3000, the data stored in the non-volatile memory 3100 is characterized by preservation. The buffer memory 3200 may include a volatile memory. The volatile memory may be a dynamic random access memory (DRAM) and/or a static random access memory (SRAM). The buffer memory 3200 may show a relatively fast operation speed as compared with the non-volatile memory 3100. Data processing speed of the interface 3400 may be relatively fast as compared with operation speed of the non-volatile memory 3100. Here, the buffer memory 3200 may serve as temporary storage of data. Data received through the interface 3400 may be temporarily stored in the buffer memory 3200 via the controller 3300, and then may be permanently stored in the non-volatile memory 3100 corresponding to data writing speed of the non-volatile memory 3100. Also, frequently used data of the stored data in the non-volatile memory 3100 may be previously read to temporarily store in the buffer memory 3200. That is, the buffer memory 3200 may increase an effective operation speed of the data storing device 3000 and reduce an error rate.

Figure 37:
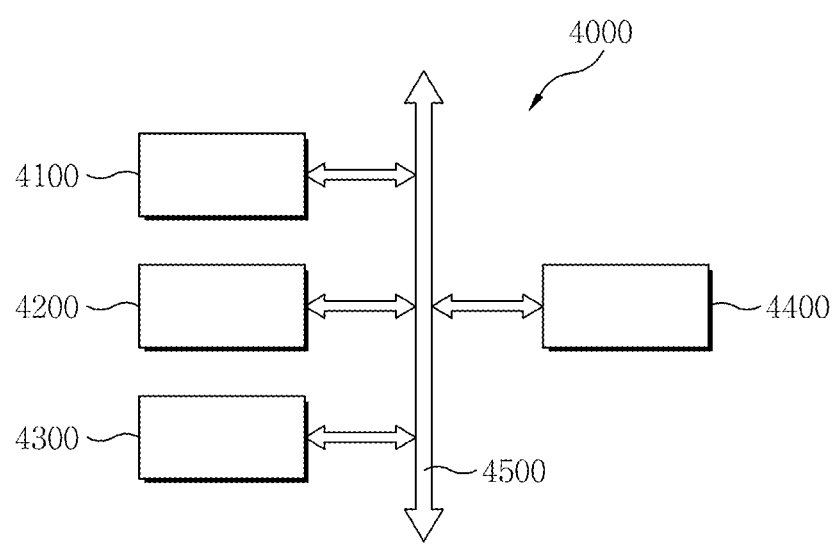
FIG. 37 illustrates a block diagram showing an electronic system including a semiconductor device according to exemplary embodiments.

FIG. 37 is a block diagram showing an electronic system including a semiconductor device according to exemplary embodiments.

Referring to FIG. 37, an electronic system 4000 may include an interface 4100, a memory 4200, an input/output device 4300, and a controller 4400. The interface 4100 may be electrically connected with the memory 4200, the input/output device 4300, and the controller 4400 through the bus 4500. The interface 4100 may exchange data with an external system. The memory 4200 may be a non-volatile memory device including a semiconductor device according to exemplary embodiments. The memory 4200 may store command performed by the controller 4400 and/or data. The controller 4400 may include a microprocessor, a digital processor, or a microcontroller. The electronic system 4000 may include a personal digital assistant (PDA), a portable computer, a web tablet, a wireless phone, a mobile phone, or a digital music player.

As described above, a semiconductor device and a method of fabricating the same according to exemplary embodiments may reduce a short channel effect between a source region and a drain region, and parasitic capacitance between gate structures, thereby being effective in improving reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including an active region and a field region, the field region including a trench and a field insulator filling the trench;
   first gate structures disposed on the active region;
   first air gaps disposed on the active region, and between the first gate structures;
   second gate structures disposed on the field insulator of the field region;
   second air gaps disposed on the field insulator of the field region, and between the second gate structures; and
   an interlayer insulating layer disposed on the first gate structures, the first air gaps, the second gate structures, and the second air gaps,
   wherein a lowermost level of the second air gaps is lower than a lowermost level of the first gate structures, and
   wherein an uppermost level of the field insulator is the same as a lowermost level of the second gate structures.

2. The semiconductor device as claimed in claim 1, wherein the second air gaps include an undercut formed under adjacent second gate structures, such that a maximum width of the second air gap between the adjacent second gate structures is greater than a distance between the adjacent second gate structures.

3. The semiconductor device as claimed in claim 1, wherein a lowermost level of the first air gaps is coplanar with the lowermost level of the first gate structures.

4. The semiconductor device as claimed in claim 1, wherein the lowermost level of the first gate structures is coplanar with an uppermost level of the active region.

5. The semiconductor device as claimed in claim 1, wherein:
   the field insulator includes recess regions disposed between the second gate structures, and
   the second air gaps extend into the inside of the recess regions.

6. The semiconductor device as claimed in claim 5, wherein:
   the active region includes impurity regions between the first gate structures, and
   a vertical depth of the impurity regions is smaller than a vertical distance between a lowermost level of the recess regions and the lowermost level of the second gate structures.

7. The semiconductor device as claimed in claim 1, wherein a plane including an uppermost level of the active region is between the uppermost level of the field insulator and the lowermost level of the recess of the field insulator.

8. The semiconductor device as claimed in claim 1, wherein a difference between a vertical height of the first gate structures and a vertical height of the first air gaps is smaller than a difference between a vertical height of the second gate structures and a vertical height of the second air gaps.

9. The semiconductor device as claimed in claim 8, wherein the vertical height of the first gate structures is greater than the vertical height of the second gate structures.

10. A semiconductor device, comprising:
    a substrate including an active region and a field region, the field region including a trench and a field insulator filling the trench;
    gate structures intersecting the active region and the field region;
    air gaps disposed between the gate structures, the air gaps intersecting the field insulator; and
    an interlayer insulating layer disposed on the gate structures and the air gaps,
    wherein a lowermost level of the air gaps is lower than a lowermost level of the gate structures, and
    wherein an uppermost level of the field insulator is higher than the lowermost level of the gate structures.

11. The semiconductor device as claimed in claim 10, wherein the lowermost level of the air gaps is located in the field region.

12. The semiconductor device as claimed in claim 11, wherein the lowermost level of the gate structures is located in the active region.

13. The semiconductor device as claimed in claim 10, wherein:
    the field insulator includes a recess disposed between adjacent gate structures, and
    a height difference between a lowermost level of the recess and the uppermost level of the field insulator is greater than a height difference between an uppermost level of the air gaps and a lowermost level of the interlayer insulating layer.

14. A semiconductor device comprising:
    a substrate including an active region and a field region, the field region including a trench and a field insulator filling the trench;
    first gate structures disposed on the active region;
    first air gaps disposed between the first gate structures;
    second gate structures disposed on the field insulator of the field region;
    second air gaps disposed between the second gate structures; and
    an interlayer insulating layer disposed on the first gate structures, the first air gaps, the second gate structures, and the second air gaps;
    wherein a level of an upper surface of the field insulator under the second air gaps is lower than a level of an upper surface of the field insulator under the second gate structures.

15. The semiconductor device as claimed in claim 14, further comprising impurity regions between the first gate structures, wherein:
    each first gate structure includes a tunnel insulating pattern directly on the substrate, the tunnel insulating pattern protruding horizontally with respect to side surfaces of the first gate structure, and
    the tunnel insulating pattern does not overlap the impurity regions between the adjacent first gate structures.

16. The semiconductor device as claimed in claim 14, wherein:
    a maximum width of the second air gap in a direction between adjacent second gate structures is greater than a distance between the adjacent second gate structures.

17. The semiconductor device as claimed in claim 16, wherein the distance between the adjacent first gate structures is same as the distance between the adjacent second gate structures.

18. The semiconductor device as claimed in claim 16, wherein the maximum width of the second air gap in a direction between adjacent second gate structures is greater than a maximum width of the first air gap in a direction between adjacent first gate structures.

* * * * *